(12) United States Patent
Yasunaga et al.

(10) Patent No.: US 9,581,860 B2
(45) Date of Patent: Feb. 28, 2017

(54) ILLUMINATION DEVICE WITH MULTIPLE PHOSPHOR LAYERS

(71) Applicant: Sharp Kabushiki Kaisha, Osaka (JP)

(72) Inventors: Hirotoshi Yasunaga, Osaka (JP); Ryuzo Yuki, Osaka (JP); Takeshi Ishida, Osaka (JP); Shinya Kadowaki, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/787,398

(22) PCT Filed: Apr. 30, 2014

(86) PCT No.: PCT/JP2014/061970
§ 371 (c)(1),
(2) Date: Oct. 27, 2015

(87) PCT Pub. No.: WO2014/178398
PCT Pub. Date: Nov. 6, 2014

(65) Prior Publication Data
US 2016/0077382 A1 Mar. 17, 2016

(30) Foreign Application Priority Data
Apr. 30, 2013 (JP) .................................. 2013-095355

(51) Int. Cl.
*F21V 9/14* (2006.01)
*G02F 1/1335* (2006.01)
(Continued)

(52) U.S. Cl.
CPC ....... *G02F 1/133617* (2013.01); *G02B 5/3016* (2013.01); *G02F 1/13362* (2013.01); *H05B 33/14* (2013.01); *H01L 33/501* (2013.01)

(58) Field of Classification Search
CPC ............ G02F 1/33617; G02F 1/133617; G02F 1/13362; H05B 33/14; H01L 33/501; G02B 5/3016
(Continued)

(56) References Cited

U.S. PATENT DOCUMENTS 8,049,951 B2 * 11/2011 Gruhlke ............... G02B 6/0076
359/290
2004/0135494 A1 7/2004 Miyatake

FOREIGN PATENT DOCUMENTS

JP 2001-318370 A 11/2001
JP 2004-205953 A 7/2004
(Continued)

*Primary Examiner* — Anh Mai
*Assistant Examiner* — Hana Featherly
(74) *Attorney, Agent, or Firm* — Chen Yoshimura LLP

(57) ABSTRACT

An illumination device includes a light source that emits primary light and a wavelength conversion element that converts at least a portion of the primary light from the light source. The wavelength conversion element includes a phosphor layer having phosphors that absorb at least a portion of the primary light from the light source to emit secondary light, which is polarized, and polymers having birefringence. The phosphors have an anisotropic structure and are aligned generally along a first direction, and the polymers have polymer molecules that are aligned generally along the first direction. An angle formed by a direction of a transition dipole moment of each of the phosphors to a delayed phase axis of each of the polymer molecules with respect to the secondary light emitted from the phosphors towards the polymer molecules is 0° to 45°.

16 Claims, 39 Drawing Sheets

(51) Int. Cl.
  *H05B 33/14* (2006.01)
  *G02B 5/30* (2006.01)
  *H01L 33/50* (2010.01)
(58) Field of Classification Search
  USPC .......................................................... 362/19
  See application file for complete search history.

(56) References Cited

FOREIGN PATENT DOCUMENTS

| JP | 2006-244779 A | 9/2006 |
| WO | 2013/042705 A1 | 3/2013 |
| WO | 2013/046130 A1 | 4/2013 |

\* cited by examiner

FIG. 63
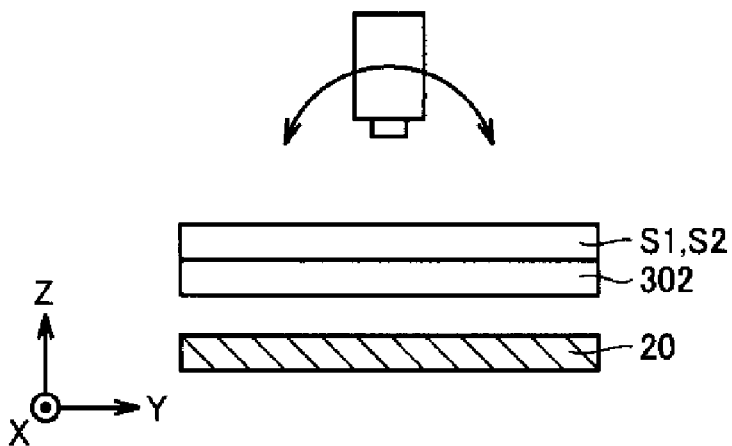
FIG. 64
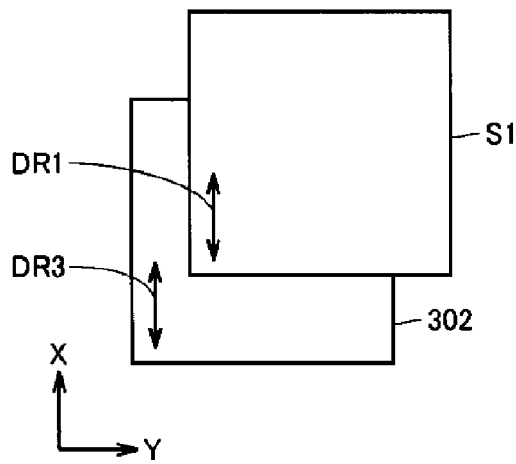
FIG. 65
| Sample S | Non-alignment State (S2) | Alignment State (S1) |
|---|---|---|
| Total Emitted Light Flux / Total Incident Light Flux | 0.098 | 0.142 |

| Sample S | Non-alignment State (S2) | | Alignment State (S1) | | |
|---|---|---|---|---|---|
| Incident Light Polarization State | Natural Light | Polarized Light | Natural Light | Parallel | Cross |
| Light Absorptivity (Blue Light) | .0860 | .0860 | 0.733 | 0.948 | 0.518 |

FIG. 73

| Sample S | Alignment State (S1) | |
|---|---|---|
| Emitted Light Polarization State | Parallel | Cross |
| Emission Intensity (@520 nm)(mW/sr/nm) | 0.00085 | 0.00015 |
| Parallel / Cross | 5.667 | |

ILLUMINATION DEVICE WITH MULTIPLE PHOSPHOR LAYERS

TECHNICAL FIELD

The present invention relates to a lighting device, and particularly relates to a lighting device that emits light secondary light obtained from the wavelength conversion of primary light.

BACKGROUND ART

Due to increasing interest in protecting the environment in recent years, there has been a transition from cold-cathode fluorescent tubes, incandescent lamps, and the like to light sources that consume less power in display devices having a planar display or the like, lighting fixtures such as ceiling lights, laser devices, and illumination devices included in various types of optical systems such as sensors. Light sources using semiconductors, such as LEDs (light emitting diodes), have been given particular attention as a light source for illumination devices, due to their small size and low power consumption.

In an illumination device using LEDs as a light source, it is necessary to convert the wavelengths of primary light emitted from the LEDs to obtain a desired color tone. This conversion is performed via a wavelength conversion element. A phosphor layer that has phosphors therein is mainly used as this wavelength conversion element.

Patent Document 1 (Japanese Patent Application Laid-Open Publication No. 2006-244779) discloses an illumination device using a wavelength conversion element. Furthermore, Patent Document 2 (Japanese Patent Application Laid-Open Publication No. 2001-318370) discloses a liquid crystal display device using a wavelength conversion element. Patent Document 3 (Japanese Patent Application Laid-Open Publication No. 2004-205953) discloses a wavelength conversion element itself.

The illumination device described in Patent Document 1 includes a light source unit having a plurality of light sources that emit primary light, and a wavelength conversion element that faces the plurality of light sources and that absorbs a portion of the primary light to emit secondary light of differing wavelengths. The wavelength conversion element includes a phosphor layer having phosphors therein and the phosphor layer is attached to the light source units such that at least a prescribed gap is maintained between the phosphor layer and the plurality of light source units.

In the liquid crystal display device described in Patent Document 2, the wavelength conversion element is formed on a primary surface of one of the pair of substrates sandwiching the liquid crystal layer. The wavelength conversion element includes a red phosphor layer, green phosphor layer, and blue phosphor layer. The respective phosphor layers have phosphors that are aligned with aligned liquid crystal polymers.

In this type of configuration, the liquid crystal polymers and phosphors included in the respective phosphors layers that constitute the wavelength conversion element are aligned, which allows for the degree of polarization of linearly polarized light emitted from the phosphors to be increased.

The wavelength conversion element described in Patent Document 3 includes a phosphor layer formed by dispersing birefringent anisotropic polymers and phosphors in a transmissive resin. The polymers have a different refractive index than the transmissive resin, which aligns the polymers in a prescribed direction in the phosphor layer.

In this type of configuration, aligning the birefringent anisotropic polymers in a prescribed direction in the phosphor layer causes the polymers to scatter secondary light emitted from the phosphors in order to efficiently extract linearly-polarized light having a prescribed plane of vibration.

RELATED ART DOCUMENTS

Patent Documents

Patent Document 1: Japanese Patent Application Laid-Open Publication No. 2006-244779
Patent Document 2: Japanese Patent Application Laid-Open Publication No. 2001-318370
Patent Document 3: Japanese Patent Application Laid-Open Publication No. 2004-205953

SUMMARY OF THE INVENTION

Problems to be Solved by the Invention

The light conversion rate of the phosphor layer for wavelength conversion elements having a phosphor layer is low, which increases light loss. Thus, there is demand to efficiently extract the secondary light emitted from the phosphors in illumination devices that use wavelength conversion elements.

The configuration described in Patent Document 1 can reduce uneven brightness and variations in luminance by maintaining at least a prescribed gap between the phosphor layer and the plurality of light sources, but does not give sufficient consideration to improving the extraction efficiency of the secondary light.

Meanwhile, the configurations described in Patent Documents 2 and 3 do not give sufficient consideration to the correlation between emission orientation of the phosphors and the alignment direction of the liquid crystal polymers, and there is a risk that the secondary light emitted from the phosphors cannot be adequately extracted depending on the alignment direction of the phosphors.

The present invention takes into consideration the aforementioned problems, and an object thereof is to provide an illumination device that can improve the extract efficiency of secondary light.

Means for Solving the Problems

An illumination device according to one aspect of the present invention is an illumination device for emitting light including secondary light obtained through wavelength conversion of primary light, including: a light source that emits primary light; and a wavelength conversion element that performs wavelength conversion on at least a portion of the primary light emitted from the light source, the wavelength conversion element including an incident surface where the primary light is incident, an emission surface that is opposite to the incident surface and that emits light including secondary light, and a phosphor layer including phosphors and polymers, the phosphors absorbing at least a portion of the primary light emitted from the light source to emit the secondary light, which is polarized, and the polymers having a birefringence, wherein the phosphors have an anisotropic structure and are aligned generally along a first direction, wherein the polymers have polymer molecules that are aligned generally along the first direction, and wherein an angle formed by a direction of a transition dipole moment of each of the phosphors to a delayed phase axis of each of the polymer molecules with respect to the secondary light emitted from the phosphors towards the polymer molecules is 0° to 45°.

In the illumination device according to the invention described above, it is preferable that an angle formed by the direction of the transition dipole moment of each of the phosphors to the emission surface be 0° to 38°.

In the illumination device according to the invention described above, it is preferable that the polymers be liquid crystal polymers.

In the illumination device according to the invention described above, it is preferable that, in the secondary light emitted from the phosphors, an intensity of a polarization component that oscillates in a direction parallel to the first direction be greater than an intensity of a polarization component that oscillates in a direction perpendicular to the first direction.

In the illumination device according to the invention described above, it is preferable that the phosphors be dichroic.

In the illumination device according to the invention described above, it is preferable that, with respect to the phosphors, an absorbency of a polarization component of primary light oscillating in a direction parallel to the first direction be higher than an absorbency of a polarization component of primary light oscillating in a direction perpendicular to the first direction.

In a first aspect of the illumination device according to the invention described above, it is preferable that the light source emit visible light.

In the first aspect, it is preferable that the phosphors be distributed in the phosphor layer at a concentration that allows primary light to pass through the phosphor layer.

In the first aspect, it is preferable that the phosphor layer include only a first phosphor layer having first phosphors.

In the first aspect, it is preferable that the light source emit blue primary light with the first wavelength being 390 nm to 510 nm, and it is preferable that the first phosphors be yellow phosphors that absorb a portion of primary light and emit yellow light.

In the first aspect, it is preferable that the phosphor layer be provided in a plurality so as to be arranged from the incident surface side to the emission surface side, and it is preferable that peak wavelengths of the phosphors included in the respective plurality of phosphor layers differ from one another. In such a case, it is preferable that the peak wavelengths of the phosphors become progressively lower from the incident surface side to the emission surface side.

In the first aspect, it is preferable that the phosphor layer be provided in a plurality in the same plane. In such a case, it is preferable that each one of these plurality of phosphor layers has a gap adjacent thereto, with the remaining plurality of phosphor layers filling in this gap. In such a case, it is preferable the peak wavelengths of the phosphors included in the respective plurality of phosphor layers differ from one another.

In the first aspect, it is preferable that the plurality of phosphor layers include a first phosphor layer that has first phosphors and a second phosphor layer that has second phosphors, and it is preferable that the light source emit blue primary light with the first wavelength being 390 nm to 510 nm. In such a case, it is preferable that the first phosphors be green phosphors that absorb a portion of primary light and emit green light, and it is preferable that the second phosphors be red phosphors that absorb a portion of primary light and emit red light.

In a second aspect of the illumination device according to the invention described above, it is preferable that the phosphors be distributed in the phosphor layer at a concentration that does not allow primary light to pass through the phosphor layer.

In the second aspect, it is preferable that the wavelength conversion element further include a wavelength-selective transmissive film that absorbs primary light having a first wavelength at the emission surface side and selectively transmits secondary light having a second wavelength.

In the second aspect, it is preferable that the phosphor layer be provided in a plurality so as to be arranged from the incident surface side to the emission surface side, and it is preferable that peak wavelengths of the phosphors included in the respective plurality of phosphor layers differ from one another. In such a case, it is preferable that the peak wavelengths of the phosphors become progressively lower from the incident surface side to the emission surface side.

In the second aspect, it is preferable that the phosphor layer be provided in a plurality in the same plane. In such a case, it is preferable that each one of these plurality of phosphor layers has a gap adjacent thereto, with the remaining plurality of phosphor layers filling in this gap. Furthermore, in such a case, it is preferable the peak wavelengths of the phosphors included in the respective plurality of phosphor layers differ from one another.

In the second aspect, it is preferable that the plurality of phosphor layers include a first phosphor layer that has first phosphors and a second phosphor layer that has second phosphors, and it is preferable that the light source emit blue primary light with the first wavelength being 390 nm to 510 nm. In such a case, it is preferable that the first phosphors be yellow phosphors that absorb a portion of primary light and emit yellow light, and it is preferable that the second phosphors be blue phosphors that absorb a portion of primary light and emit blue light.

In the second aspect, it is preferable that the plurality of phosphor layers include a first phosphor layer that has first phosphors, a second phosphor layer that has second phosphors, and a third phosphor layer that has third phosphors, and it is preferable that the light source emit blue primary light with the first wavelength being 390 nm to 510 nm. In such a case, it is preferable that the first phosphors be red phosphors that absorb a portion of primary light and emit red light; it is preferable that the second phosphors be green phosphors that absorb a portion of primary light and emit green light; and it is preferable that the third phosphors be blue phosphors that absorb a portion of primary light and emit blue light.

In a third aspect of the illumination device according to the invention described above, it is preferable that the light source emit ultraviolet light.

In the third aspect, it is preferable that the wavelength conversion element further include an ultraviolet light absorption member that absorbs ultraviolet light emitted from the light source at the emission surface side.

In the third aspect, it is preferable that the phosphor layer be provided in a plurality so as to be arranged from the incident surface side to the emission surface side, and it is preferable that peak wavelengths of the phosphors included in the respective plurality of phosphor layers differ from one another. It is preferable that the peak wavelengths of the phosphors become progressively lower from the incident surface side to the emission surface side.

In the third aspect, it is preferable that the phosphor layer be provided in a plurality in the same plane. In such a case, it is preferable that each one of these plurality of phosphor layers has a gap adjacent thereto, with the remaining plurality of phosphor layers filling in this gap. Furthermore, in such a case, it is preferable the peak wavelengths of the phosphors included in the respective plurality of phosphor layers differ from one another.

In the third aspect, it is preferable that the plurality of phosphor layers include a first phosphor layer that has first phosphors and a second phosphor layer that has second phosphors. In such a case, it is preferable that the first phosphors be yellow phosphors that absorb a portion of primary light and emit yellow light, and it is preferable that the second phosphors be blue phosphors that absorb a portion of primary light and emit blue light.

In the third aspect, it is preferable that the plurality of phosphor layers include a first phosphor layer that has first phosphors, a second phosphor layer that has second phosphors, and a third phosphor layer that has third phosphors. In such a case, it is preferable that the first phosphors be red phosphors that absorb a portion of primary light and emit red light; it is preferable that the second phosphors be green phosphors that absorb a portion of primary light and emit green light; and it is preferable that the third phosphors be blue phosphors that absorb a portion of primary light and emit blue light.

In the illumination device according to the invention described above, it is preferable that the plurality of phosphor layers include a first phosphor layer that has first phosphors and a second phosphor layer that has second phosphors. In such a case, it is preferable that an angle of a direction of a transition dipole moment of the first phosphors to a direction of a transition dipole moment of the second phosphors be 45° to 90°.

In the illumination device according to the invention described above, it is preferable that the phosphor layer include a plurality of phosphors having peak wavelengths that differ from one another.

In the illumination device according to the invention described above, it is preferable to further include a reflective sheet that reflects primary light emitted from the light source towards the wavelength conversion element.

In the illumination device according to the invention described above, it is preferable that the wavelength conversion element further include a wavelength-selective transmissive film that can reflect primary light from the light source at the emission surface side and transmit secondary light emitted from the phosphors.

In the illumination device according to the invention described above, it is preferable to further include an optical member that scatters primary light emitted from the light source and emits this light towards the wavelength conversion element.

In the illumination device according to the invention described above, it is preferable that the wavelength conversion element further include a transmissive substrate and an alignment film formed on a surface of the transmissive substrate, and it is preferable that at least a portion of the phosphor layer be disposed on the alignment film.

In the illumination device according to the invention described above, it is preferable that the phosphors included in the phosphor layer align along the first direction by one of a photoalignment method, rubbing method, and stretching method.

In the illumination device according to the invention described above, it is preferable that the wavelength conversion element be used as a light guide plate that scatters primary light emitted from a light source and extracts illumination light in a direction that differs from incident primary light.

In the illumination device according to the invention described above, it is preferable that the wavelength conversion element further include a transmissive substrate having formed thereon a color adjustment layer that performs color adjustment of primary light.

A liquid crystal display device according to the invention present invention includes the illumination device according to the invention described above, a liquid crystal panel arranged to face the illumination device, and a polarizing plate provided between the liquid crystal panel and the illumination device. A transmission axis of the polarizing plate is parallel to a direction of a transition dipole moment of the phosphors.

A wavelength conversion element according to one aspect of the present invention is a wavelength conversion element emitting for emitting light including secondary light obtained through wavelength conversion of primary light, including: an incident surface where primary light is incident, an emission surface that is opposite to the incident surface and that emits light including secondary light, and a phosphor layer including phosphors and polymers, the phosphors absorbing at least a portion of the primary light to emit the secondary light, which is polarized, and the polymers having a birefringence, wherein the phosphors have an anisotropic structure and are aligned generally along a first direction, wherein the polymers have polymer molecules that are aligned generally along the first direction, and wherein an angle formed by a direction of a transition dipole moment of each of the phosphors to a delayed phase axis of each of the polymer molecules with respect to the secondary light emitted from the phosphors towards the polymer molecules is 0° to 45°.

In the wavelength conversion element according to the invention described above, it is preferable that an angle formed by the direction of the transition dipole moment of each of the phosphors to the emission surface be 0° to 38°.

In the wavelength conversion element according to the invention described above, it is preferable that the polymers be liquid crystal polymers.

In the wavelength conversion element according to the invention described above, it is preferable that, in secondary light emitted from the phosphors, an intensity of a polarization component that oscillates in a direction parallel to the first direction be higher than an intensity of a polarization component that oscillates in a direction perpendicular to the first direction.

In the wavelength conversion element according the invention described above, it is preferable that the phosphors be dichroic.

In the wavelength conversion element according the invention described above, it is preferable that, with respect to the phosphors, absorbency of a polarization component of primary light oscillating in a direction parallel to the first direction be higher than absorbency of a polarization component of primary light oscillating in a direction perpendicular to the first direction.

In a first aspect of the wavelength conversion element according the invention described above, it is preferable that primary light be visible light.

In the first aspect, it is preferable that the phosphors be distributed in the phosphor layer at a concentration that allows primary light to pass through the phosphor layer.

In the first aspect, it is preferable that the phosphor layer include only a first phosphor layer that has first phosphors.

In the first aspect, it is preferable that, when a first wavelength of primary light is 390 nm to 510 nm, the first phosphors be yellow phosphors that absorb a portion of the primary light and emit yellow light.

In the first aspect, it is preferable that the phosphor layer be provided in a plurality so as to be arranged from the incident surface side to the emission surface side, and it is preferable that peak wavelengths of the phosphors included in the respective plurality of phosphor layers differ from one another. In such a case, it is preferable that the peak wavelengths of the phosphors become progressively lower from the incident surface side to the emission surface side.

In the first aspect, it is preferable that the phosphor layer be provided in a plurality in the same plane. In such a case, it is preferable that each one of these plurality of phosphor layers has a gap adjacent thereto, with the remaining plurality of phosphor layers filling in this gap. Furthermore, in such a case, it is preferable the peak wavelengths of the phosphors included in the respective plurality of phosphor layers differ from one another.

In the first aspect, it is preferable that, if a first wavelength of primary light is 390 nm to 510 nm, the plurality of phosphor layers include a first phosphor layer that has first phosphors and a second phosphor layer that has second phosphors. In such a case, it is preferable that the first phosphors be green phosphors that absorb a portion of primary light and emit green light, and it is preferable that the second phosphors be red phosphors that absorb a portion of primary light and emit red light.

In a second aspect of the wavelength conversion element according to the invention described above, it is preferable that the phosphors be distributed in the phosphor layer at a concentration that does not allow primary light to pass through the phosphor layer.

The second aspect further includes a wavelength-selective transmissive film that absorbs primary light having a first wavelength at the emission surface side and selectively transmits secondary light having a second wavelength.

In the second aspect, it is preferable that the phosphor layer be provided in a plurality so as to be arranged from the incident surface side to the emission surface side, and it is preferable that peak wavelengths of the phosphors included in the respective plurality of phosphor layers differ from one another. In such a case, it is preferable that the peak wavelengths of the phosphors become progressively lower from the incident surface side to the emission surface side.

In the second aspect, it is preferable that the phosphor layer be provided in a plurality in the same plane. In such a case, it is preferable that each one of these plurality of phosphor layers has a gap adjacent thereto, with the remaining plurality of phosphor layers filling in this gap. Furthermore, in such a case, it is preferable the peak wavelengths of the phosphors included in the respective plurality of phosphor layers differ from one another.

In the second aspect, it is preferable that, if a first wavelength of primary light is 390 nm to 510 nm, the plurality of phosphor layers include a first phosphor layer that has first phosphors and a second phosphor layer that has second phosphors. In such a case, it is preferable that the first phosphors be yellow phosphors that absorb a portion of primary light and emit yellow light, and it is preferable that the second phosphors be blue phosphors that absorb a portion of primary light and emit blue light.

In the second aspect, it is preferable that, if a first wavelength of primary light is 390 nm to 510 nm, the plurality of phosphor layers include a first phosphor layer that has first phosphors, a second phosphor layer that has second phosphors, and a third phosphor layer that has third phosphors. In such a case, it is preferable that the first phosphors be red phosphors that absorb a portion of primary light and emit red light; it is preferable that the second phosphors be green phosphors that absorb a portion of primary light and emit green light; and it is preferable that the third phosphors be blue phosphors that absorb a portion of primary light and emit blue light.

In a third aspect of the wavelength conversion element according to the invention described above, it is preferable that primary light be ultraviolet light.

It is preferable that the third aspect further include an ultraviolet light absorption member that absorbs ultraviolet light emitted from the light source at the emission surface side.

In the third aspect, it is preferable that the phosphor layer be provided in a plurality so as to be arranged from the incident surface side to the emission surface side, and it is preferable that peak wavelengths of the phosphors included in the respective plurality of phosphor layers differ from one another. In such a case, it is preferable that the peak wavelengths of the phosphors become progressively lower from the incident surface side to the emission surface side.

In the third aspect, it is preferable that the phosphor layer be provided in a plurality in the same plane. In such a case, it is preferable that each one of these plurality of phosphor layers has a gap adjacent thereto, with the remaining plurality of phosphor layers filling in this gap. Furthermore, in such a case, it is preferable the peak wavelengths of the phosphors included in the respective plurality of phosphor layers differ from one another.

In the third aspect, it is preferable that the plurality of phosphor layers include a first phosphor layer that has first phosphors and a second phosphor layer that has second phosphors. In such a case, it is preferable that the first phosphors be yellow phosphors that absorb a portion of primary light and emit yellow light, and it is preferable that the second phosphors be blue phosphors that absorb a portion of primary light and emit blue light.

In the third aspect, it is preferable that the plurality of phosphor layers include a first phosphor layer that has first phosphors, a second phosphor layer that has second phosphors, and a third phosphor layer that has third phosphors. In such a case, it is preferable that the first phosphors be red phosphors that absorb a portion of primary light and emit red light; it is preferable that the second phosphors be green phosphors that absorb a portion of primary light and emit green light; and it is preferable that the third phosphors be blue phosphors that absorb a portion of primary light and emit blue light.

In the wavelength conversion element according to the invention described above, it is preferable that the plurality of phosphor layers include a first phosphor layer that has first phosphors and a second phosphor layer that has second phosphors. In such a case, it is preferable that an angle of a direction of a transition dipole moment of the first phosphors to a direction of a transition dipole moment of the second phosphors be 45° to 90°.

In the wavelength conversion element according to the invention described above, it is preferable that the phosphor layer include a plurality of phosphors having peak wavelengths that differ from one another.

It is preferable that the wavelength conversion element according to the invention described above further include a reflective sheet that reflects primary light towards the incident surface.

It is preferable that the wavelength conversion element according to the invention described above further include a dielectric film that can reflect primary light from a light source at the emission surface side and transmit secondary light emitted from the phosphors.

It is preferable that wavelength conversion element according to the invention described above further include an optical member that scatters primary light and emits the light towards the incident surface.

It is preferable that wavelength conversion element based on the invention described above further include an alignment film formed on a surface of the transmissive substrate, and it is preferable that at least a portion of the phosphor layer be formed on the alignment film.

In the wavelength conversion element according to the invention described above, it is preferable that the phosphors included in the phosphor layer align along the first direction by one of a photoalignment method, rubbing method, and stretching method.

It is preferable that the wavelength conversion element according to the invention described above be used as a light guide plate that scatters primary light and extracts illumination light in a direction that differs from incident primary light.

It is preferable that wavelength conversion element according to the invention described above further include a transmissive substrate having formed thereon a color adjustment layer that performs color adjustment of primary light.

The present invention makes it possible to provide an illumination device that can improve the extraction efficiency of secondary light.

BRIEF DESCRIPTION OF THE DRAWINGS

FIG. 63 is a view of the total flux of the secondary light emitted from the phosphors being measured.

FIG. 64 is a view of the relationship between the alignment direction when the total flux of the secondary light is being measured and the transmission axes of the polarizing plates.

FIG. 65 is a table showing the relationship between light flux of incident light from the light sources and light flux of secondary light emitted from the phosphors.

FIG. 73 is a view of the measurement results for emission intensity.

DETAILED DESCRIPTION OF EMBODIMENTS

Figure 1:
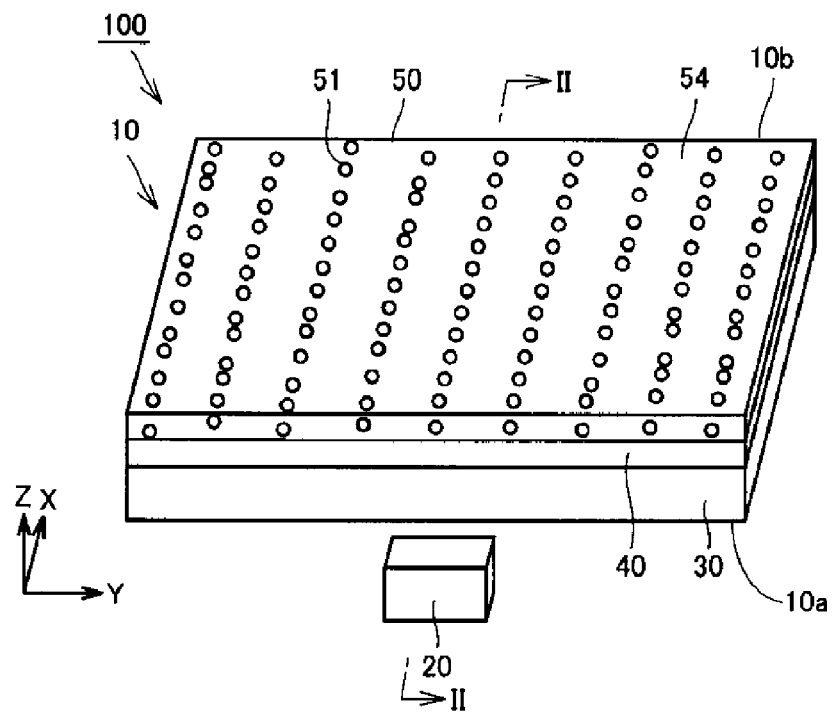
FIG. 1 is a schematic view of an illumination device of the present invention.

Below, embodiments and modification examples of the present invention will be explained in detail with reference to the drawings. It should be noted that, in the embodiments and modification examples described below, components that are the same or common throughout are given the same reference characters, and repeat explanations thereof will be omitted.

Furthermore, in the embodiments and modification examples below, unless otherwise noted, it is possible to combine the characteristic features of the embodiments and respective modification examples without departing from the spirit of the present invention.

Embodiment

Figure 2:
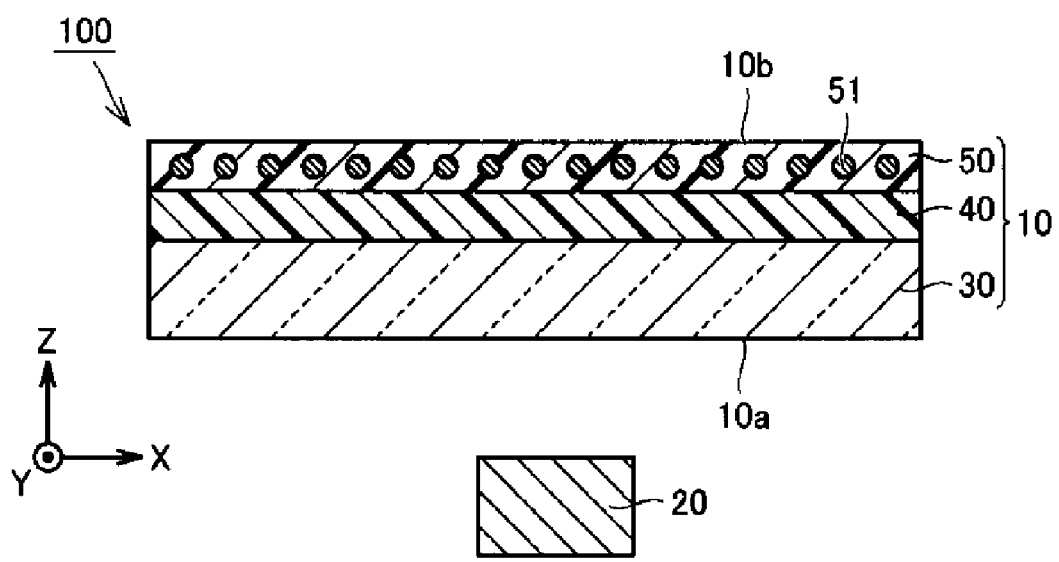
FIG. 2 is a schematic cross-sectional view along the line II-II of the illumination device in FIG. 1.

FIG. 1 is a schematic view of an illumination device according to an embodiment of the present invention. FIG. 2 is a schematic cross-sectional view along the line II-II of the illumination device in FIG. 1. An illumination device 100 of the present embodiment will be described with reference to FIG. 1 and FIG. 2.

As shown in FIG. 1 and FIG. 2, the illumination device 100 of the present embodiment includes a light source 20 that emits primary light and a wavelength conversion element 10. The wavelength conversion element 10 includes a first transmissive substrate 30 arranged to face the light source 20, a first alignment film 40 formed on the first primary surface of the first transmissive substrate 30, and a first phosphor layer 50 formed on the first alignment film 40. The wavelength conversion element 10 also includes an incident surface 10*a* where primary light emitted from the light source 20 enters and an emission surface 10*b* where illumination light that includes secondary light (described later) is emitted. The incident surface 10a is opposite to the emission surface 10b.

The first phosphor layer 50 includes first phosphors 51 that absorb parts of the primary light emitted from the light source 20 and emit secondary light with differing wavelengths, and birefringent anisotropic polymers 54. The first phosphors 51 are uniaxially aligned in the first phosphor layer 50 by the first alignment film 40 along the direction (X-axis direction in the drawing) parallel to the first primary surface. In other words, the first phosphors 51 have anisotropic structures that are aligned along a first direction.

The light source 20 can be a configuration that emits blue light in an emission direction (Z-axis direction in the drawing) that is perpendicular to the first primary surface. The wavelength range of the blue light is 390 nm to 510 nm. The peak wavelength at which the emission intensity for blue light is greatest is approximately 450 nm. Specifically, the light source 20 can be a GaN light-emitting diode, ZnO light-emitting diode, a diamond light-emitting diode, or the like that have a peak wavelength at 450 nm and emit blue light, for example.

It should be noted that an example in which the light source 20 is a light-emitting diode is described, but the present invention is not limited to this, and the light source can be a discharge tube, laser light source, inorganic EL, organic EL, or the like as appropriate.

The first transmissive substrate 30 can be a glass substrate made of silica glass or the like, or a transmissive member such as a transparent film or transparent resin, for example. The first alignment film 40 can be a resin film made of polyvinyl alcohol, polyimide, or the like, for example.

The first phosphor layer 50 can be formed by adding the first phosphors to the birefringent anisotropic polymers 54, and the birefringent anisotropic polymers 54 can be liquid crystal polymers such as reactive mesogen, for example. The reactive mesogen can be UCL-017 manufactured by DIC Corporation, RMM 34C manufactured by Merck & Co., Inc., or the like, for example.

Reactive mesogen is a compound constituted by at least two aromatic (or the like) rod- or platelet-shaped mesogen groups and at least one polymerizable functional group. It is preferable that the reactive mesogen be rod-shaped, in order to align dichroic phosphors.

The first phosphors 51 can be dichroic phosphors. In addition, it is preferable that the first phosphors 51 can absorb primary light from the light source and that the wavelength of the emitted secondary light have a longer wavelength than the primary light, such as yellow phosphors that absorb blue light and emit yellow light as secondary light, for example. The wavelength range of the yellow light emitted by the yellow phosphors is 570 nm to 590 nm. The peak wavelength at which the emission intensity for yellow light is greatest is 580 nm. Specifically, the first phosphors 51 can be yellow phosphors such as BasicYellowHG, Eosine, Rhodamine6G, or the like. It should be noted that the first phosphors 51 are not limited to these organic phosphors and may be inorganic phosphors, nano-crystal members, or quantum dots.

In this example, the primary light of the light source 20 that is not absorbed by the first phosphors 51 passes through the wavelength conversion element 10; thus, adjusting the concentration (absorbency) of the first phosphors 51 makes it possible to obtain illumination light of a desired color. For example, if the first phosphors 51 are distributed inside the first phosphor layer at a concentration that allows primary light from the light source 20 to pass through the phosphor layer 50, the result can be a color that is a combination of the color of the light from the light source 20 and the color of the light emitted from the first phosphors 51. On the other hand, if the first phosphors 51 are distributed inside the first phosphor layer at a concentration that does not allow primary light from the light source 20 to pass through the phosphor layer 50, the result can only be the color of the light emitted from the first phosphors 51. It is possible to adjust suitably the concentration of the first phosphors 51 in the birefringent anisotropic polymers 54 in accordance with the desired color of illumination light to be emitted from the illumination device as described above.

Next, the specific method of forming the first alignment film 40 and the first phosphor layer 50 on the first transmissive substrate 30 will be explained.

First, the first transmissive substrate 30 is prepared. Next, coating or printing is used to coat a polyimide film on the first primary surface of the first transmissive substrate 30 and a heat treatment is applied, after which a rubbing treatment is performed in a direction parallel to the first primary surface to form the first alignment film 40. The rubbing treatment forms microgrooves in the first alignment film 40 surface in a direction parallel to the first primary surface (the X-axis direction in the drawing).

Then, coating or printing is used to coat, as the first phosphors 51, liquid crystal polymers that are yellow phosphors mixed with liquid crystal material (reactive mesogen) at a prescribed wt. ratio on the first alignment film 40. Thereafter, the liquid crystal polymers are treated with heat, ultraviolet radiation, or the like to align the liquid crystal polymers and form the first phosphor layer 50. At such time, the alignment regulating force of the first alignment film 40 causes the liquid crystal polymers to align along the extension direction of the microgrooves (the X-axis direction in the drawing). This also causes the first phosphors 51 in the liquid crystal polymers to align along the extension direction of the microgrooves (the X-axis direction in the drawing).

The parameters for the rubbing treatment can be a 0.5 mm compression amount of the rubbing cloth on the first transmissive substrate, a 100 mm/s moving speed of the stage on which the first transmissive substrate is mounted, a 300 rpm rotational speed of the roller on which the rubbing cloth is attached, and a rubbing frequency of 3 times, for example.

Figure 3:
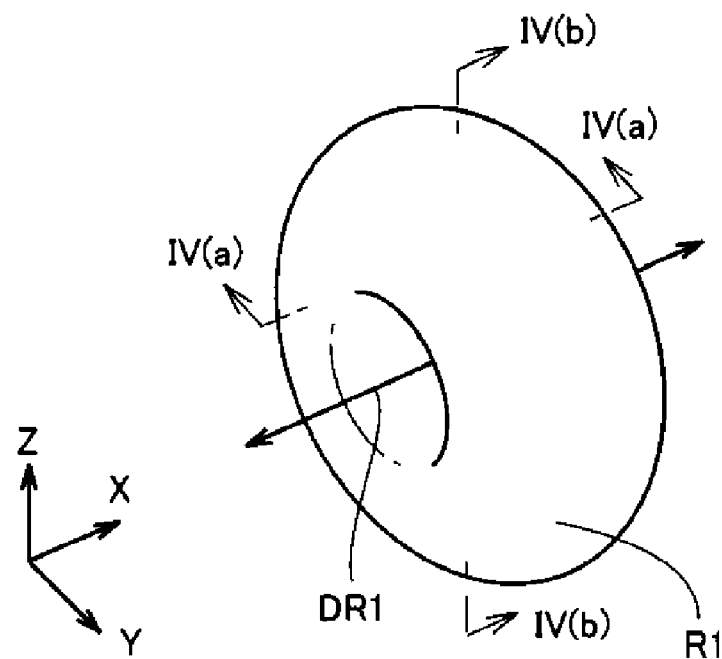
FIG. 3 is a view of the relationship between the emission direction of secondary light emitted from the aligned phosphors included in the wavelength conversion element shown in FIG. 1 and the dipole moment direction.
Figure 4:
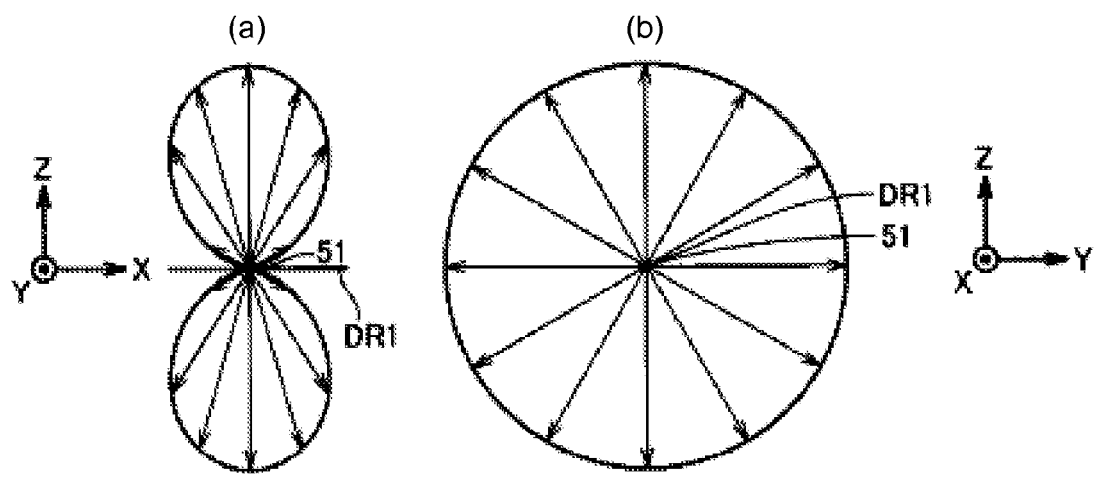
FIG. 4 is a schematic cross-sectional view along the line IV(a)-IV(a) and a cross-sectional view along the line IV(b)-IV(b) in FIG. 3.

FIG. 3 is a view of the relationship between the emission direction of secondary light emitted from the aligned phosphors included in the wavelength conversion element shown in FIG. 1 and the dipole moment direction. FIG. 4 is a schematic cross-sectional view along the line IV(a)-IV(a) and a schematic cross-sectional view along the line IV(b)-IV(b) in FIG. 3. The secondary light emitted from the aligned first phosphors 51 (i.e., first phosphors in the alignment state) will be explained with reference to FIG. 3 and FIG. 4.

As shown in FIG. 3, the aligned first phosphors 51, which are aligned in the DR1 direction, emit light in a dipole pattern as shown by region R1. In the present embodiment, the direction of the transition dipole moment (DR1 direction) matches the X-axis direction, which is parallel to the alignment direction of the first phosphors 51.

FIG. 4(a) is a schematic view of, among the secondary light emitted from the aligned first phosphors 51, the progression direction and intensity of the secondary light in the plane parallel to the Z-axis direction and X-axis direction. FIG. 4(b) is a schematic view of, among the secondary light emitted from the aligned first phosphors 51, the progression direction and intensity of the secondary light in the plane parallel to the Z-axis direction and Y-axis direction. In this example, the direction of the arrows pointing to the various directions shown in FIGS. 4(a) and 4(b) represents the progression direction of light, and the length of the arrows pointing to the various directions represents the intensity of the light.

As shown in FIG. 4(a), the aligned first phosphors 51 emit light in a dipole pattern in the emission direction (Z-axis direction in the drawing) in a plane that is parallel to the Z-axis direction and the X-axis direction. At such time, the secondary light emitted in the dipole pattern has an intensity distribution of $\sin^2\theta$ if the angle of the plane on which the first alignment film 40 is formed to the emission direction is $\theta$. Furthermore, as shown in FIG. 4(b), the aligned first phosphors 51 emit light isotropically around the alignment direction (DR1 direction) in the plane parallel to the Z-axis direction and Y-axis direction.

In this manner, the amount of secondary light emitted from the first phosphors 51 is low in the direction (DR1 direction) along the alignment direction and high in the emission direction (Z-axis direction in the drawing), which is perpendicular to the alignment direction. In other words, the secondary light emitted from the first phosphors 51 in the alignment state has directionality in which emission intensity is high along the emission direction (Z-axis direction in the drawing).

Figure 5:
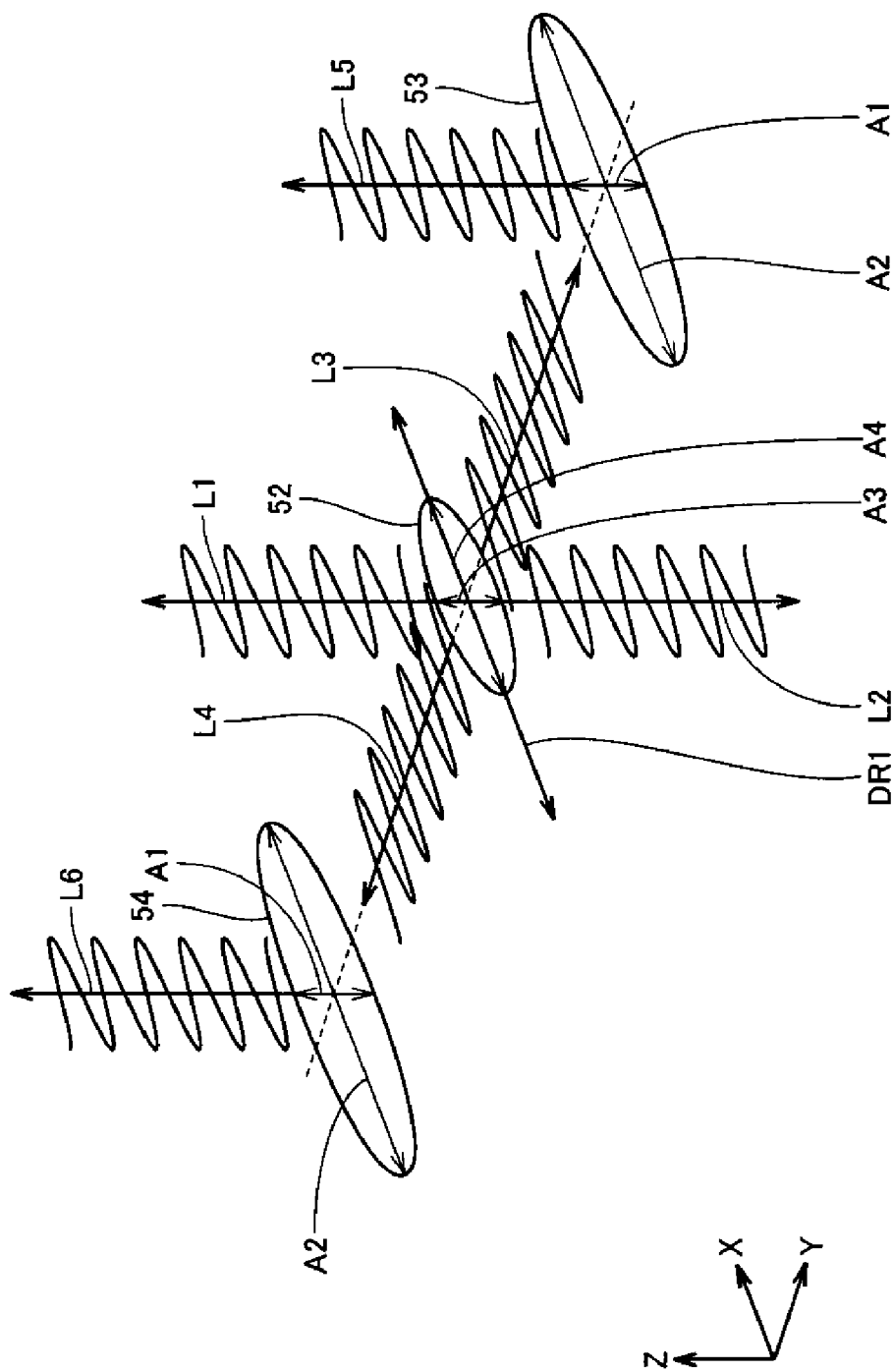
FIG. 5 is a view of the state of the phosphors and polymer molecules in the phosphor layer included in the wavelength conversion element shown in FIG. 1.
Figure 6:
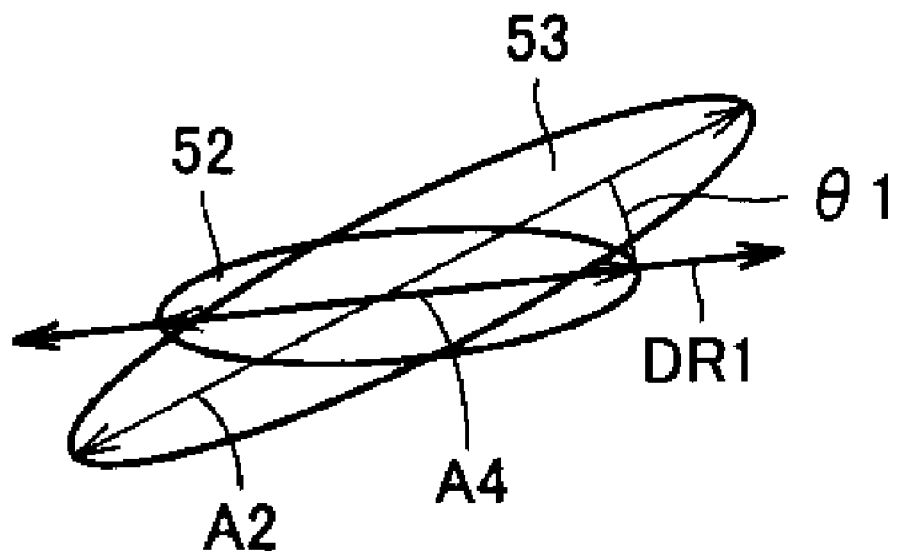
FIG. 6 is a view of the angle of the transition dipole moment direction of the phosphors shown in FIG. 5 and the direction of the delayed phase axis of the polymer molecules.
Figure 7:
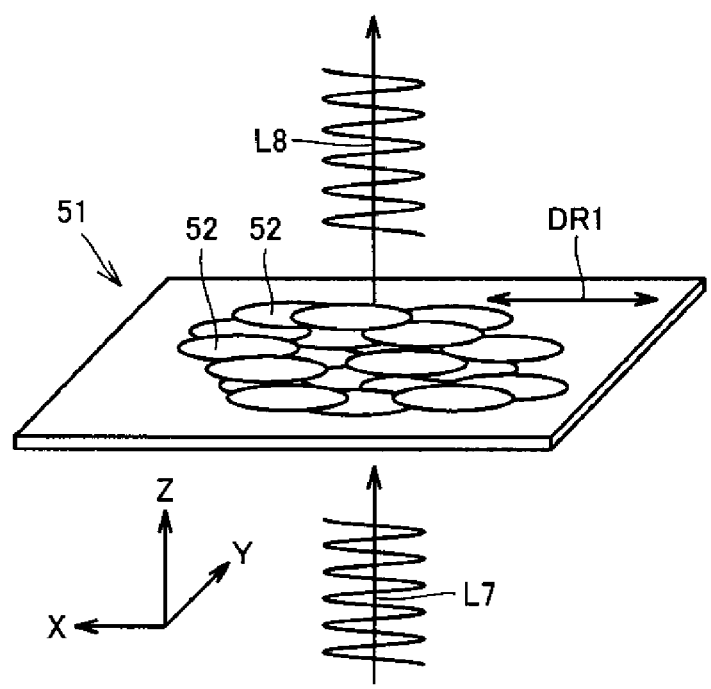
FIG. 7 is a view of a state in which the phosphors are aligned.
Figure 8:
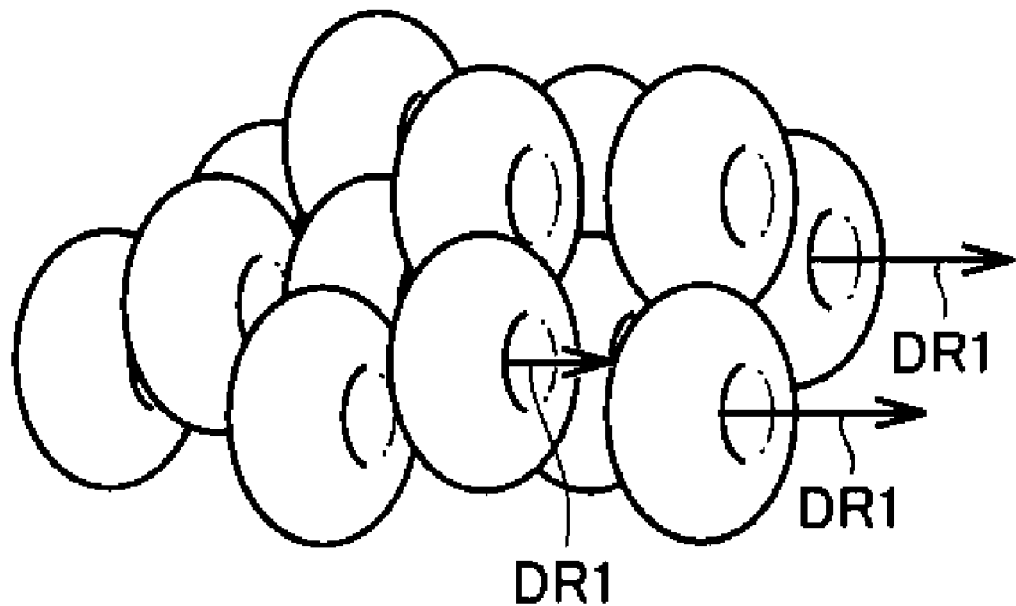
FIG. 8 is a view of the transition dipole moment direction of the respective phosphors in an aligned state.

FIG. 5 is a view of the state of the phosphors and polymer molecules in the phosphor layer included in the wavelength conversion element shown in FIG. 1. FIG. 6 is a view of the angle of the transition dipole moment direction of the phosphors shown in FIG. 5 and the direction of the delayed phase axis of the polymer molecules. FIG. 7 is a view of a state in which the phosphors are aligned. FIG. 8 is a view of the transition dipole moment direction of the respective phosphors in the aligned state. The light emitted from the phosphors in the alignment state will be explained with reference to FIGS. 5 to 8.

As shown in FIG. 5, the first phosphors 51 are formed by phosphors 52, and the birefringent anisotropic polymers 54 are formed by polymer molecules 53. The phosphors 52 are dichroic. The phosphors 52 and polymer molecules 53 inside the phosphor layer 50 have rod-like shapes including long axes A4, A2 and short axes A3, A1. In the aligned state, the long axis A4 of the phosphor 52 and the long axis A2 of the birefringent anisotropic polymer molecule 53 extend along the X-axis direction, and the phosphors 52 and polymer molecules 53 are arrayed next to one another in the Y-axis direction in a state in which the short axis A3 of the phosphor 52 and the short axis A1 of the birefringent anisotropic polymer molecule 53 extend along the Z-axis direction. This causes the direction of the transition dipole moment (DR1 direction) to become parallel to the long axis A2 of the polymer molecules 53.

In this example, the dipole moment is not likely to emit light in the direction of vibration; thus, the phosphors 52 emit secondary light in a direction that is perpendicular to the direction of the dipole moment (DR1 direction), such as L1, L2, L3, and L4. This type of secondary light is propagated inside the phosphors 51 while gradually being scattered to the plurality of polymers 53 and exiting to outside from the emission surface, as shown by scattering light L5 and L6.

Secondary light such as L3 and L4 has a polarization that is parallel to the X-Y plane direction, and the direction of the transition dipole moment (DR1 direction) becoming parallel to the direction of the long axes A2 of the polymer molecules 53 causes this secondary light to have a polarization that is parallel to the long axis direction of the aligned polymer molecules 53. In other words, the polarizing axis of the propagated light inside the phosphors 51 becomes parallel to the delayed phase axis (long axis A2) of the polymer molecules 53. This results in the secondary light emitted from the phosphors 52 being strongly scattered by the polymer molecules 53.

In the aligned first phosphors 51, the phosphors 52 and the polymer molecules 53 are aligned such that the direction of almost all transition dipole moments (DR1 direction) become parallel to the delayed phase axis (long axis A2) of the polymer molecules 53; thus, the propagated light is efficiently scattered in all locations within the phosphors 51, as described above. This improves extraction efficiency of the secondary light.

It should be noted that, in the above descriptions, an example was described in which the direction of the transition dipole moment becomes parallel to the delayed phase axis of the polymer molecules 53, but the present invention is not limited to this. As shown in FIG. 6, when viewed along the Y-axis direction in FIG. 5, if the smaller angle among the angles of the transition dipole moment direction (DR1 direction) to the delayed phase axis (long axis A2) of the polymer molecules is 01, then it is enough for $0° \le \theta1 \le 45°$ to be satisfied. This increases the scattering intensity of the polymer molecules 53 with respect to the polarized light emitted from the phosphors 52, and thus it is possible to extract, to the emission surface side, the propagated light that has been reflected within the first phosphor layer 50 and propagated to the end faces. This improves extraction efficiency of the secondary light.

When the plurality of phosphors 52 are aligned along the X-axis direction as shown in FIG. 7, the direction of the respective transition dipole moments (DR1 direction) also becomes parallel to the X-axis direction, as shown in FIG. 8. Due to this, the first phosphors 51, which are aggregates of the aligned phosphors 52, emit light in a dipole pattern overall as described above.

As a result, as shown in FIG. 7, the secondary light L8 emitted from the first phosphor 51 that has been excited by the primary light L7 emitted from the light source to the first phosphor layer 50 exits from the emission surface side of the wavelength conversion element 10 as light having a polarization component that is parallel to the alignment direction of the phosphor 51.

Figure 9:
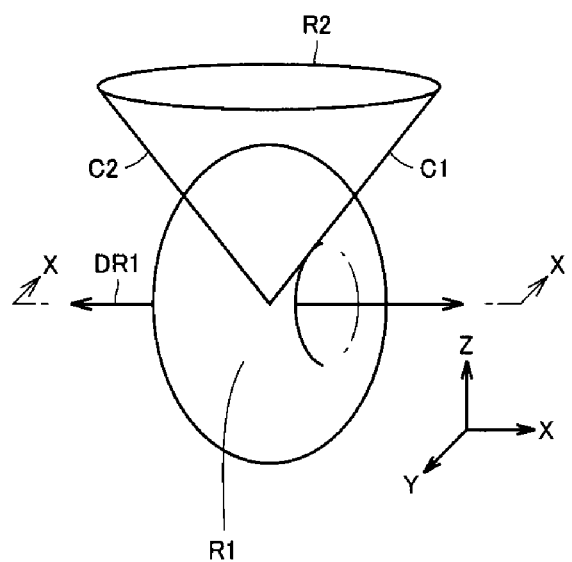
FIG. 9 is a view of the emission direction of secondary light emitted from the phosphors in the aligned state and the areas that are extractable as illumination light.
Figure 10:
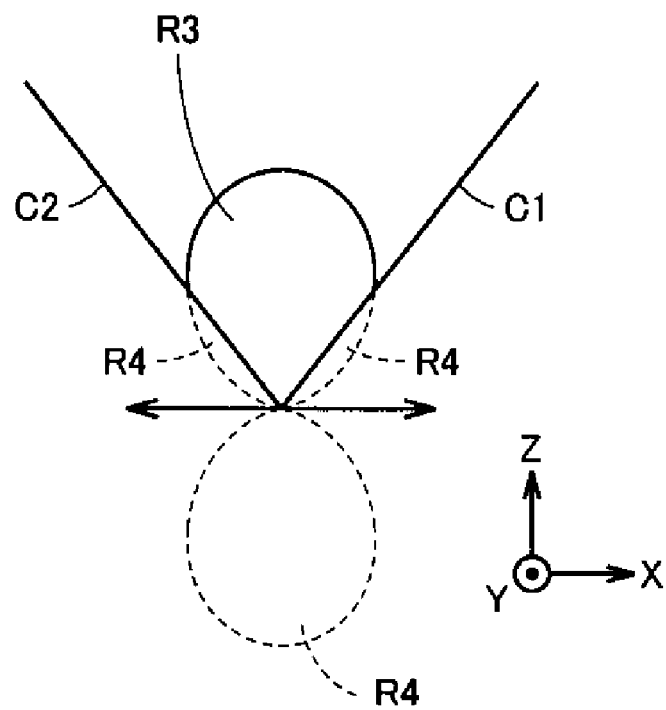
FIG. 10 is a schematic cross-sectional view of FIG. 9 along the line X-X.

FIG. 9 is a view of the emission direction of secondary light emitted from the phosphors in the aligned state and the areas that are extractable as illumination light. FIG. 10 is a schematic cross-sectional view along the line X-X shown in FIG. 9. The secondary light that is extractable from the aligned phosphors 51 will be described with reference to FIG. 9 and FIG. 10.

As shown in FIG. 9, in a conical region R2 including generatrices C1 and C2 and a bottom surface on top of the Z-axis, secondary light emitted from the aligned first phosphor 51 can be extracted as illumination light. As shown in FIG. 10, when seen from a cross section along the Z-axis direction, the secondary light emitted in a region R3 located inside the generatrices C1 and C2 can be extracted as illumination light. On the other hand, the secondary light emitted in the regions R4 located outside the generatrices C1 and C2 cannot be extracted as illumination light.

Thus, the dipole-shaped secondary light emitted from the aligned first phosphors 51 has a low proportion of light emitted along the X-axis direction, and the proportion occupied by the region R3 is high compared to the light-emitting region R1 (see FIG. 9); this concentrates the secondary light in the emission direction (Z-axis direction). This improves extraction efficiency of the secondary light.

It should be noted that, in the above descriptions, an example was described in which the direction of the transition dipole moment (DR1 direction) becomes parallel to the X-axis direction, but the present invention is not limited to this.

Figure 11:
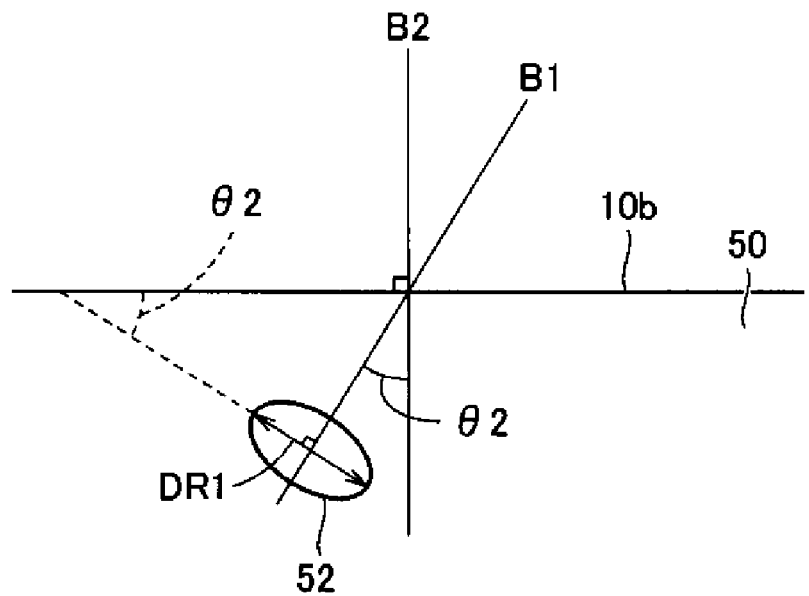
FIG. 11 is a view of the angles between a direction perpendicular to the transition dipole moment direction of the phosphors and a direction perpendicular to the emission surface.

FIG. 11 is a view of the angles between a direction perpendicular to the transition dipole moment direction of the phosphors and a direction perpendicular to the emission surface. The smaller angle among the angles of the direction B1 perpendicular to the transition dipole moment direction of the phosphors (DR1 direction) to the direction B2 perpendicular to the emission surface will be described with reference to FIG. 11.

As shown in FIG. 11, when θ2 is the smaller angle among the angles of the direction B1 perpendicular to the transition dipole moment direction to the direction B2 perpendicular to the emission surface 10b of the wavelength conversion element 10, or namely, the smaller angle among the angles of the transition dipole moment direction to the emission surface 10b, then $0° \leq \theta2 \leq 38°$ should be satisfied.

By so doing, the secondary light emitted from the phosphor 51 becomes a direction mainly perpendicular to the transition dipole moment, and the proportion of secondary light incident on the emission surface at below the critical angle (described later) is increased, which makes it possible to reduce the secondary light that exits from the end faces while being reflected inside the phosphor layer 50 and the first transmissive substrate 30. As a result, this improves extraction efficiency of the secondary light. The simulation results from the relevant tests will be described later.

Figure 12:
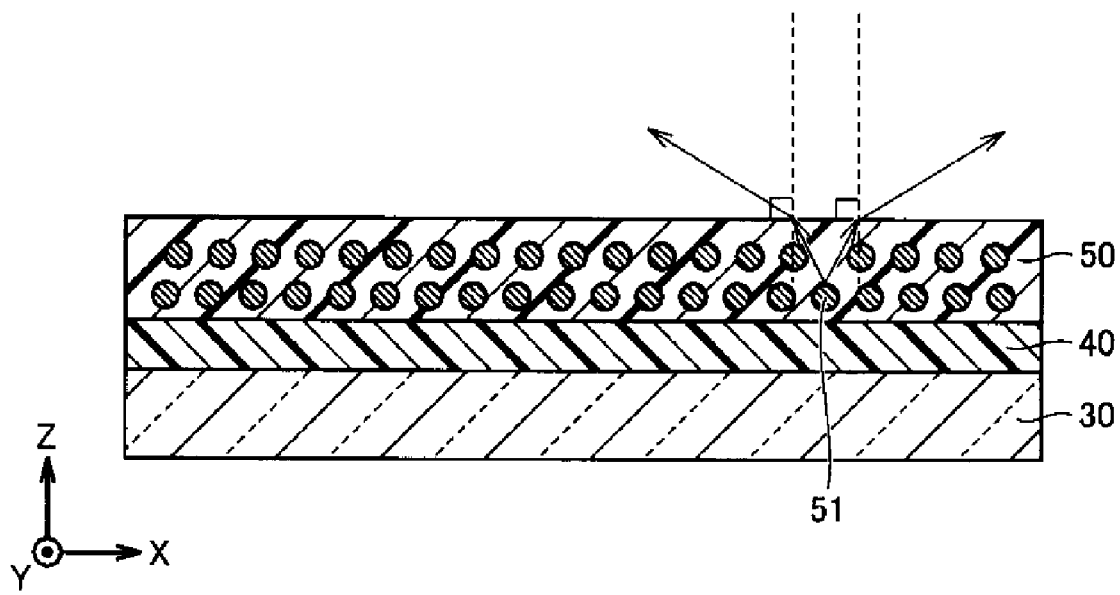
FIG. 12 is a schematic view showing a representative path of the secondary light emitted from the phosphors in the alignment state shown in FIG. 1.

FIG. 12 is a schematic view showing a representative path of the secondary light emitted from the first phosphors shown in FIG. 1. The representative path of the secondary light emitted from the first phosphors 51 will be explained with reference to FIG. 12.

As described above, the secondary light emitted from the first phosphors 51 has directionality in which emission intensity is high along the emission direction (Z-axis direction in the drawing) and also has a specific polarization component. Therefore, as shown in FIG. 12, a large portion of the secondary light emitted from the first phosphors 51 towards the emission direction enters the interface between the first phosphor layer 50 and outside (the atmosphere) at or below the critical angle, which is defined by the refractive index of the first phosphor layer 50 and the refractive index of outside (the atmosphere). The light that is incident at or below the critical angle exits to outside (to the atmosphere).

Meanwhile, the secondary light that is incident on the interface between the first phosphor layer 50 and the outside (atmosphere) at an angle greater than the critical angle is totally reflected at the interface between the first phosphor layer 50 and the outside (atmosphere) and then exits from the end faces of the first phosphor layer 50 or the end faces of the first transmissive substrate 30. The secondary light that exits from the end faces of the first phosphor layer 50 or the end faces of the first transmissive substrate 30 does not contribute to emission of the illumination device 100 and is lost. A more detailed explanation of the progression of the totally reflected secondary light will be explained later in the comparison examples.

If the refractive index of outside (the atmosphere) is approximately 1.0 and the refractive index of the first phosphor layer 50 is set to approximately 1.6, then the critical angle of the interface between the first phosphor layer 50 and the outside (atmosphere) is approximately 39°.

Next, additive color mixing of the primary light and secondary light will be described. The blue primary light emitted from the light source 20 mainly exits towards the first transmissive substrate 30, passes through the first transmissive substrate 30 and first alignment film 40, and then reaches the first phosphor layer 50. Inside the first phosphor layer 50, the primary light that illuminates the first phosphors 51, which are aligned by the first alignment film 40, is absorbed by these first phosphors 51 and converted to yellow light as secondary light and then mainly emitted to outside (in the Z-axis direction in the drawing). The light that does not illuminate the first phosphors 51 is not converted and passes through the first phosphor layer 50 still as blue primary light.

This mixes the blue primary light that has been emitted from the light source 20 and passed through the first phosphor layer 50 with the yellow secondary light emitted from the first phosphors 51, which results in white light being emitted to outside as the illumination light.

Figure 13:
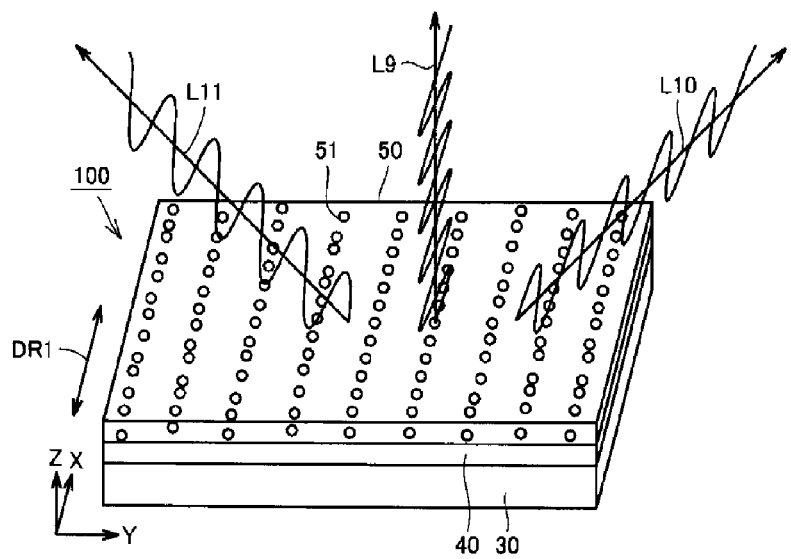
FIG. 13 is a view of the relationship between the alignment direction of the phosphors and the polarization direction of the secondary light emitted from the phosphors in the aligned state.
Figure 14:
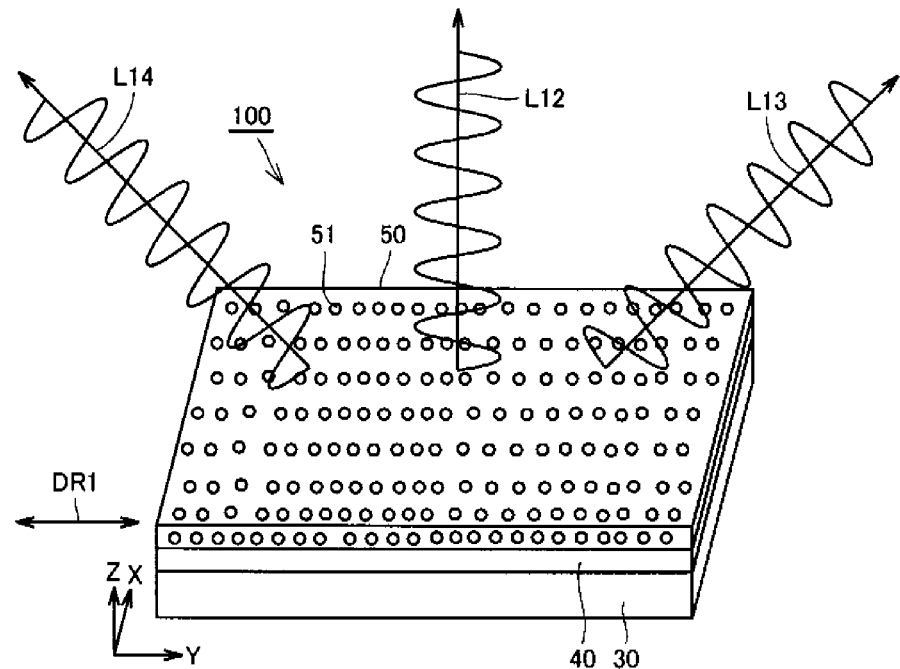
FIG. 14 is a view of the relationship between the alignment direction of the phosphors and the polarization direction of the secondary light emitted from the phosphors in the aligned state.

FIG. 13 and FIG. 14 show the relationship between the alignment direction of the phosphors and the polarization direction of the secondary light emitted from the aligned phosphors. The relationship between the alignment direction of the phosphors and the polarization direction of the secondary light emitted from the aligned phosphors will be explained with FIG. 13 and FIG. 14.

As shown in FIG. 13, when the first phosphors 51 are aligned along the X-axis direction, the proportion of secondary light emitted from the first phosphors 51 with a polarization that is parallel to the X-axis direction increases, as shown by L9, L10, and L11.

Furthermore, as shown in FIG. 14, when the first phosphors 51 are aligned along the Y-axis direction, the proportion of secondary light emitted from the first phosphors 51 with a polarization that is parallel to the Y-axis direction increases, as shown by L12, L13, and L14.

When the first phosphors 51 are aligned in this manner, the proportion of polarized light that is parallel to the alignment direction of the first phosphors 51 becomes much greater than the polarized light that is perpendicular to the alignment direction of the first phosphors 51. Accordingly, controlling the alignment direction of the first phosphors 51 makes it possible to have a polarization that is parallel to a prescribed alignment direction. Furthermore, in the secondary light emitted from the first phosphors 51, the intensity of the polarization component that vibrates in the direction parallel to the alignment direction becomes greater than the intensity of the polarization component that vibrates in the direction perpendicular to the alignment direction. Moreover, the absorbency by the first phosphors of the primary light polarization component that vibrates in the direction parallel to the alignment direction is greater than the absorbency of the primary light polarization component that vibrates in the direction perpendicular to the alignment direction. Experiments related to this polarization dependency related to emission and light absorption of the aligned first phosphors 51 will be described later.

Figure 15:
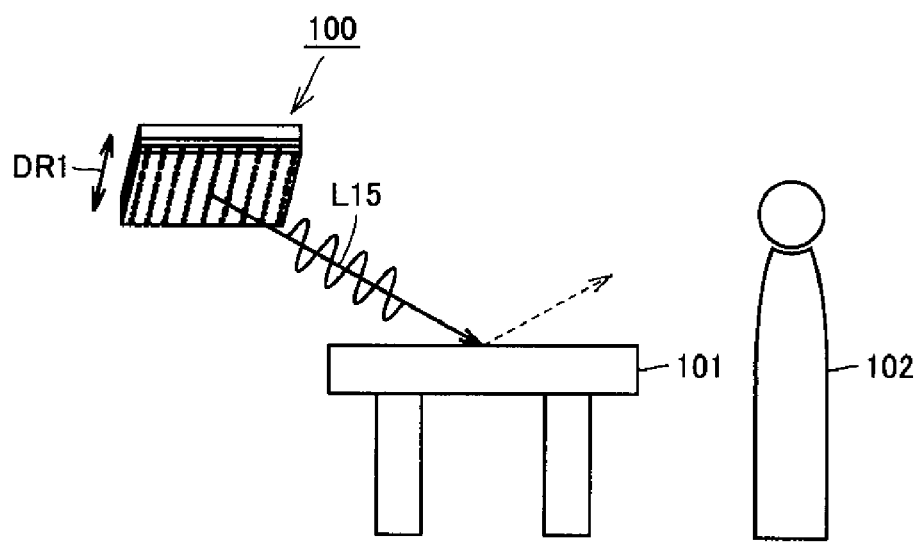
FIG. 15 is a usage example of an illumination device that uses secondary light emitted from phosphors in the aligned stated.

FIG. 15 is a usage example of the illumination device that uses the secondary light emitted from phosphors in the aligned stated. The usage example of the illumination device that uses the secondary light emitted from phosphors in the aligned stated will be explained with reference to FIG. 15.

As shown in FIG. 15, in the present usage example, the illumination device 100 of the present embodiment is a desk stand illumination device or the like. As described above, controlling the alignment direction of the first phosphors 51 makes it possible to obtain polarized light having a specific direction. It is possible to control the alignment direction of the first phosphors 51 such that the polarization direction of the illumination light L15 from the illumination device 100 becomes a P wave, for example. P waves are not likely to reflect against objects 101 such as a book or PC display, and thus can reduce the amount of reflected light that enters the eyes of the user 102. This suppresses reflective glare and, as a result, makes it easier to view the object 101 without harming the luminance of the illumination light.

Furthermore, even if the illumination device 100 of the present embodiment is a ceiling light fixture, it is possible to reduce the amount of light that is reflected onto the surface of a liquid crystal display device inside the room, for example, which can suppress reflective glare. In addition, the illumination device 100 of the present embodiment can achieve similar effects even if applied to a laser device or various types of optical systems such as sensors.

As described above, in the illumination device 100 of the present embodiment, the first alignment film 40 aligns the first phosphors 51 and polymer molecules 53 in a direction parallel to the first primary surface, which increases the scattering intensity of the polymer molecules 53 with respect to the polarized light emitted from the phosphors 52. This makes it possible to efficiently extract secondary light to the emission surface side and to concentrate the secondary light in the emission direction (Z-axis direction). Therefore, a large portion of the secondary light emitted in the emission direction enters the interface between the first phosphor layer 50 and outside (the atmosphere) at or below the critical angle, which is defined by the refractive index of the first phosphor layer 50 and the refractive index of outside (the atmosphere). As a result, a large portion of the secondary light emitted in the emission direction exits to outside, which improves the extraction efficient of secondary light. Furthermore, by improving the extraction efficiency of secondary light, the amount of illumination light that is mixed with primary light and emitted to outside also increases, which improves the luminance of the illumination device 100.

It should be noted that, in the present embodiment, an example was described in which the light source 20 emits visible light having a wavelength that corresponds to blue light, but the present invention is not limited to this, and it is possible to suitably select as the light source 20 a configuration that emits light having wavelengths in the visible light spectrum such as wavelengths in the purple region or wavelengths corresponding to green, for example. Moreover, the type of first phosphors 51 can be suitably selected in accordance with the color of primary light emitted from the light source 20.

In the present embodiment, the wavelength conversion element 10 may further include a wavelength-selective transmissive film that absorbs primary light having a first wavelength on the emission surface 10b side and selectively allows secondary light having a second wavelength to pass through. This makes it possible to easily extract illumination light constituted by only secondary light emitted from the first phosphors having a desired color.

In the present embodiment, an optical member such as a prism sheet or diffusion sheet may be further provided between the light source 20 and the wavelength conversion element 10 or on the emission surface 10b side of the wavelength conversion element 10.

Comparison Example

Figure 16:
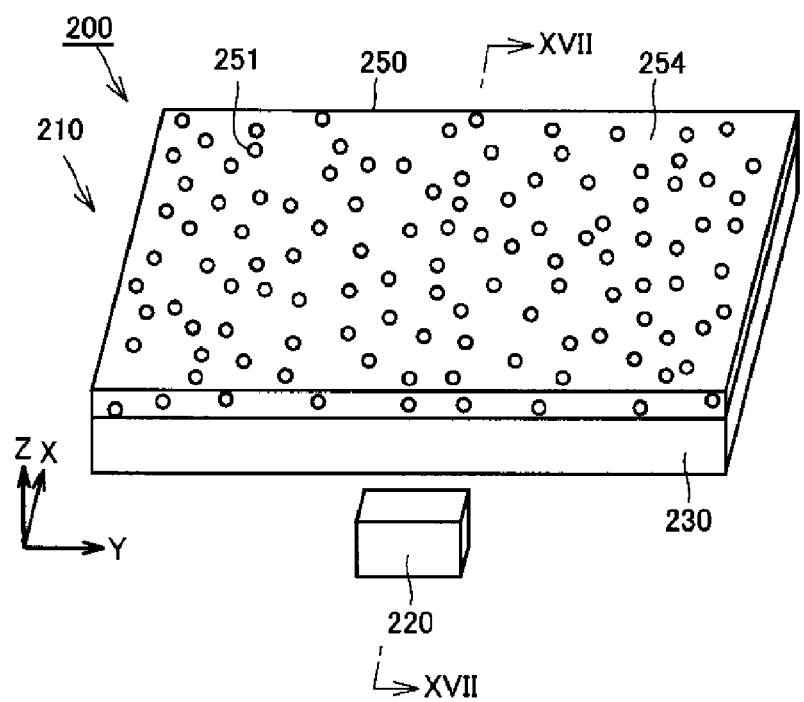
FIG. 16 is a schematic view of an illumination device according to a comparison example.
Figure 17:
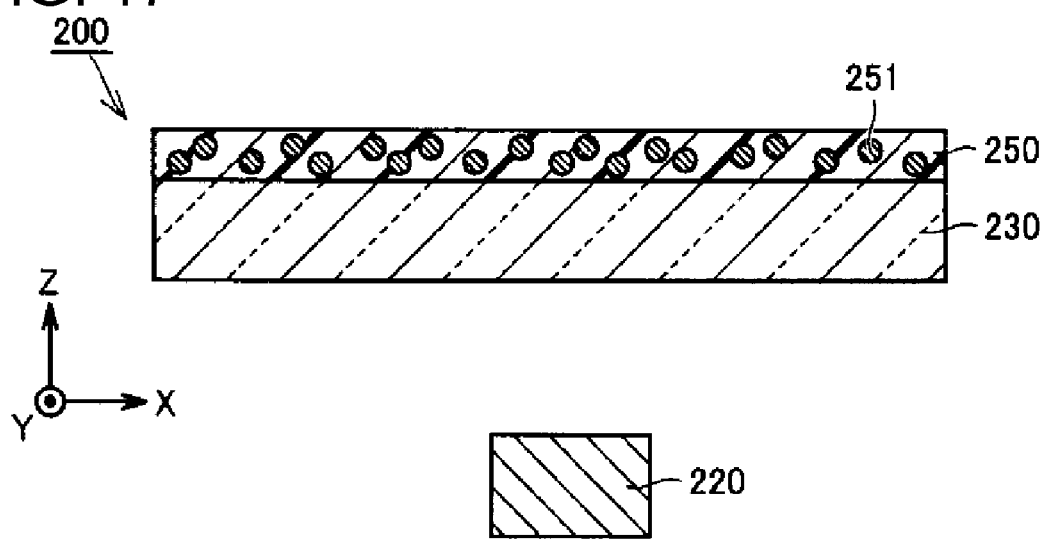
FIG. 17 is a schematic cross-sectional view of the illumination device in FIG. 16 along the line XVII-XVII.

FIG. 16 is a schematic view of an illumination device according to a comparison example. FIG. 17 is a schematic cross-sectional view along the line XVII-XVII of the illumination device shown in FIG. 16. An illumination device 200 of the present comparison example will be described with reference to FIG. 16 and FIG. 17.

As shown in FIG. 16 and FIG. 17, the illumination device 200 according to the comparison example differs from the illumination device 100 according to the above embodiments in that a first phosphor layer 250 is formed on a first transmissive substrate 230 and that the first phosphors 251 in the first phosphor layer 250 are not aligned.

Specifically, the illumination device 200 of the comparison example includes a light source 220 that emits primary light and a wavelength conversion element 210. The wavelength conversion element 210 includes a first transmissive substrate 230 arranged to face the light source 220, and a first phosphor layer 250 formed on the first primary surface of the first transmissive substrate 230. The first phosphor layer 250 includes first phosphors 251 that absorb parts of the primary light emitted from the light source 220 and emit secondary light with differing wavelengths, and birefringent anisotropic polymers 254. The first phosphors 251 are in an unaligned state in the first phosphor layer 250 and are arranged irregularly.

Figure 18:
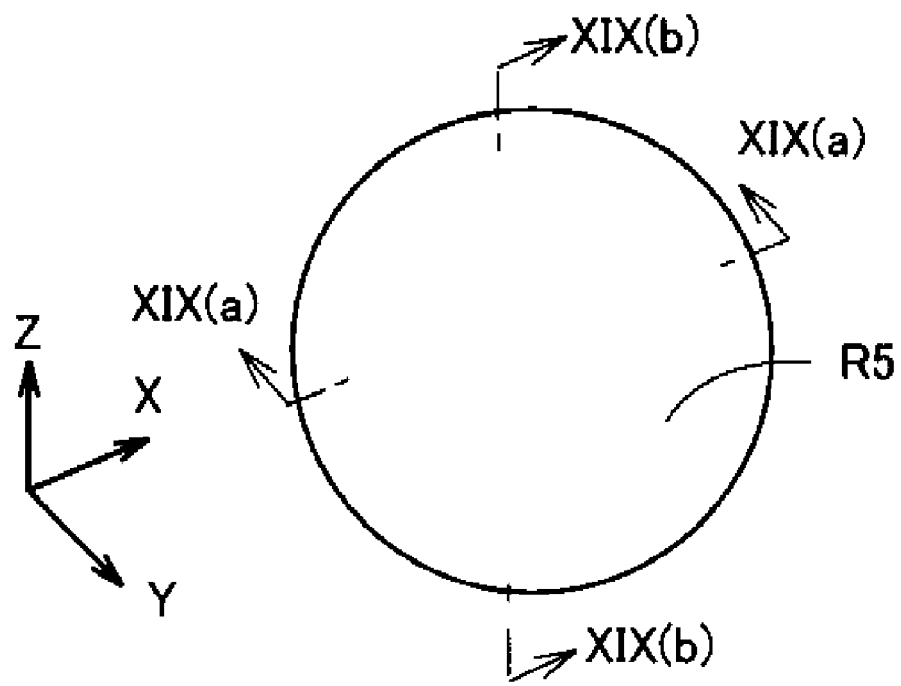
FIG. 18 is a schematic view of the emission direction of secondary light emitted from the phosphors in an unaligned state included in the wavelength conversion element shown in FIG. 16.
Figure 19:
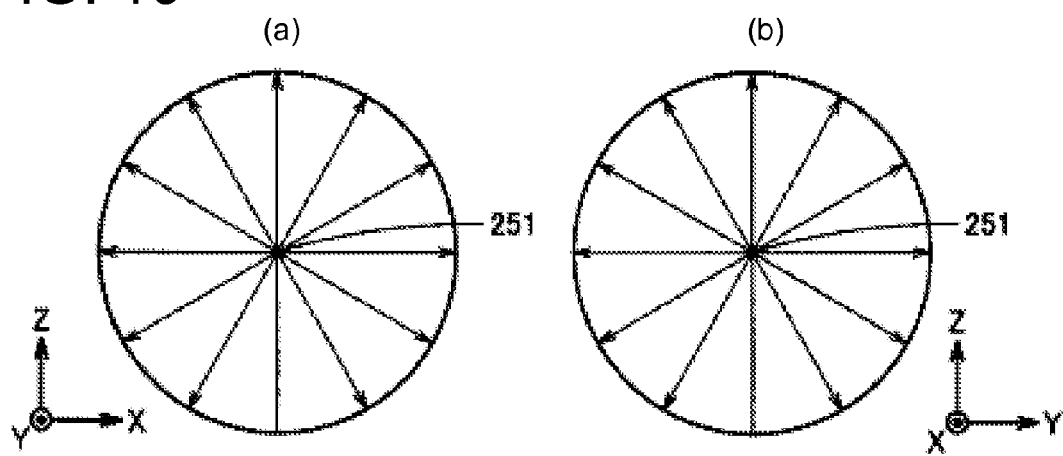
FIG. 19 is a schematic cross-sectional view along the line XIX(a)-XIX(a) and the line XIX(b)-XIX(b) in FIG. 18.

FIG. 18 is a schematic view of the emission direction of secondary light emitted from the phosphors in a unaligned state included in the wavelength conversion element shown in FIG. 16. FIG. 19 is a schematic cross-sectional view along the line XIX(a)-XIX(a) and the line XIX(b)-XIX(b) in FIG. 18. The secondary light emitted from the unaligned first phosphors 251 will be explained with reference to FIG. 18 and FIG. 19.

As shown in FIG. 18, the unaligned first phosphor 251 emits light isotropically in a spherical manner, as shown by the region R5.

FIG. 19(a) is a schematic view of, among the secondary light emitted from the unaligned first phosphors 251, the progression direction and intensity of the secondary light in the plane parallel to the Z-axis direction and X-axis direction. FIG. 19(b) is a schematic view of, among the light emitted from the unaligned first phosphors 251, the progression direction and intensity of the secondary light in the plane parallel to the Z-axis direction and Y-axis direction. In this example, the direction of the arrows pointing to the various directions shown in FIGS. 19(a) and 19(b) represents the progression direction of light, and the length of the arrows pointing to the various directions represents the intensity of the light.

As shown in FIG. 19(a), the unaligned first phosphor 251 emits light isotropically in a plane parallel to the Z-axis direction and X-axis direction. Furthermore, as shown in FIG. 19(b), the unaligned first phosphor 251 also emits light isotropically in a plane parallel to the Z-axis direction and Y-axis direction.

Figure 20:
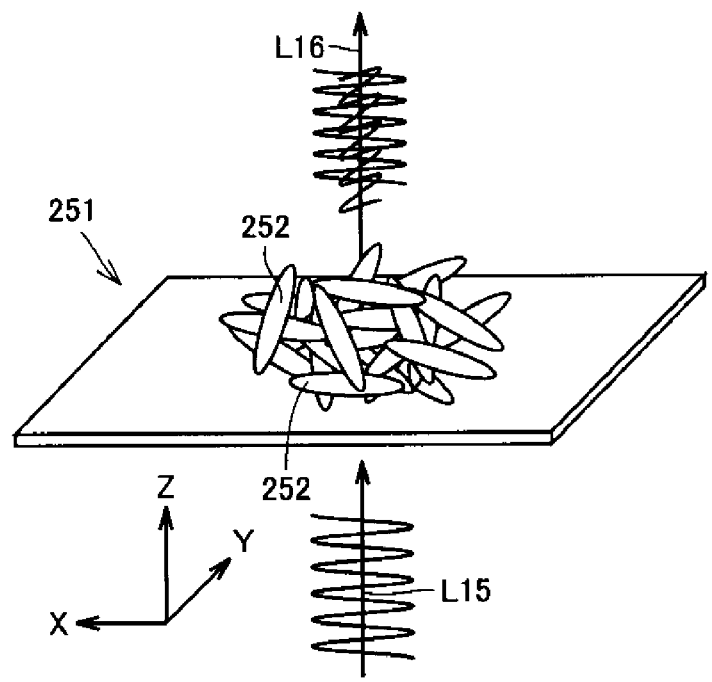
FIG. 20 is a view of a state in which the phosphors are not aligned.
Figure 21:
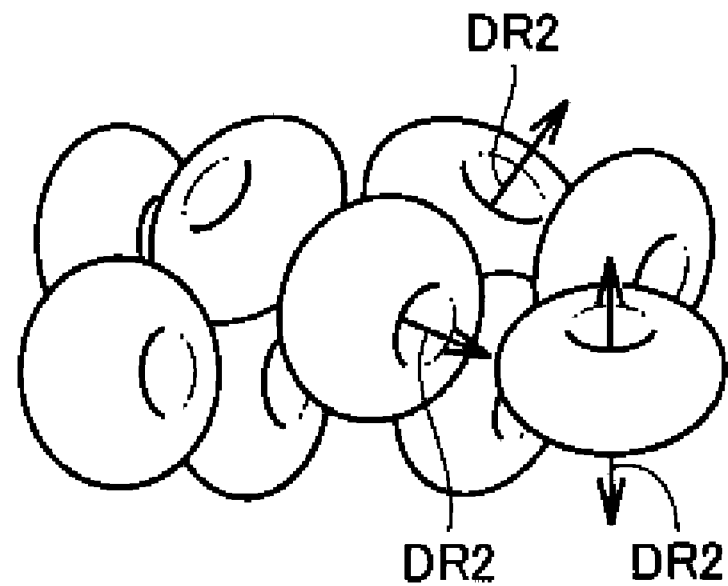
FIG. 21 is a view of the transition dipole moment direction of the respective phosphors in the unaligned state.

FIG. 20 is a view of a state in which the phosphors are not aligned. FIG. 21 is a view of the transition dipole moment direction of the respective phosphors in the unaligned state. The light emitted from the phosphors 252 included in the unaligned first phosphor 251 will be explained with reference to FIG. 20 and FIG. 21.

As shown in FIG. 20 and FIG. 21, when the first phosphor 251 is not aligned, the plurality of phosphors 252 included in the first phosphor 251 are arranged irregularly. Thus, the direction of the respective dipole moments (DR2 direction) of the plurality of phosphors 252 is also irregular. Due to this, the first phosphor 251, which is an aggregate of the unaligned phosphors 252, averages out as a whole to emit light isotropically.

As a result, the secondary light L16 emitted from the first phosphor 251 that has been excited by the primary light L15 emitted from the light source to the phosphor layer 250 exits from the emission surface side of the wavelength conversion element 10 as unpolarized light.

Figure 22:
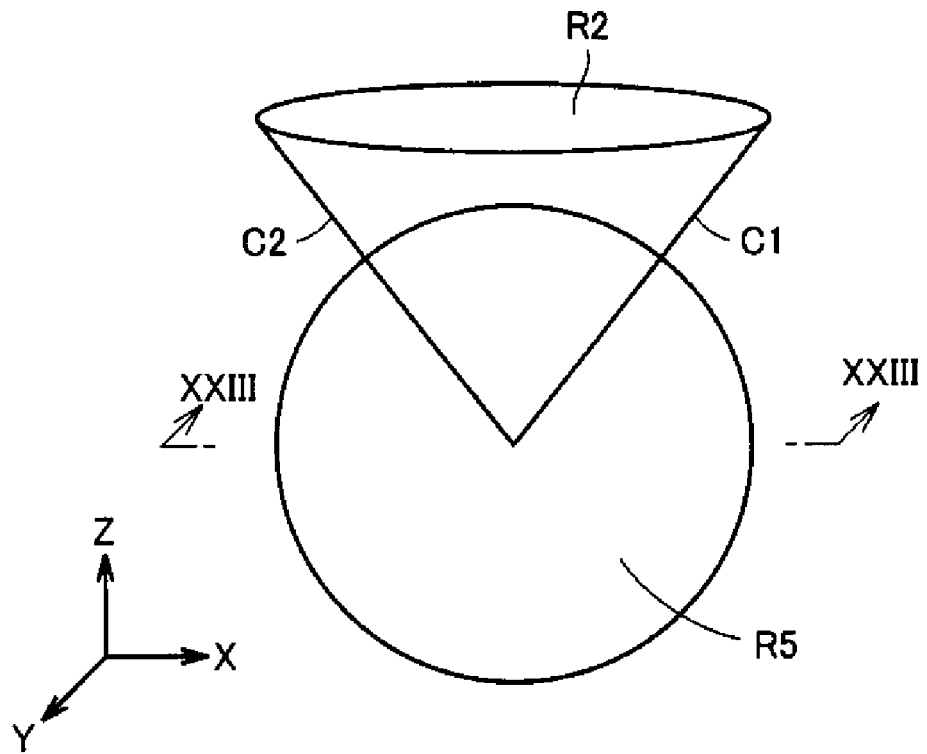
FIG. 22 is a view of the emission direction of secondary light emitted from the phosphors in the unaligned state and areas extractable as illumination light.
Figure 23:
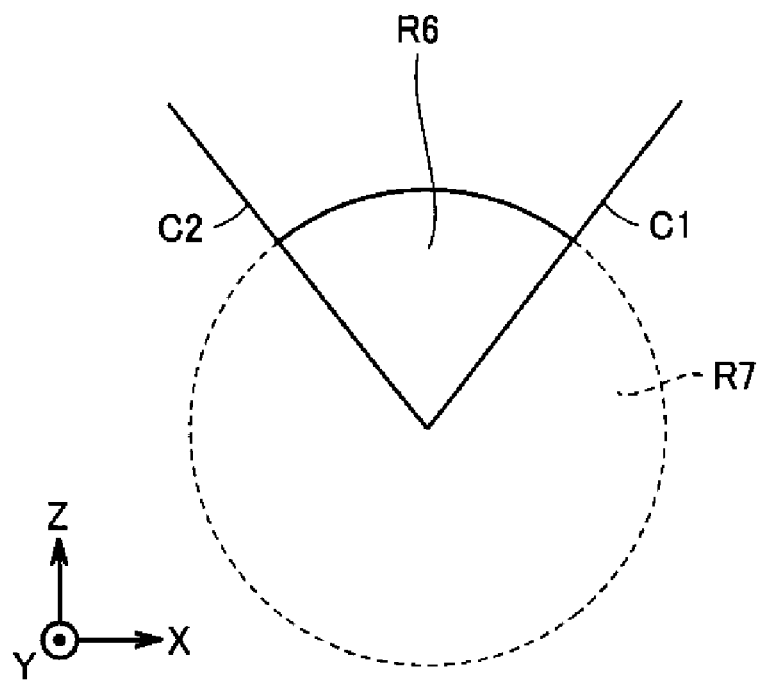
FIG. 23 is a schematic cross-sectional view along the line XXIII-XXIII in FIG. 22.

FIG. 22 is a view of the emission direction of secondary light emitted from the phosphors in the unaligned state and the areas that are extractable as illumination light. FIG. 23 is a schematic cross-sectional view along the line XXIII-XXIII in FIG. 22. The secondary light that is extractable from the unaligned phosphors 251 will be explained with reference to FIG. 22 and FIG. 23.

As shown in FIG. 22, in a conical shape including generatrices C1 and C2 and a bottom surface on top of the Z-axis, secondary light emitted from the unaligned first phosphor 251 can be extracted as illumination light.

As shown in FIG. 23, when seen from a cross section along the Z-axis direction, the secondary light emitted in a region R6 located inside the generatrices C1 and C2 can be extracted as illumination light. On the other hand, the secondary light emitted in the region R7 located outside the generatrices C1 and C2 cannot be extracted as illumination light.

In this example, the globular secondary light that is isotropically emitted from the unaligned first phosphors 251 has a high proportion emitted along the X axis direction, and the proportion occupied by the R6 region becomes lower than the light-emitting region R5 (see FIG. 22); thus, the amount of light from the illumination device 200 that does not contribute to illumination increases. This causes a drop in the extraction efficiency of secondary light.

Figure 24:
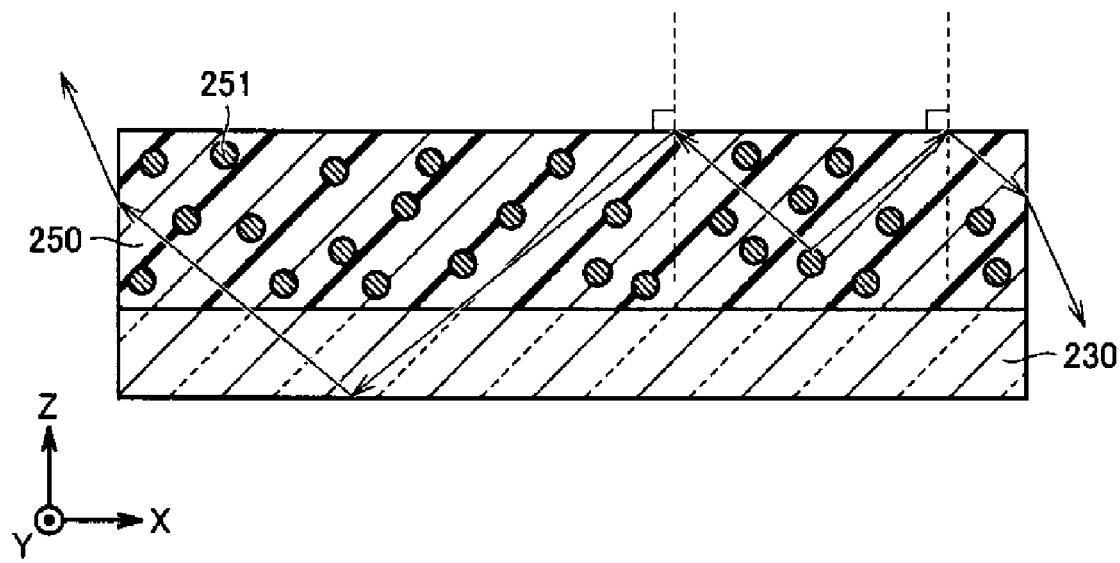
FIG. 24 is a schematic view of a representative path of the secondary light emitted from the phosphors in the unaligned state shown in FIG. 16.

FIG. 24 is a schematic view of a representative path of the secondary light emitted from the phosphors in the unaligned state shown in FIG. 16. The representative path of the secondary light emitted from the first phosphors 251 will be explained with reference to FIG. 24. The secondary light emitted from the first phosphors 251 as described above does not have directionality, i.e., is isotropic. Therefore, as shown in FIG. 24, a large portion of the secondary light emitted from the first phosphors 251 towards the emission direction enters the interface between the first phosphor layer 250 and outside (atmospheric layer) at an angle that exceeds the critical angle, which is defined by the refractive index of the first phosphor layer 250 and the refractive index of outside (atmospheric layer).

The secondary light that has entered at an angle greater than critical angle is totally reflected at the interface between the first phosphor layer 250 and outside (atmospheric layer). A portion of this totally reflected secondary light is emitted to outside from the end faces of the first phosphor layer 250. Another portion of the totally reflected secondary light returns to back inside the first phosphor layer 250 and enters the first transmissive substrate 230.

In this example, the refractive index of the first transmissive substrate 230 (approximately 1.4) is smaller than the refractive index outside (atmospheric layer) between the first transmissive substrate 230 and the light source 20 (approximately 1.0). Therefore, of the light that has entered the first transmissive layer 230, the secondary light that has entered the interface between the first transmissive substrate 230 and outside (atmospheric layer) at an angle that exceeds the critical angle, which is defined by the refractive index of the first transmissive substrate 230 and the refractive index of outside (atmospheric layer), is totally reflected at this interface. The secondary light that is totally reflected at the interface enters the first phosphor layer 250 and is emitted to outside from the end faces of the first phosphor layer 250.

In this manner, a large portion of the secondary light emitted from the first phosphors 251 is totally reflected at the interface of the first phosphor layer 250 and outside (atmospheric layer) and the interface of the first transmissive substrate 230 and the outside (atmospheric layer) positioned between the first transmissive substrate 230 and the light source 20 while being propagated inside the first phosphor layer 250 and the first transmissive substrate 230. This light then exits from the end faces of the first phosphor layer 250 or the end faces of the first transmissive substrate 230. The secondary light that exits from the end faces of the first phosphor layer 250 or the end faces of the first transmissive substrate 230 does not contribute to the illumination light of the illumination device 200 and is lost.

Meanwhile, of the secondary light emitted from the first phosphors 251, the light that enters at the interface between the first phosphor layer 250 and outside (atmospheric layer) at an angle less than or equal to the critical angle exits to outside (atmospheric layer) via this interface. This secondary light (yellow light) that has exited to outside (atmospheric layer) mixes with the primary light (blue light) that has passed through the first phosphor layer 250 without being absorbed by the first phosphors, and thus white light is emitted to outside.

As described above, the illumination device 200 of the comparison example also ultimately emits white light as illumination light, but the secondary light emitted from the phosphors 251 is isotropic, and thus there is an increase in the proportion of secondary light that will be incident on the interface of the first phosphor layer 250 and outside (atmospheric layer) at an angle greater than the critical angle, which is defined by the refractive index of the first phosphor layer 250 and the refractive index of outside (atmospheric layer). Due to this, there is an increase in the amount of light that exits from the end faces of the first phosphor layer 250 and the end faces of the first transmissive substrate 230 and that thus does not contribute to illumination by the illumination device 200.

Effects of Embodiment Relative to Comparison Example

As described above, in the illumination device 100 of the embodiment, the first alignment film 40 uniaxially aligns the first phosphors 51, and thus polarized light emitted from the phosphors 52 can be efficiently scattered towards the emission surface 10b, which allows for efficient extraction from the emission surface 10b of the secondary light emitted by the first phosphors 51.

Therefore, as described above, there is an increase in the amount of secondary light incident on the interface of the first phosphor layer 50 and outside (atmospheric layer) at or below the critical angle, and, compared to the illumination device 200 of the comparison example, there is a greater amount of secondary light emitted to outside (atmospheric layer) from the interface of the first phosphor layer 50 and outside (atmospheric layer) as well as less light that escapes from the end faces of the first phosphor layer 50 and the end faces of the first transmissive substrate 30 and that thus does not contribute to illumination by the illumination device 100.

Accordingly, it is possible to improve the extraction efficiency of secondary light, which allows for the amount of light emitted to outside as illumination light to be increased, thereby improving luminance. Furthermore, the illumination device 100 according to the embodiment emits polarized light having a polarization component in a direction parallel to the arrangement direction of the first phosphors; therefore, when this illumination device is used as the backlight for a liquid crystal display device, for example, the polarization direction is adjusted to improve the usage efficiency of the light.

Modification Example 1

Figure 25:
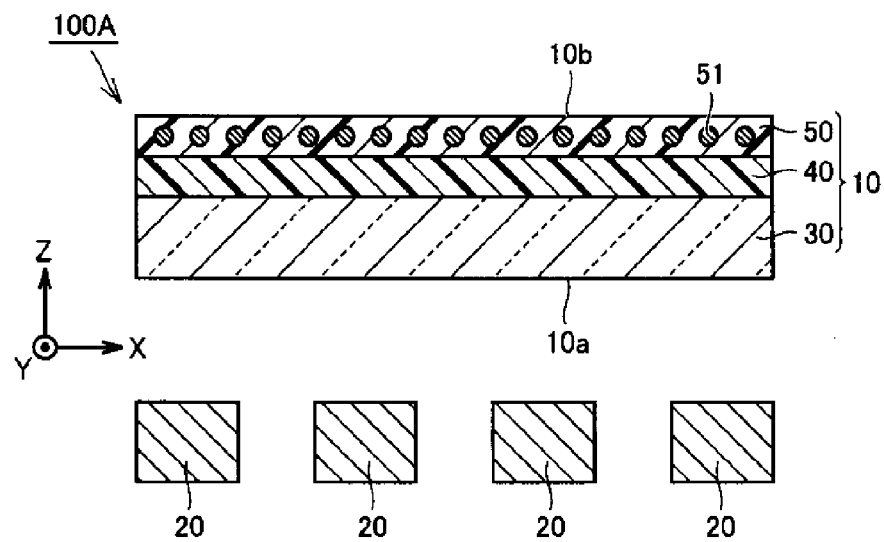
FIG. 25 is a schematic cross-sectional view of an illumination device according to Modification Example 1.

FIG. 25 is a schematic cross-sectional view of an illumination device according to Modification Example 1. An illumination device 100A of Modification Example 1 will be described with reference to FIG. 25.

As shown in FIG. 25, the illumination device 100A of the present modification example differs in the configuration of a light source 20, as compared to the illumination device 100 of the embodiment above. Specifically, the illumination device 100A of the present modification example includes a plurality of light sources 20 arrayed in a plane with prescribed gaps therebetween.

In this type of configuration, even if the area of the first transmissive substrate 30 is increased, a prescribed amount of light can be maintained by arraying the light sources 20 in a plane. Furthermore, the first alignment film 40 uniaxially aligns the first phosphors 51 in the direction parallel to the first primary surface; therefore, the polarized light emitted from the phosphors 52 can be efficiently scattered towards the emission surface, and the secondary light emitted from the first phosphors 51 will have strong intensity and directionality along the emission direction (the Z-axis direction in the drawing). Accordingly, the illumination device 100A of the present modification example can achieve approximately similar effects to the illumination device 100 of the above embodiment.

Modification Example 2

Figure 26:
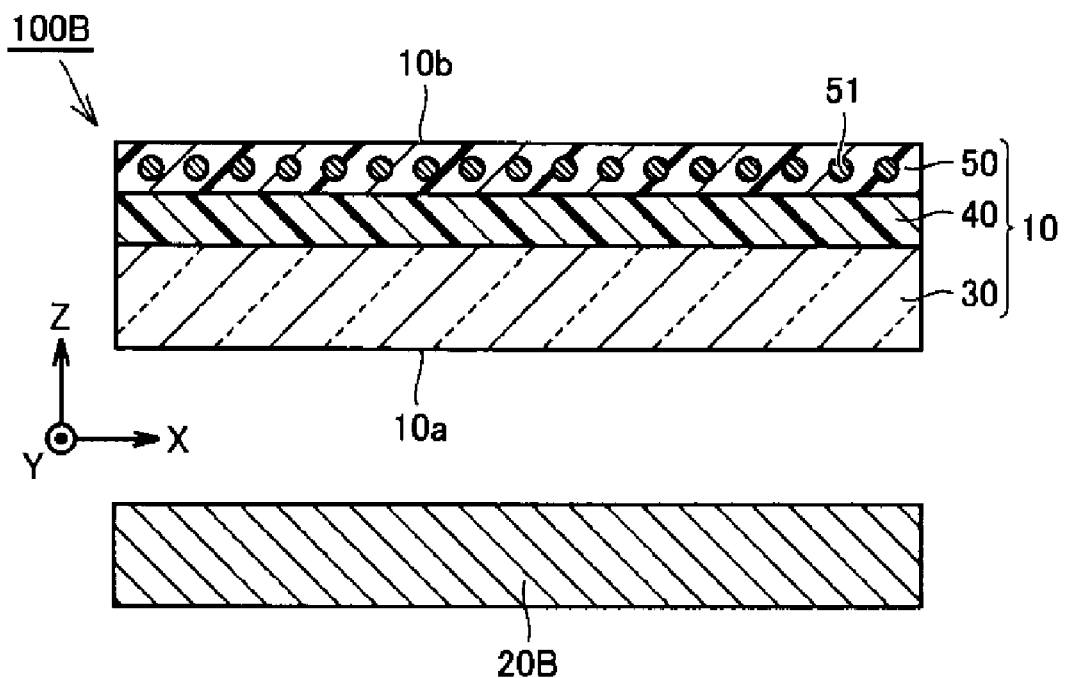
FIG. 26 is a schematic cross-sectional view of an illumination device according to Modification Example 2.

FIG. 26 is a schematic cross-sectional view of an illumination device of Modification Example 2. An illumination device 100B of the present modification example will be described with reference to FIG. 26.

As shown in FIG. 26, the illumination device 100B of the present modification example differs in the configuration of a light source 20B, as compared to the illumination device 100 of the above embodiment. Specifically, the illumination device 100B of the present modification example includes a light source 20B constituted by a discharge tube. The light source 20B can be a discharge tube having phosphors that emit blue light, for example.

In this type of configuration, a discharge tube is used, which is more affordable than an LED light source, and thus manufacturing costs of the illumination device can be reduced in cases where illumination is performed over a relatively wide area. Furthermore, the first alignment film 40 uniaxially aligns the first phosphors 51 in the direction parallel to the first primary surface; therefore, the polarized light emitted from the phosphors 52 can be efficiently scattered towards the emission surface, and the secondary light emitted from the first phosphors 51 will have strong intensity and directionality along the emission direction (the Z-axis direction in the drawing). Accordingly, the illumination device 100B of the present modification example can achieve approximately similar effects to the illumination device 100 of the above embodiment.

Modification Example 3

Figure 27:
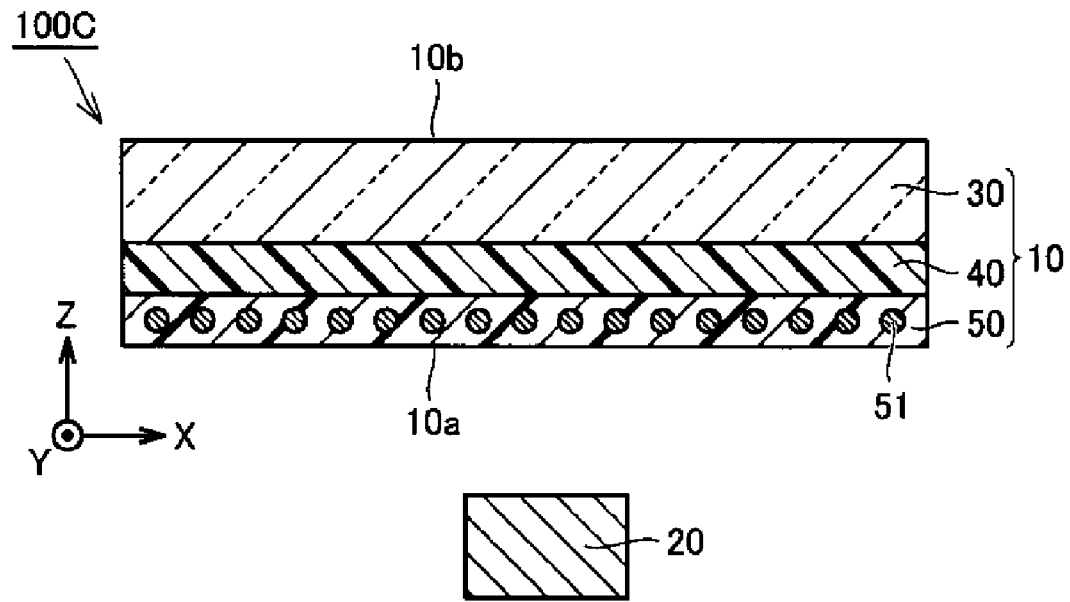
FIG. 27 is a schematic cross-sectional view of an illumination device according to Modification Example 3.

FIG. 27 is a schematic cross-sectional view of an illumination device of Modification Example 3. An illumination device 100C of the present modification example will be described with reference to FIG. 27.

As shown in FIG. 27, the illumination device 100C of the present modification example differs in that the first transmissive substrate 30 is disposed such that the first phosphor layer 50 faces the light source 20, as compared to the illumination device 100 of the above embodiment.

As above, in this type of configuration, the first alignment film 40 uniaxially aligns the first phosphors 51 in the direction parallel to the first primary surface; therefore, the polarized light emitted from the phosphors 52 can be efficiently scattered towards the emission surface, and the secondary light emitted from the first phosphors 51 will have strong intensity and directionality along the emission direction (the Z-axis direction in the drawing). Accordingly, the illumination device 100C of the present modification example can achieve approximately similar effects to the illumination device 100 of the above embodiment.

In Modification Example 4 to Modification Example 9 below, a case will be described in which the phosphor layer is arranged in the same plane in a plurality, and each one of these plurality of phosphor layers has a gap adjacent thereto, with the remaining plurality of phosphor layers filling in this gap. In such a case, it is preferable the peak wavelengths of the phosphors included in the respective plurality of phosphor layers differ from one another.

Modification Example 4

Figure 28:
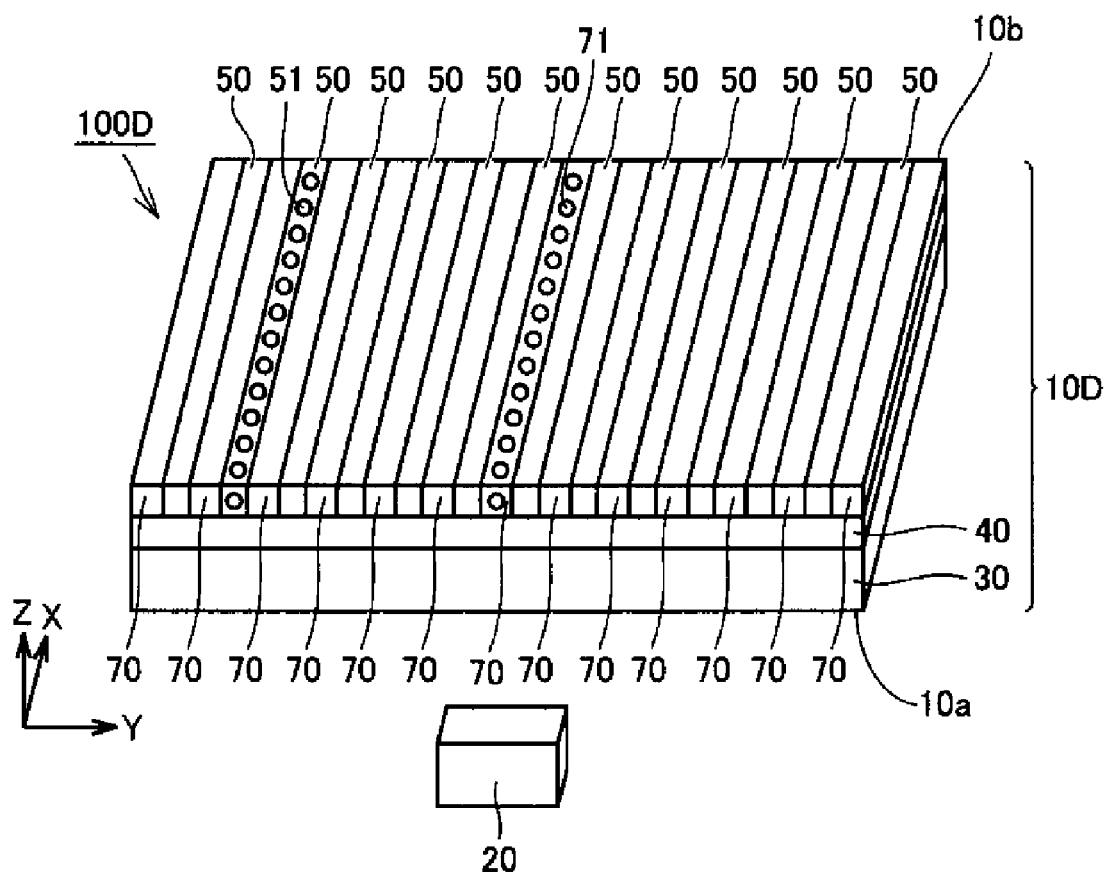
FIG. 28 is a schematic cross-sectional view of an illumination device according to Modification Example 4.

FIG. 28 is a schematic view of an illumination device according to Modification Example 4. An illumination device 100D of the present modification example will be described with reference to FIG. 28.

As shown in FIG. 28, the illumination device 100D of the present embodiment differs from the illumination device 100 of the above embodiment in the configuration of the phosphor layer formed on the first alignment film 40.

Specifically, the illumination device 100D of the present embodiment includes the light source 20 and a wavelength conversion element 10D. The wavelength conversion element 10D includes a first transmissive substrate 30 arranged to face the light source 20, a first alignment film 40 formed on the first primary surface of the first transmissive substrate 30, and first phosphor layer 50 and second phosphor layers 70 formed on the first alignment film 40. The wavelength conversion element 10D also includes an incident surface 10a where primary light emitted from the light source 20 enters and an emission surface 10b where illumination light that includes secondary light (described later) is emitted. The incident surface 10a is opposite to the emission surface 10b.

The first phosphor layer 50 includes first phosphors 51, and the second phosphor layers 70 include second phosphors 71. The first phosphor layer 50 includes a plurality of sections extending along the X-axis direction arrayed in parallel but separate from one another. The second phosphor layers 70 are formed in a plurality so as to fill in the gaps between the adjacent sections of the first phosphor layer 50. In addition, the first phosphors 51 are uniaxially aligned by the first alignment film 40 along a direction parallel to the first primary surface in the first phosphor layer 50, and the second phosphors 71 are uniaxially aligned by the first alignment film 40 along a direction parallel to the first primary surface in the second phosphor layers 70. The first phosphors 51 and the second phosphors 71 are aligned in the same direction (the X-axis direction in the drawing) by the first alignment film 40.

The first phosphors 51 and the second phosphors 71 absorb a portion of the primary light emitted from the light source 20 and emit secondary light having a differing wavelength from the primary light. The peak wavelengths of the secondary light emitted by the first phosphors 51 differs from the peak wavelengths of the secondary light emitted from the second phosphors 71.

The first phosphor layer 50 and the second phosphor layer 70 are formed by adding the first phosphors 51 and the second phosphors 71 to birefringent anisotropic polymers. The birefringent anisotropic polymers can be liquid crystal polymers such as reactive mesogen, for example. The reactive mesogen can be UCL-017 manufactured by DIC Corporation, RMM 34C manufactured by Merck & Co., Inc., or the like, for example.

The first phosphors 51 can be dichroic phosphors such as green phosphors that absorb blue light and emit green light as secondary light, for example. The wavelength range of the green light emitted by the green phosphors is 460 nm to 580 nm. The peak wavelength at which the emission intensity for green light is greatest is 520 nm. Specifically, the first phosphors 51 can be BrilliantsulfoflavineFF, Thioflavine, or the like.

Meanwhile, the second phosphors 71 can be dichroic phosphors such as red phosphors that absorb blue light and emit red light as secondary light, for example. The wavelength range of the red light emitted by the red phosphors is 530 nm to 690 nm. The peak wavelength at which the emission intensity for red light is greatest is 610 nm. Specifically, the second phosphors 71 can be red phosphors such as RhodamineB. It should be noted that the first phosphors 51 and second phosphors 71 are not limited to the organic phosphors described above and may be inorganic phosphors, nano-crystal members, or quantum dots.

Next, a specific method of forming the first phosphor layer 50 and the second phosphor layers 70 on the first alignment film 40 will be described. It should be noted that the method of forming the first alignment film 40 on the first primary surface of the first transmissive substrate 30 can be similar to the above embodiment, with microgrooves being formed in the surface of the first alignment film 40 along the direction parallel to the first primary surface (the X-axis direction in the drawing).

In a state in which the microgrooves are formed in the surface of the first alignment film 40, a coating or printing method is used to coat liquid crystal polymers that are green phosphors mixed with liquid crystal material (reactive mesogen) at a prescribed wt. ratio on the first alignment film 40. The green phosphors are the first phosphors 51. Thereafter, the liquid crystal polymers are treated with heat, ultraviolet radiation, or the like to align the liquid crystal polymers. At such time, the liquid crystal polymers are aligned by the alignment regulating force of the first alignment layer 40 along the extension direction of the microgrooves (the X-axis direction in the drawing). This also aligns the green phosphors, which are the first phosphors 51, included in the liquid crystal polymers along the extension direction of the microgrooves (the X-axis direction in the drawing).

Next, an already-existing patterning method such as photolithography, wet etching, dry etching, or the like is used to pattern the liquid crystal polymers into prescribed shapes, which forms the first phosphor layer 50 including the plurality of sections arrayed in parallel but separate from one another on the first alignment film 40.

Next, a coating or printing method is used to coat liquid crystal polymers that are red phosphors mixed with liquid crystal material (reactive mesogen) at a prescribed wt. ratio on the first phosphor layer 50 and the first alignment film 40. The red phosphors are the second phosphors 71. Thereafter, the liquid crystal polymers are treated with heat, ultraviolet radiation, or the like to align the liquid crystal polymers. At such time, the liquid crystal polymers are aligned by the alignment regulating force of the first alignment layer 40 along the extension direction of the microgrooves (the X-axis direction in the drawing). This also aligns the red phosphors, which are the second phosphors 71, included in the liquid crystal polymers along the extension direction of the microgrooves (the X-axis direction in the drawing).

Next, an already-existing patterning method such as photolithography, wet etching, dry etching, or the like is selected as appropriate to pattern the liquid crystal polymers into prescribed shapes such that the first phosphor layer 50 are exposed, thereby forming the first alignment film 40 such that the plurality of second phosphor layers 70 fill in the gaps between the sections of the adjacent first phosphor layer 50.

Using this type of method makes it possible, while the first phosphors 51 and second phosphors 71 are aligned, to form the first phosphor layer 50 and the plurality of second phosphor layers 70 on the first alignment film 40.

Next, the mixing of the primary light and the secondary light will be described. The blue primary light emitted from the light source 20 primarily travels towards the first transmissive substrate 30, passes through the first transmissive substrate 30 and first alignment film 40, and then reaches the first phosphor layer 50 and the second phosphor layers 70.

Inside the first phosphor layer 50, the primary light that is incident on the first phosphors 51 aligned by the first alignment film 40 is absorbed by the first phosphors 51 and converted to green light, which is secondary light, and primarily emitted to outside (along the Z-axis direction in the drawing), but the light that is not incident on the first phosphors 51 is not converted and instead passes through the first phosphor layer 50 as blue light, which is primary light.

Meanwhile, inside the second phosphor layers 70, the primary light that is incident on the second phosphors 71 aligned by the first alignment film is absorbed by the second phosphors 71 and converted to red light, which is secondary light, and primarily emitted to outside (along the Z-axis direction in the drawing), but the light that is not incident on the second phosphors 71 is not converted and instead passes through the second phosphor layer 70 as blue light, which is primary light.

This causes the blue primary light emitted from the light source 20 and transmitted through the first phosphor layer 50 and second phosphor layers 70 to mix with: the green secondary light emitted from the first phosphors 51 aligned by the first alignment film 40; and the red secondary light emitted from the second phosphors 71 aligned by the first alignment film 40, which results in white light being emitted to outside as the illumination light.

With a configuration such as that described above, in the illumination device 100D of the present embodiment, the first phosphors 51 and second phosphors 71 are uniaxially aligned in a direction parallel to the first primary surface on the first alignment film 40, and thus the polarized light emitted from the phosphors can be efficiently scattered towards the emission surface, which results in the secondary light emitted from the first phosphors 51 and the second phosphors 71 having strong emission intensity and directionality along the emission direction (the Z-axis direction in the drawing). As a result, in the illumination device 100D of the present embodiment, the secondary light emitted from the first phosphors 51 and the second phosphors 71 can be efficiently extracted towards the outside (atmospheric layer)

from the first phosphor layer 50 and the second phosphor layers 70; therefore, the amount of illumination light that is a mixture of the primary light and secondary light will be increased, which will improve luminance.

Modification Example 5

Figure 29:
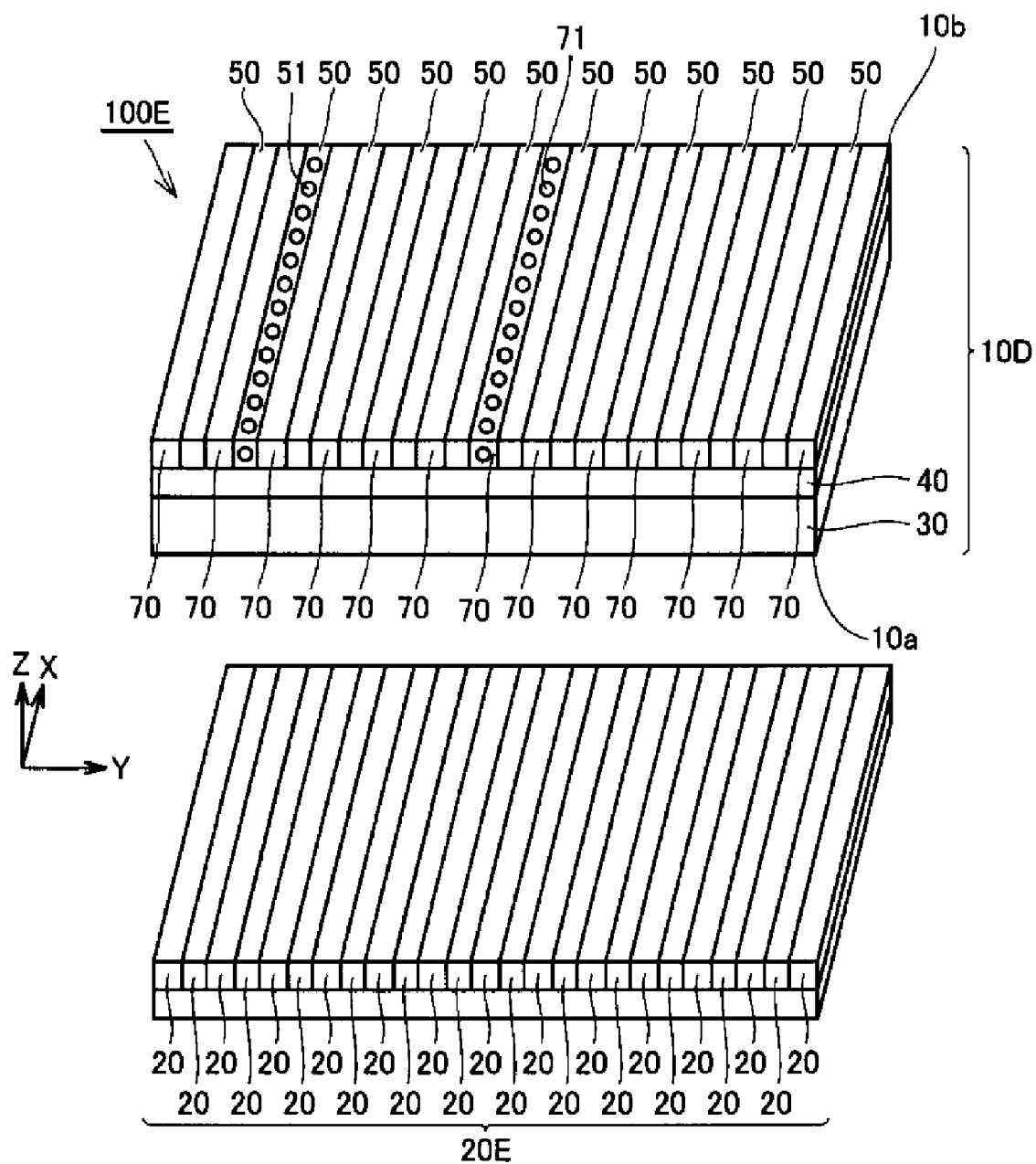
FIG. 29 is a schematic cross-sectional view of an illumination device according to Modification Example 5.

FIG. 29 is a schematic cross-sectional view of an illumination device according to Modification Example 5. An illumination device 100E of the present modification example will be described with reference to FIG. 29.

As shown in FIG. 29, the illumination device 100E of the present modification example differs from the illumination device 100D of Modification Example 4 in the configuration of the light source. Specifically, the illumination device 100E of the present modification example includes a light source group 20E that has a plurality of light sources 20 arranged in locations respectively corresponding to the plurality of first phosphor layers 50 and plurality of second phosphor layers 70.

As above, in this type of configuration, the first phosphors 51 and second phosphors 71 are uniaxially aligned in a direction parallel to the first primary surface, and thus the polarized light emitted from the phosphors can be efficiently scattered towards the emission surface, which results in the secondary light emitted from the first phosphors 51 and the second phosphors 71 having strong emission intensity and directionality along the emission direction (the Z-axis direction in the drawing). Accordingly, as above, the illumination device 100E of the present modification example can achieve approximately similar results to the illumination device 100D of Modification Example 4. Furthermore, adjusting the lighting intensity of the respective light sources 20 makes it possible to adjust the color tone of the illumination light from the illumination device 100E.

Modification Example 6

Figure 30:
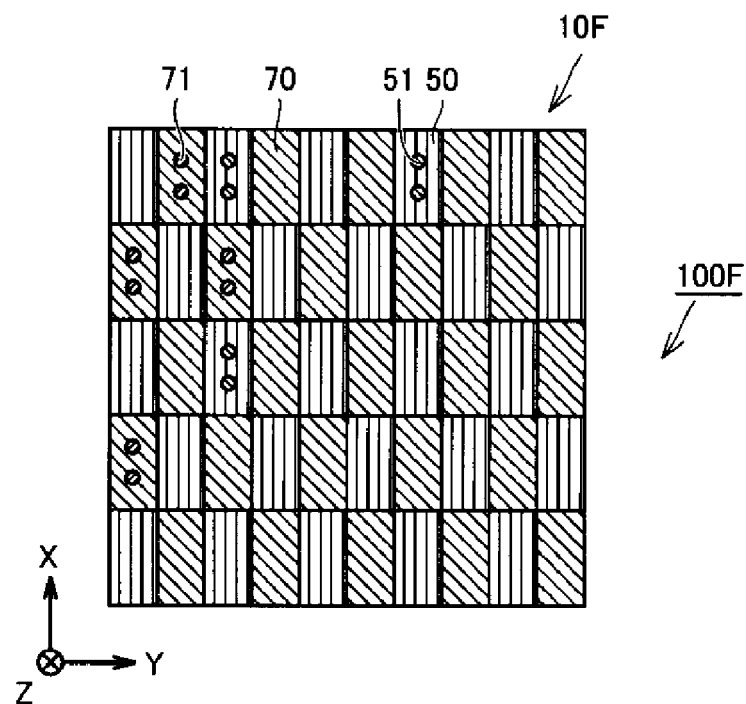
FIG. 30 is a schematic plan view of an illumination device according to Modification Example 6.

FIG. 30 is a schematic cross-sectional view of an illumination device according to Modification Example 6. An illumination device 100F of the present modification example will be described with reference to FIG. 30.

As shown in FIG. 30, the illumination device 100F of the present modification example differs from the illumination device 100D of Modification Example 4 in the arrangement of first phosphor layers 50 and second phosphor layers 70 of a wavelength conversion element 10F. Specifically, in the illumination device 100F of the present modification example, the first phosphor layers 50 include a plurality of sections arranged in a zigzag pattern and separated from one another, and the second phosphor layers 70 are formed in a plurality so as to fill in the gaps between the adjacent sections of the first phosphor layers 50.

In addition, the first phosphors 51 included in the first phosphor layers 50 are uniaxially aligned by the first alignment film 40 in a direction parallel to the first primary surface in the first phosphor layers 50, and the second phosphors 71 included in the second phosphor layers 70 are uniaxially aligned by the first alignment film 40 in a direction parallel to the first primary surface in the second phosphor layers 70. The first phosphors 51 and the second phosphors 71 are aligned in the same direction (the X-axis direction in the drawing) by the first alignment film 40.

As above, in this type of configuration, the first phosphors 51 and second phosphors 71 are uniaxially aligned in a direction parallel to the first primary surface, and thus the polarized light emitted from the phosphors can be efficiently scattered towards the emission surface, which results in the secondary light emitted from the first phosphors 51 and the second phosphors 71 having strong emission intensity and directionality along the emission direction (the Z-axis direction in the drawing). Accordingly, as above, the illumination device 100F of the present modification example can achieve approximately similar effects to the illumination device 100D of Modification Example 4.

Modification Example 7

Figure 31:
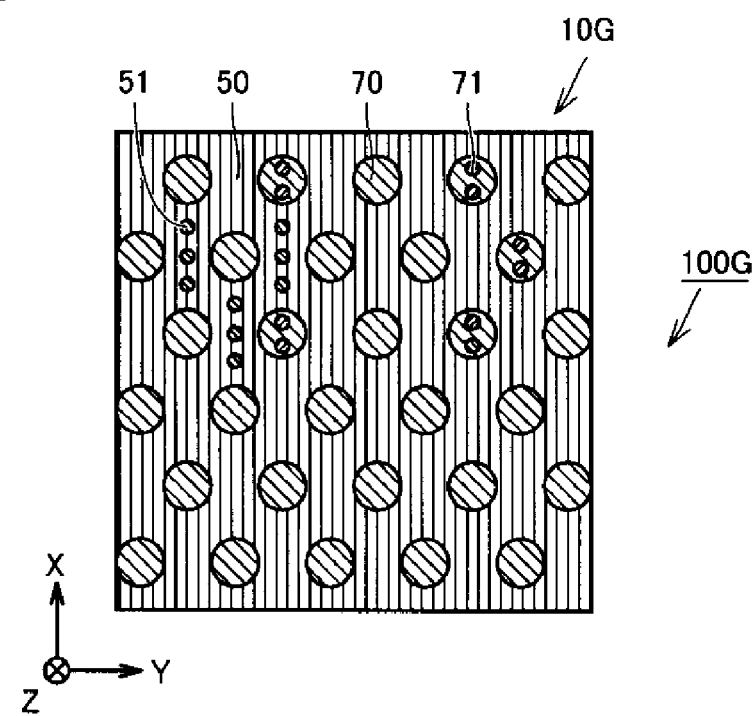
FIG. 31 is a schematic plan view of an illumination device according to Modification Example 7.

FIG. 31 is a schematic cross-sectional view of an illumination device according to Modification Example 7. An illumination device 100G of Modification Example 7 will be described with reference to FIG. 31.

As shown in FIG. 31, the illumination device 100G of Modification Example 7 differs from the illumination device 100D of Modification Example 4 in the arrangement of first phosphor layers 50 and second phosphor layers 70 in a wavelength conversion element 10G. Specifically, in the illumination device 100G of the present modification example, the first phosphor layers 50 are arranged so as to form a plurality of columnar gaps in a zigzag pattern, and the second phosphor layers 70 are formed so as to fill in the plurality of columnar gaps formed in the first phosphor layers 50.

In addition, the first phosphors 51 included in the first phosphor layers 50 are uniaxially aligned by the first alignment film 40 in a direction parallel to the first primary surface in the first phosphor layers 50, and the second phosphors 71 included in the second phosphor layers 70 are uniaxially aligned by the first alignment film 40 in a direction parallel to the first primary surface in the second phosphor layers 70. The first phosphors 51 and the second phosphors 71 are aligned in the same direction (the X-axis direction in the drawing) by the first alignment film 40.

As above, in this type of configuration, the first phosphors 51 and second phosphors 71 are uniaxially aligned in a direction parallel to the first primary surface, and thus the polarized light emitted from the phosphors can be efficiently scattered towards the emission surface, which results in the secondary light emitted from the first phosphors 51 and the second phosphors 71 having strong emission intensity and directionality along the emission direction (the Z-axis direction in the drawing). Accordingly, as above, the illumination device 100G of the present modification example can achieve approximately similar effects to the illumination device 100D of Modification Example 4.

Modification Example 8

Figure 32:
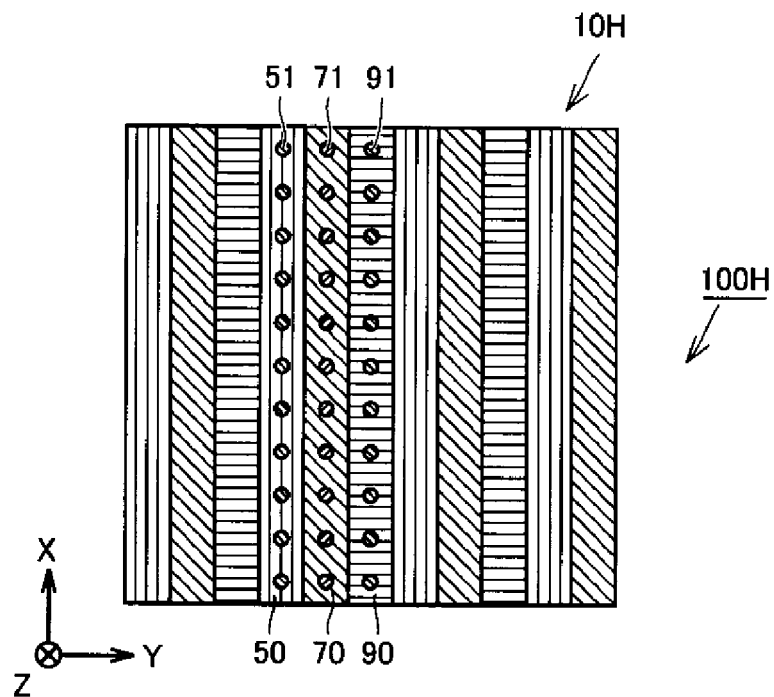
FIG. 32 is a schematic plan view of an illumination device according to Modification Example 8.

FIG. 32 is a schematic cross-sectional view of an illumination device according to Modification Example 8. An illumination device 100H of Modification Example 8 will be described with reference to FIG. 32.

As shown in FIG. 32, the illumination device 100H of Modification Example 8 differs from the illumination device 100D of Modification Example 4 in the configuration of the phosphor layers in the wavelength conversion element 10H and particularly in having third phosphor layers 90 that include third phosphors 91.

The third phosphors can be dichroic phosphors, and can be blue phosphors that absorb primary light and emit blue light as secondary light, for example. The wavelength range of the blue light emitted by the blue phosphors is 390 nm to 510 nm. The peak wavelength at which the emission intensity for blue light is greatest is approximately 450 nm.

Specifically, the third phosphors can be organic phosphors such as a bis-(triazinylamino)-stilbene disulfonic acid derivative, BBOT, or the like. It should be noted that the third phosphors 91 are not limited to these organic phosphors and may be inorganic phosphors, nano-crystal members, or quantum dots.

Specifically, the first phosphor layers 50 include a plurality of sections extending along the X-axis direction in parallel but separated from one another. The second phosphor layers 70 are adjacent to one side of the respective sections and are formed so as to fill in a portion of the gaps between the adjacent sections of the first phosphor layers 50. The third phosphor layers 90 are formed to fill in the gaps between the plurality of sections of the first phosphor layers 50 and the plurality of second phosphor layers 70.

In addition, the first phosphors 51 included in the first phosphor layers 50 are uniaxially aligned by the first alignment film 40 in a direction parallel to the first primary surface in the first phosphor layers 50; the second phosphors 71 included in the second phosphor layers 70 are uniaxially aligned by the first alignment film 40 in a direction parallel to the first primary surface in the second phosphor layers 70; and the third phosphors 91 included in the third phosphor layers 90 are uniaxially aligned by the first alignment film 40 in a direction parallel to the first primary surface in the third phosphor layers 90. The first phosphors 51, second phosphors 71, and third phosphors 91 are aligned in the same direction (the X-axis direction in the drawing) by the first alignment film 40. Furthermore, the peak wavelengths of the secondary light emitted by the first phosphors 51, second phosphors 71, and third phosphors 91 respectively differ from one another.

As above, in this type of configuration, the first phosphors 51, second phosphors 71, and third phosphors 91 are uniaxially aligned in a direction parallel to the first primary surface, and thus the polarized light emitted from the phosphors can be efficiently scattered towards the emission surface, which results in the secondary light emitted from the first phosphors 51, second phosphors 71, and third phosphors 91 having strong emission intensity and directionality along the emission direction (the Z-axis direction in the drawing). Accordingly, as above, the illumination device 100H of the present modification example can achieve effects that are approximately similar to the illumination device 100D of Modification Example 4. Moreover, increasing the number of phosphor layers makes it even easier to achieve the desired color tone.

Modification Example 9

Figure 33:
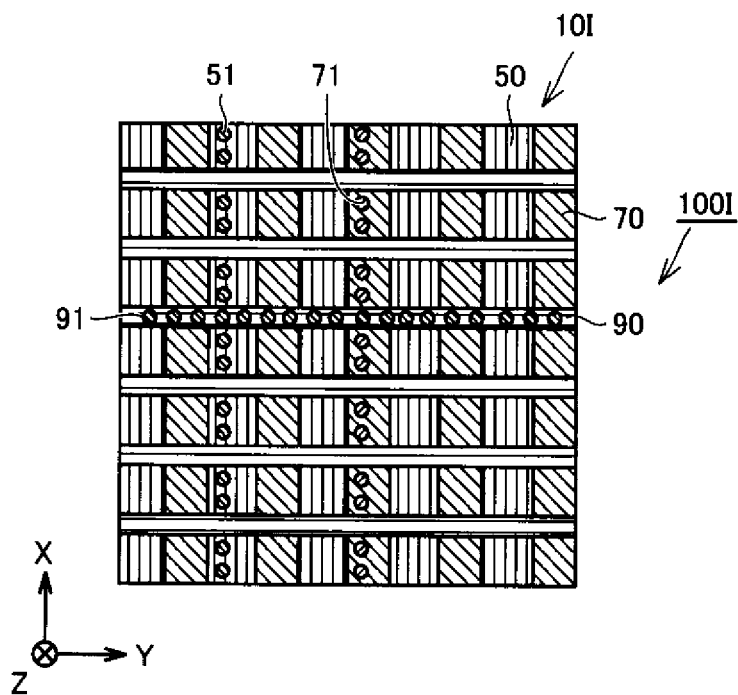
FIG. 33 is a schematic plan view of an illumination device according to Modification Example 9.

FIG. 33 is a schematic cross-sectional view of an illumination device according to Modification Example 9. An illumination device 100I of the present modification example will be described with reference to FIG. 33.

As shown in FIG. 33, the illumination device 100I of the present modification example differs from the illumination device 100D of Modification Example 4 in the configuration of the phosphor layers and in particularly in having third phosphor layers 90 that include third phosphors 91.

Specifically, the first phosphor layers 50 include a plurality of sections arranged in a zigzag pattern and separated from one another. The second phosphor layers 70 are formed so as to fill in the gaps between the sections of the first phosphor layers 50 that are adjacent along the Y-axis direction. The third phosphor layers 90 are formed so as to fill in the gaps between the sections of the first phosphor layers 50 that are adjacent along the X-axis direction and the gaps between the second phosphor layers 70 that are adjacent along the X-axis direction.

In addition, the first phosphors 51 included in the first phosphor layers 50 are uniaxially aligned by the first alignment film 40 in a direction parallel to the first primary surface in the first phosphor layers 50, the second phosphors 71 included in the second phosphor layers 70 are uniaxially aligned by the first alignment film 40 in a direction parallel to the first primary surface in the second phosphor layers 70, and the third phosphors 91 included in the third phosphor layers 90 are uniaxially aligned by the first alignment film 40 in a direction parallel to the first primary surface in the third phosphor layers 90. The first phosphors 51, second phosphors 71, and third phosphors 91 are aligned in the same direction (the X-axis direction in the drawing) by the first alignment film 40. Furthermore, the peak wavelengths of the secondary light emitted by the first phosphors 51, second phosphors 71, and third phosphors 91 respectively differ from one another.

As above, in this type of configuration, the first phosphors 51, second phosphors 71, and third phosphors 91 are uniaxially aligned in a direction parallel to the first primary surface, and thus the polarized light emitted from the phosphors can be efficiently scattered towards the emission surface, which results in the secondary light emitted from the first phosphors 51, second phosphors 71, and third phosphors 91 having strong emission intensity and directionality along the emission direction (the X-axis direction in the drawing). Accordingly, as above, the illumination device 100I of the present modification example can achieve effects that are approximately similar to the illumination device 100D of Modification Example 4. Moreover, increasing the number of phosphor layers makes it even easier to achieve the desired color tone.

It should be noted that, in Modification Example 4 to Modification Example 9, an example was described in which two or three types of phosphor layers were formed, but the present invention is not limited to this, and four or more types of phosphor layers may be formed. Furthermore, the arrangement, shape, size, and the like of the respective phosphor layers are not limited to the arrangement, shape, size, and the like of the phosphor layers in Modification Example 4 to Modification Example 9, and may be set as appropriate in accordance with the desired color tone.

Hereinafter, in Modification Example 10 to Modification Example 12, a case will be described in which the phosphor layers are arranged next to one another from the incident surface side to the emission surface side, with the peak wavelengths of the phosphors included in the plurality of phosphor layers respectively differing from one another. In such a case, it is preferable that the peak wavelengths of the phosphors become progressively smaller from the incident surface side to the emission surface side.

With this type of configuration, it is possible to prevent the secondary light emitted by phosphors with high excitation energy (blue color, for example) from being absorbed by the phosphors with low excitation energy (red color, for example), which makes it possible to prevent a drop in emission efficiency while achieving the desired color balance with ease.

Modification Example 10

Figure 34:
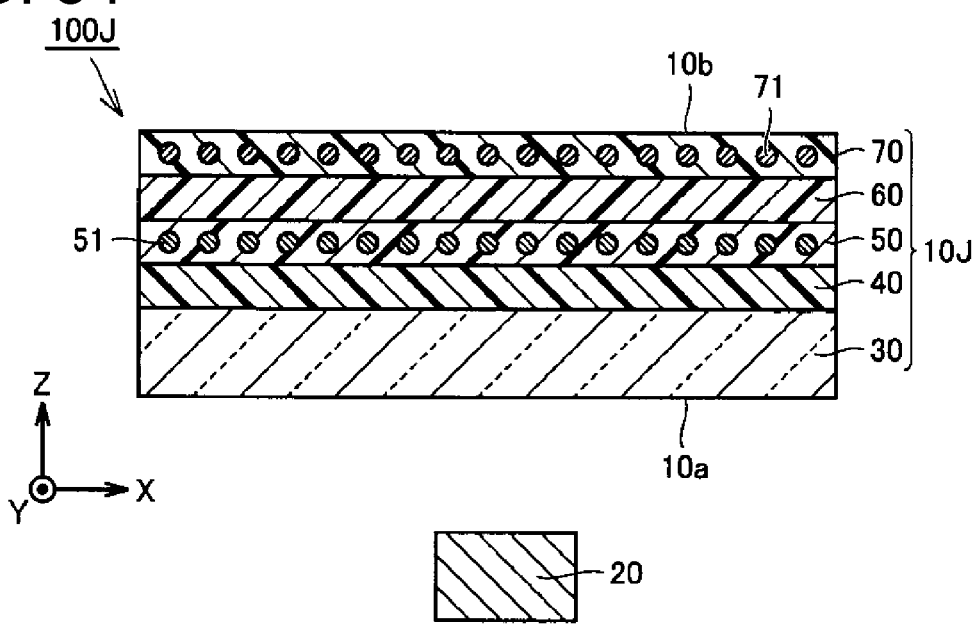
FIG. 34 is a schematic cross-sectional view of an illumination device according to Modification Example 10.

FIG. 34 is a schematic cross-sectional view of an illumination device according to Modification Example 10. An illumination device 100J of the present modification example will be described with reference to FIG. 34.

As shown in FIG. 34, the illumination device 100J of the present modification example differs from the illumination device 100 of the above embodiment in further including a second alignment film 60 and a second phosphor layer 70.

Specifically, the illumination device 100J of the present embodiment includes the light source 20 and a wavelength conversion element 10J. The wavelength conversion element 10J includes a first transmissive substrate 30 arranged to face the light source 20, a first alignment film 40 formed on the first primary surface of the first transmissive substrate 30, a first phosphor layer 50 formed on the first alignment film 40, a second alignment film 60 formed on the first phosphor layer 50, and a second phosphor layer 70 formed on the second alignment film 60. The wavelength conversion element 10J also includes an incident surface 10a where primary light emitted from the light source 20 enters and an emission surface 10b where illumination light that includes secondary light (described later) is emitted. The incident surface 10a is opposite to the emission surface 10b.

The first phosphor layer 50 include first phosphors 51, and the second phosphor layer 70 include second phosphors 71. The first phosphors 51 are uniaxially aligned by the first alignment film 40 in a direction parallel to the first primary surface in the first phosphor layer 50 (the X-axis direction in the drawing), and the second phosphors 71 are uniaxially aligned by the second alignment film 60 in a direction parallel to the first primary surface in the second phosphor layer 70.

The first phosphors 51 can be the green phosphors described above, and the second phosphors 71 can be the red phosphors described above. The second alignment film 60 can be a resin film made of polyvinyl alcohol, polyimide, or the like, for example. The second phosphor layer 70 can be formed by adding the second phosphors 71 to the birefringent anisotropic polymers, and the birefringent anisotropic polymers 54 can be liquid crystal polymers such as reactive mesogen, for example. The reactive mesogen can be UCL-017 manufactured by DIC Corporation, RMM 34C manufactured by Merck & Co., Inc., or the like, for example.

Next, a method of forming the second alignment film 60 and the second phosphor layer, which form a portion of the illumination device 100J, will be described. It should be noted that the method of forming the first alignment film 40 and the first phosphor layer 50 can be similar to the above embodiment.

In a state in which the first phosphor layer 50 is formed on the first alignment film 40, coating or printing is used to coat a polyimide film on the first phosphor layer 50 and a heat treatment is applied thereto, after which a rubbing treatment is performed in a direction parallel to the first primary surface (the X-axis direction in the drawing) to form the second alignment film 60. The rubbing treatment forms microgrooves in the second alignment film 60 surface along a direction parallel to the first primary surface (the X-axis direction in the drawing).

Then, coating or printing is used to coat, as the second phosphors 71, liquid crystal polymers that are red phosphors mixed with liquid crystal material (reactive mesogen) at a prescribed wt. ratio on the second alignment film 60. Thereafter, the liquid crystal polymers are treated with heat, ultraviolet radiation, or the like to align the liquid crystal polymers and form the second phosphor layer 70. At such time, the liquid crystal polymers are aligned by the alignment regulating force of the second alignment layer 60 along the extension direction of the microgrooves (the X-axis direction in the drawing). This aligns the red phosphors, which are the second phosphors 71, included in the liquid crystal polymers along the extension direction of the microgrooves (the X-axis direction in the drawing).

Next, the mixing of the primary light and the secondary light will be described. The blue primary light emitted from the light source 20 mainly exits towards the first transmissive substrate 30, passes through the first transmissive substrate 30 and first alignment film 40, and then reaches the first phosphor layer 50. Inside the first phosphor layer 50, the primary light that is incident on the first phosphors 51 aligned by the first alignment film 40 is absorbed by the first phosphors 51 and converted to green light, which is secondary light, and primarily emitted to the second alignment film 60 and the second phosphor layer 70, but the light that is not incident on the first phosphors 51 is not converted and instead passes through the first phosphor layer 50 as blue light, which is primary light.

Furthermore, inside the second phosphor layer 70, of the primary light that has passed through the first phosphor layer 50 and second alignment film 60 and reached the second phosphor layer 70, the light that is incident on the second phosphors 71 aligned by the second alignment film 60 is absorbed by the second phosphors 71 and converted to red light, which is secondary light, and primarily emitted to outside of the illumination device 100J, but the light that is not incident on the second phosphors 71 is not converted and instead passes through the second phosphor layer 70 to reach the outside as blue light, which is primary light.

In addition, inside the second phosphor layer 70, of the secondary light that is incident on the second phosphor layer 70, the light that is incident on the second phosphors 71 aligned by the second alignment film is absorbed by the second phosphors 71 and converted to red light, which is secondary light, and primarily emitted to outside of the illumination device 100J, but the light that is not incident on the second phosphors 71 is not converted and instead passes through the second phosphor layer 70 to reach the outside as green light, which is secondary light.

This causes the blue primary light emitted from the light source 20 and transmitted through the first phosphor layer 50 and second phosphor layer 70 to mix with: the green secondary light emitted from the first phosphors 51 and transmitted through the second phosphor layer 70; and the red secondary light emitted from the second phosphors 71, which results in white light being emitted to outside as the illumination light.

With the type of configuration described above, in the illumination device 100J of the present modification example, the first phosphors 51 are aligned by the first alignment film 40 and the second phosphors 71 are uniaxially aligned along a direction parallel to the primary surface by the second alignment film 60; therefore, the polarized light emitted from the phosphors can be efficiently scattered towards the emission surface, and the secondary light emitted from the first phosphors 51 and second phosphors 71 will have strong intensity and directionality along the emission direction (the Z-axis direction in the drawing). As a result, in the illumination device 100J of the present embodiment, the green secondary light emitted from the first phosphors 51 and the red secondary light emitted from the second phosphors 71 can be efficiently extracted, and thus the amount of illumination light that is a mixture of the primary light and secondary light will be increased, which will improve luminance.

Modification Example 11

Figure 35:
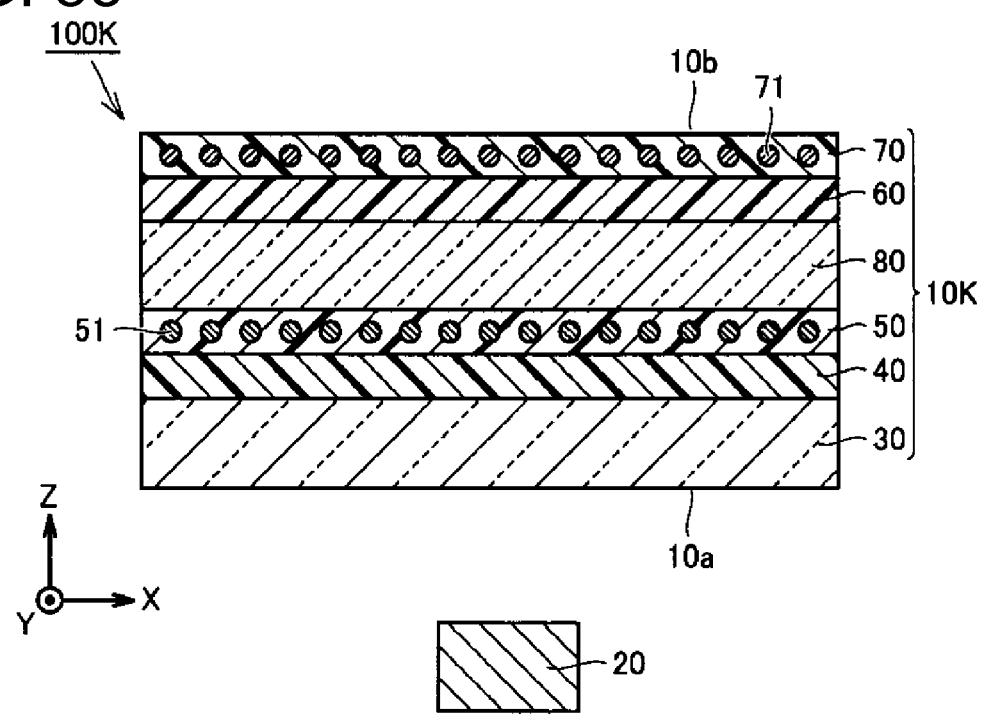
FIG. 35 is a schematic cross-sectional view of an illumination device according to Modification Example 11.

FIG. 35 is a schematic cross-sectional view of an illumination device according to Modification Example 11. An illumination device 100K of the present modification example will be described with reference to FIG. 35.

As shown in FIG. 35, the illumination device 100K of the present modification example differs from the illumination device 100J of Modification Example 10 in including a second transmissive substrate 80 between the first phosphor layer 50 and the second alignment film 60.

Specifically, the illumination device 100K of the present modification example includes the light source 20 and a wavelength conversion element 10K. The wavelength conversion element 10K includes a first transmissive substrate 30 arranged to face the light source 20, a first alignment film 40 formed on the first primary surface of the first transmissive substrate 30, a first phosphor layer 50 formed on the first alignment film 40 and including the first phosphors 51, a second transmissive substrate 80 coinciding in position with the first transmissive substrate 30, a second alignment film 60 formed on the first primary surface of the second transmissive substrate 80, and a second phosphor layer 70 formed on the second alignment film 60 and including the second phosphors 71. The wavelength conversion element 10K also includes an incident surface 10a where primary light emitted from the light source 20 enters and an emission surface 10b where illumination light that includes secondary light (described later) is emitted. The incident surface 10a is opposite to the emission surface 10b.

The second transmissive substrate 80 is disposed opposite to the light source 20 in the emission direction with respect to the first transmissive substrate 30 and is disposed to overlap the first transmissive substrate 30 such that the second transmissive substrate 80 is positioned on the first phosphor layer 50.

The second transmissive substrate 80 can be a glass substrate made of silica glass or the like, or a transmissive member such as a transparent film or transparent resin, for example.

It should be noted that the method of forming the second alignment film 60 and the second phosphor layer 70 can be similar to the above embodiment, whereby the second alignment film 60 is formed on the second transmissive substrate 80 and the second phosphor layer 70 is formed on the second alignment film 60.

With the type of configuration described above, in the illumination device 100K of the present modification example, the first phosphors 51 are uniaxially aligned in a direction parallel to the first primary surface by the first alignment film 40, and the second phosphors 71 are uniaxially aligned in a direction parallel to the first primary surface by the second alignment film 60. Thus, the polarized light emitted from the phosphors can be efficiently scattered towards the emission surface, which results in the secondary light emitted from the first phosphors 51 and the second phosphors 71 having strong emission intensity and directionality along the emission direction (the Z-axis direction in the drawing). As above, this results in the illumination device 100K of the present modification example being able to achieve effects similar to the illumination device 100J of Modification Example 10. In addition, by including the second transmissive substrate 80, film deposition becomes easier and differing manufacturing lines can be used to simultaneous form films on the first transmissive substrate 30 and the second transmissive substrate 80, which makes it possible to shorten manufacturing time.

In the present modification example, a scenario was described in which the second transmissive substrate 80 is disposed to overlap the first transmissive substrate 30 such that the second transmissive substrate 80 is positioned on the first phosphor layer 50, but the second transmissive substrate 80 may be disposed to overlap the first transmissive substrate 30 such that the second phosphor layer 70 is positioned on the first phosphor layer 50. In other words, the second transmissive substrate 80 may be disposed opposite to the light source 20 in the emission direction with respect to the first transmissive substrate 30 and may be disposed on the first transmissive substrate 30 such that the first phosphor layer 50 and second phosphor layer 70 are arranged next to each other in the stated order from the light source 20.

Modification Example 12

Figure 36:
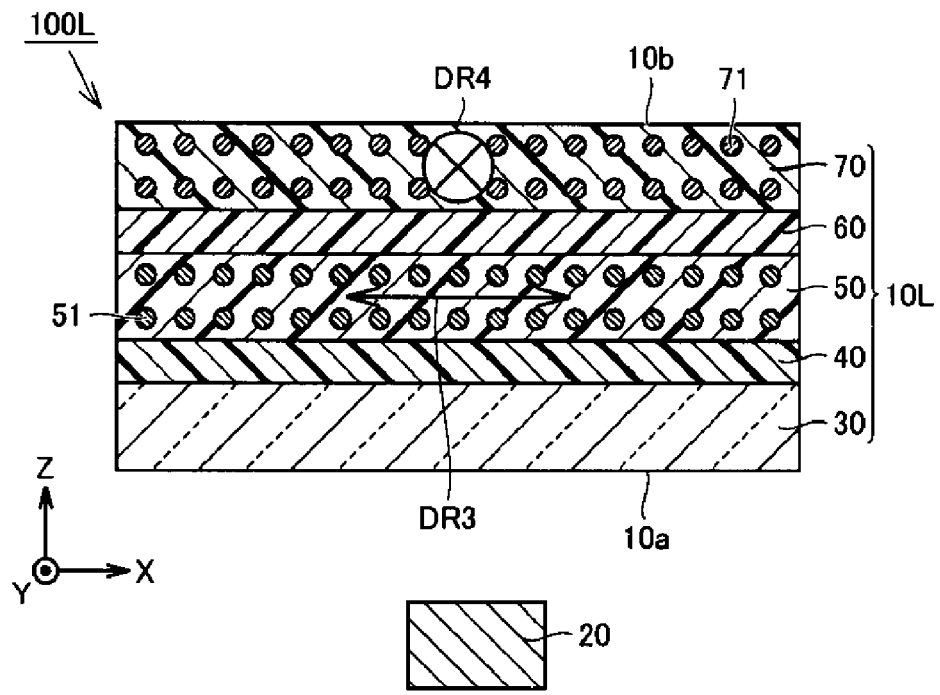
FIG. 36 is a schematic cross-sectional view of an illumination device according to Modification Example 12.

FIG. 36 is a schematic cross-sectional view of an illumination device according to Modification Example 12. An illumination device 100L of the present modification example will be described with reference to FIG. 36.

The illumination device 100L of the present modification example differs from the illumination device 100J of Modification Example 10 in the alignment direction of the first phosphors 51 and second phosphors 71 in a wavelength conversion element 10L. Specifically, in the present modification example, the alignment direction of the first phosphors 51 is perpendicular to the alignment direction of the second phosphors 71. More specifically, the first phosphors 51 are uniaxially aligned in the DR3 direction (X-axis direction), and the second phosphors 71 are uniaxially aligned in the DR4 direction (Y-axis direction). In other words, the transition dipole moment direction of the first phosphors 51 is parallel to the DR3 direction, and the transition dipole moment direction of the second phosphors 71 is parallel to the DR4 direction.

With this type of configuration as described above, in the illumination device 100L of the present modification example, the first phosphors 51 are uniaxially aligned in the DR3 direction by the first alignment film 40, and the second phosphors 71 are uniaxially aligned in the DR4 direction by the second alignment film 60; therefore, the polarized light emitted from the phosphors can be efficiently scattered towards the emission surface, which results in the secondary light emitted from the first phosphors 51 and the second phosphors 71 having strong emission intensity and directionality along the emission direction. As above, this results in the illumination device 100L of the present modification example being able to achieve effects similar to the illumination device 100J of Modification Example 10.

It should be noted that, with respect to the alignment direction of the first phosphors 51 and second phosphors 71, the rubbing direction can be modified as appropriate through adjustments, if a rubbing method is to be used.

When adjusting the rubbing direction (alignment direction) through this method, it is preferable that the angle of the alignment direction of the first phosphors 51 to the alignment direction of the second phosphors 71, i.e., the angle of the direction (DR3 direction) of the transition dipole moment of the first phosphors to the direction (DR4 direction) of the transition dipole moment of the second phosphors be 45° to 135°, and even more preferably 90°, for example.

Adjusting the angle between the direction (DR3 direction) of the transition dipole moment of the first phosphors and the direction (DR4 direction) of the transition dipole moment of the second phosphors to be 45°-135° makes it possible, even if the light source 20 emits unpolarized primary light, for both the first phosphors 51 and the second phosphors 71 to efficiently absorb the unpolarized primary light and emit polarized secondary light.

Furthermore, in Modification Example 10 to Modification Example 12 described above, an example was described in which the first phosphor layer 50 and the second phosphor layer 70 were arranged in this order from the light source 20 in the emission direction, but the present invention is not limited to this, and more different phosphor layers may be provided or three or more types of phosphor layers may be arranged in order from the light source 20 in the emission direct. In such a case, it is preferable the peak wavelengths of the secondary light emitted by the respective phosphors included in the plurality of phosphor layers differ from one another.

In Modification Example 4 to Modification Example 12, an example was described in which the first phosphors 51 were green phosphors that emit green light, the second phosphors 71 were red phosphors that emit right light, and the third phosphors 91, when provided, were blue phosphors that emit blue light, but the present invention is not limited to this, and the types of phosphors can be appropriately adjusted in consideration of the wavelengths of primary light emitted from the light source 20. Moreover, appropriately adjusting the emission intensity of the primary light and the emission intensity of the secondary light emitted from the respective phosphors makes it possible to obtain the desired color tone.

Hereinafter, in Modification Example 13, a case will be described in which phosphor layers have a plurality of phosphors with mutually differing peak wavelengths.

Modification Example 13

Figure 37:
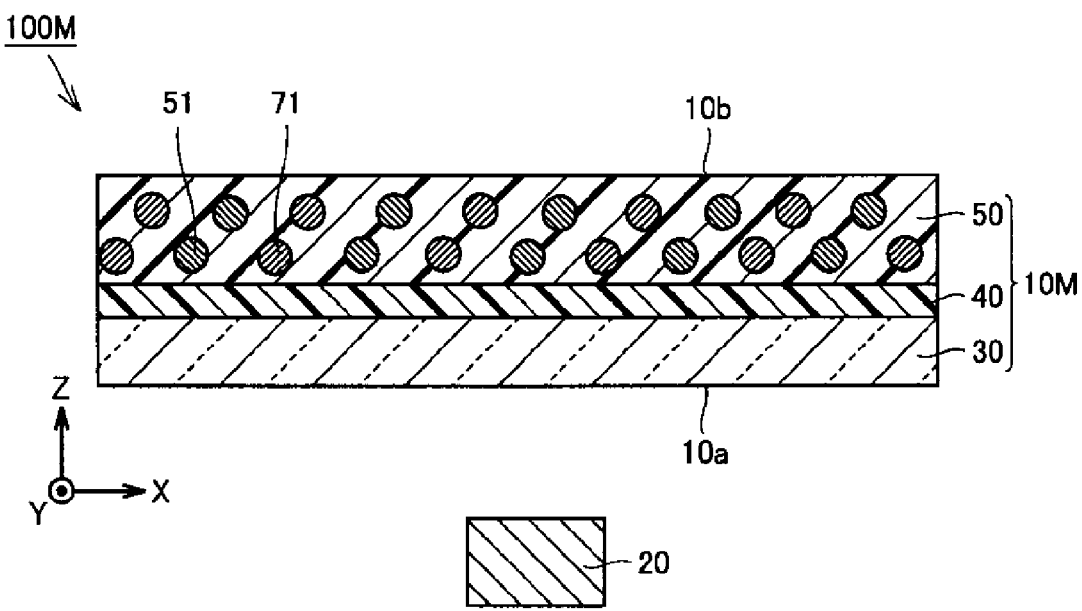
FIG. 37 is a schematic plan view of an illumination device according to Modification Example 13.

FIG. 37 is a schematic cross-sectional view of an illumination device according to Modification Example 13. An illumination device 100M of the present modification example will be described with reference to FIG. 37.

As shown in FIG. 37, the illumination device 100M of the present modification example differs from the illumination device 100 of the above embodiment in that the first phosphor layer 50 in a wavelength conversion element 10M includes both first phosphors 51 and second phosphors 71.

The first phosphors 51 and second phosphors 71 are uniaxially aligned in the first phosphor layer 50 by the first alignment film 40 along a direction parallel to the first primary surface (the X-axis direction in the drawing). The first phosphors 51 and the second phosphors 71 absorb a portion of the primary light emitted from the light source 20 and emit secondary light having a differing wavelength from the primary light. The peak wavelengths of the secondary light emitted by the first phosphors 51 differ from the peak wavelengths of the secondary light emitted from the second phosphors 71.

The first phosphors 51 can be the green phosphors described above, and the second phosphors 71 can be the red phosphors described above. The first phosphor layer 50 is formed by adding the first phosphors 51 and the second phosphors 71 to birefringent anisotropic polymers. The birefringent anisotropic polymers can be liquid crystal polymers such as reactive mesogen.

When forming this type of first phosphor layer 50, first, coating or printing is used to coat liquid crystal polymers that are the green first phosphors 51 and red second phosphors 71 mixed with liquid crystal material (reactive mesogen) at a prescribed wt. ratio on the first alignment film 40. Thereafter, the liquid crystal polymers are treated with heat, ultraviolet radiation, or the like to align the liquid crystal polymers and form the first phosphor layer 50. At such time, the liquid crystal polymers are aligned by the alignment regulating force of the first alignment film 40 along the extension direction of the microgrooves (the X-axis direction in the drawing). This aligns the first phosphors 51 and the second phosphors 71 included in the liquid crystal polymers along the extension direction of the microgrooves (the X-axis direction in the drawing).

With a configuration such as that described above, in the illumination device 100M of the present modification example, the first phosphors 51 and second phosphors 71 are uniaxially aligned in a direction parallel to the first primary surface on the first alignment film 40, and thus the polarized light emitted from the phosphors can be efficiently scattered towards the emission surface, which results in the secondary light emitted from the first phosphors 51 and the second phosphors 71 having strong emission intensity and directionality along the emission direction (the Z-axis direction in the drawing). As a result, in the illumination device 100M of the present modification example, the secondary light emitted from the first phosphors 51 and the second phosphors 71 can be efficiently extracted towards the outside (atmospheric layer) from the first phosphor layer 50; therefore, the amount of illumination light that is a mixture of the primary light and secondary light will be increased, which will improve luminance.

Hereinafter, in Modification Example 14 to Modification Example 18, an example will be described in which the light source emits ultraviolet light.

Modification Example 14

Figure 38:
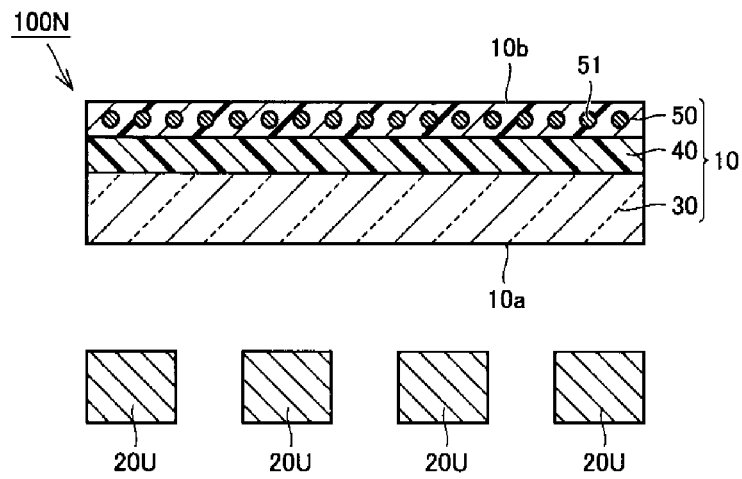
FIG. 38 is a schematic plan view of an illumination device according to Modification Example 14.

FIG. 38 is a schematic plan view of an illumination device according to Modification Example 14. An illumination device 100N of the present modification example will be described with reference to FIG. 38.

As shown in FIG. 38, the illumination device 100N of the present modification example differs from the illumination device 100 of the above embodiment in provision of a reflective sheet 21 and the configuration of the light source. Specifically, the illumination device 100N of the present modification example includes a plurality of light sources 20U arrayed in a plane with prescribed gaps therebetween and a reflective sheet 21 that reflects the primary light emitted from these light sources 20U to the wavelength conversion element 10.

The light sources 20U emit ultraviolet light. Thus, all of the light contributing to the color tone of illumination light emitted from the emission surface of the wavelength conversion element 10 is formed by secondary light emitted from the first phosphors 51. As a result, the alignment characteristics can be approximately uniform, which makes it possible to suppress the occurrence of color shifts in the viewing angles.

As above, in this type of configuration, the first alignment film 40 uniaxially aligns the first phosphors 51 in the direction parallel to the first primary surface; therefore, the polarized light emitted from the phosphors can be efficiently scattered towards the emission surface, and the secondary light emitted from the first phosphors 51 will have strong intensity and directionality along the emission direction (the Z-axis direction in the drawing). Accordingly, the illumination device 100N of the present modification example can achieve approximately similar effects to the illumination device 100 of the above embodiment.

Modification Example 15

Figure 39:
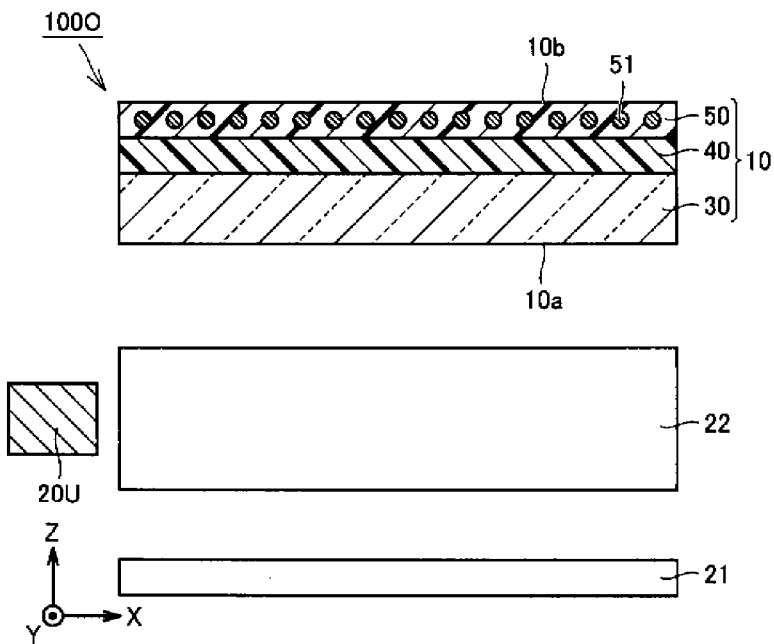
FIG. 39 is a schematic plan view of an illumination device according to Modification Example 15.

FIG. 39 is a schematic plan view of an illumination device according to Modification Example 15. An illumination device 100O of the present modification example will be described with reference to FIG. 39.

As shown in FIG. 39, the illumination device 100O of the present modification example differs from the illumination device 100 of the above embodiment in provision of a light reflective sheet 21, a light guide plate 22 as an optical member, and the configuration of a light source 20U. Specifically, the illumination device 100O of the present modification example includes a light guide plate 22 arranged facing the wavelength conversion element 10, and a reflective sheet 21 arranged opposite to the wavelength conversion element 10 with respect to the light source 20U disposed at the end face side of the light guide plate 22.

The light source 20U emits ultraviolet light as primary light towards an end face of the light guide plate 22. The light guide plate 22 emits the primary light from the light source 20U to the wavelength conversion element 10. The reflective sheet 21 reflects the primary light emitted from the light guide plate 22 to the reflective sheet 21 back towards the light guide plate 22.

The light sources 20U emit ultraviolet light. Thus, all of the light contributing to the color tone of illumination light emitted from the emission surface of the wavelength conversion element 10 is formed by secondary light emitted from the first phosphors 51. As a result, the alignment characteristics can be approximately uniform, which makes it possible to suppress the occurrence of color shifts in the viewing angles.

As above, in this type of configuration, the first alignment film 40 uniaxially aligns the first phosphors 51 in the direction parallel to the first primary surface; therefore, the polarized light emitted from the phosphors can be efficiently scattered towards the emission surface, and the secondary light emitted from the first phosphors 51 will have strong intensity and directionality along the emission direction (the Z-axis direction in the drawing). Accordingly, the illumination device 100O of the present modification example can achieve approximately similar effects to the illumination device 100 of the above embodiment.

Modification Example 16

Figure 40:
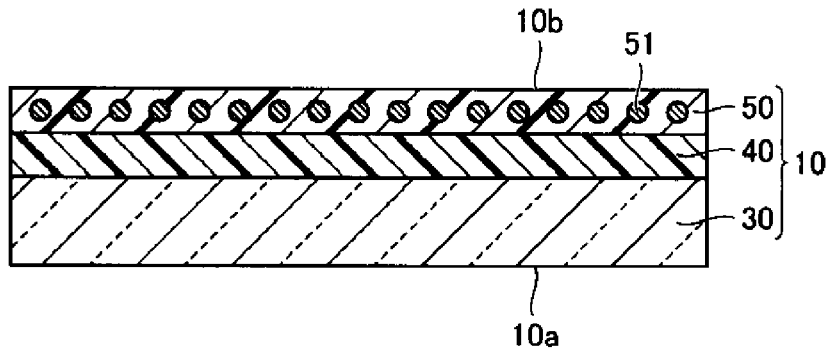
FIG. 40 is a schematic plan view of an illumination device according to Modification Example 16.
Figure 40:
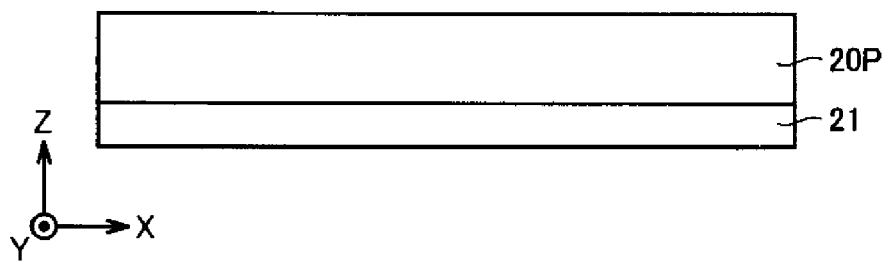

FIG. 40 is a schematic plan view of an illumination device according to Modification Example 16. An illumination device 100P of the present modification example will be described with reference to FIG. 40.

As shown in FIG. 40, the illumination device 100P of the present modification example differs from the illumination device 100 of the above embodiment in that a light source 20P is constituted by a surface-emitting light source and in provision of a reflective sheet 21 under the light source 20P.

The light source 20P is a surface-emitting light source that emits ultraviolet light and has a reflective sheet 21 on the rear surface side of the light source 20P opposite to the light-emitting surface side. This makes it possible to efficiently emit primary light from the light-emitting surface towards the wavelength conversion element 10.

The light source 20P emits ultraviolet light. Thus, all of the light contributing to the color tone of illumination light emitted from the emission surface of the wavelength conversion element 10 is formed by secondary light emitted from the first phosphors 51. As a result, the alignment characteristics can be approximately uniform, which makes it possible to suppress the occurrence of color shifts in the viewing angles.

As above, in this type of configuration, the first alignment film 40 uniaxially aligns the first phosphors 51 in the direction parallel to the first primary surface; therefore, the polarized light emitted from the phosphors can be efficiently scattered towards the emission surface, and the secondary light emitted from the first phosphors 51 will have strong intensity and directionality along the emission direction (the Z-axis direction in the drawing). Accordingly, the illumination device 100P of the present modification example can achieve approximately similar effects to the illumination device 100 of the above embodiment.

In Modification Example 14 to Modification Example 16, an optical member may further be provided such as a prism sheet or diffusion sheet that scatters primary light from the light source towards the wavelength conversion element. In Modification Examples 14 and 16, this optical member is provided in the illumination device 100N/100P between the light source 20U/light source 20P and the wavelength conversion element 10, and in Modification Example 15 the optical member is provided in the illumination device 100O between the light guide plate 22 and the wavelength conversion element 10. The above-mentioned optical member may also be disposed above the wavelength conversion element 10 in Modification Example 14 to Modification Example 16.

Furthermore, in Modification Example 14 to Modification Example 16, an example was described in which the light source emitted ultraviolet light as primary light, but the present invention is not limited to this, and the primary source may emit visible light as primary light. In such a case, the type of first phosphors may be selected as appropriate in accordance with the wavelengths of primary light emitted from the light source. As above, in this type of configuration, the above-mentioned optical member can be placed in a similar manner as above.

Modification Example 17

Figure 41:
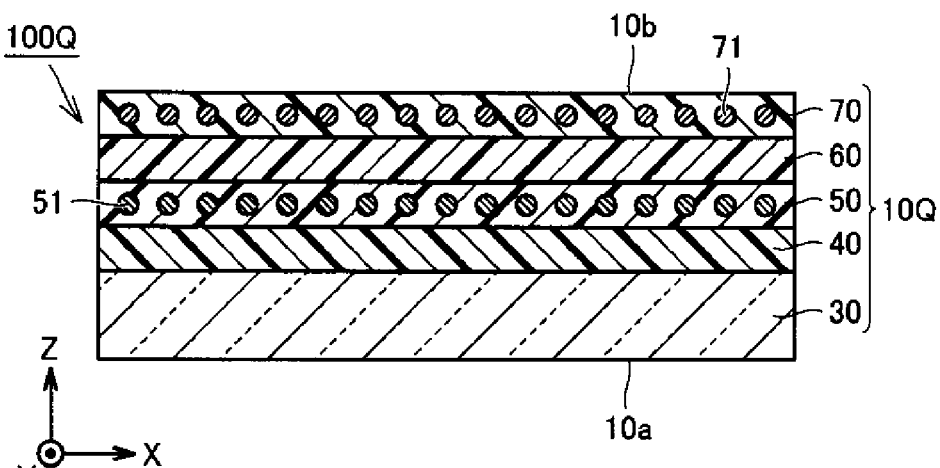
FIG. 41 is a schematic cross-sectional view of an illumination device according to Modification Example 17.
Figure 41:
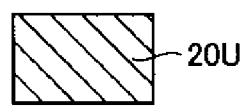

FIG. 41 is a schematic cross-sectional view of an illumination device according to Modification Example 17. An illumination device 100Q of the present modification example will be described with reference to FIG. 41.

As shown in FIG. 41, the illumination device 100Q of the present modification example differs from the illumination device 100 of the above embodiment in that a wavelength conversion element 10Q further includes a second alignment film 60 and a second phosphor layer 70, but is otherwise an approximately similar configuration to the illumination device 100J of Modification Example 10.

The light source 20U emits ultraviolet light. Furthermore, the first phosphors 51 can be the above-mentioned yellow phosphors. The second phosphors can be blue phosphors that absorb ultraviolet light and emit blue light as secondary light, for example. The wavelength range of the blue light emitted by the blue phosphors is 390 nm to 510 nm. The peak wavelength at which the emission intensity for blue light is greatest is approximately 450 nm. Specifically, the blue phosphors can be organic phosphors such as a bis-(triazinylamino)-stilbene disulfonic acid derivative, BBOT, or the like.

As above, in this type of configuration, the light source 20U is a light source that emits ultraviolet light; thus, all of the light that contributes to the color tone of the illumination light emitted from the emission surface of the wavelength conversion element 10Q is constituted by the secondary light emitted by the first phosphors 51 and second phosphors 71.

The primary ultraviolet light emitted from the light source 20 mainly exits towards the first transmissive substrate 30, passes through the first transmissive substrate 30 and first alignment film 40, and then reaches the first phosphor layer 50. Inside the first phosphor layer 50, the primary light that is incident on the first phosphors 51 aligned by the first alignment film 40 is absorbed by the first phosphors 51 and converted to yellow light, which is secondary light, and primarily emitted to the second alignment film 60 and the second phosphor layer 70, but the light that is not incident on the first phosphors 51 is not converted and instead passes through the first phosphor layer 50 as ultraviolet light, which is primary light.

Furthermore, inside the second phosphor layer 70, of the primary light that has passed through the first phosphor layer 50 and second alignment film 60 and reached the second phosphor layer 70, the light that is incident on the second phosphors 71 aligned by the second alignment film 60 is absorbed by the second phosphors 71 and converted to blue light, which is secondary light, and primarily emitted to outside of the illumination device 100J, but the light that is not incident on the second phosphors 71 is not converted and instead passes through the second phosphor layer 70 to reach the outside as ultraviolet light, which is primary light.

Furthermore, inside the second phosphor layer 70, the secondary light (yellow light) emitted from the first phosphors incident on the second phosphor layer 70 is not absorbed by the second phosphors 71, which have high excitation energy, but is rather transmitted through the second phosphor layer 70 to outside.

This mixes the yellow secondary light emitted from the first phosphors 51 and transmitted through the second phosphor layer 70 with the blue secondary light emitted from the second phosphors 71, which allows white light to be emitted to outside as illumination light.

As above, with the type of configuration described above, the first phosphors 51 are uniaxially aligned by the first alignment film 40 and the second phosphors 71 are uniaxially aligned by the second alignment film 60; therefore, the polarized light emitted from the phosphors can be efficiently scattered towards the emission surface, and the secondary light emitted from the first phosphors 51 and second phosphors 71 will have strong intensity and directionality along the emission direction (the Z-axis direction in the drawing). Accordingly, as above, the illumination device 100Q of the present modification example can achieve approximately similar effects to the illumination device 100 of the above embodiment.

Modification Example 18

Figure 42:
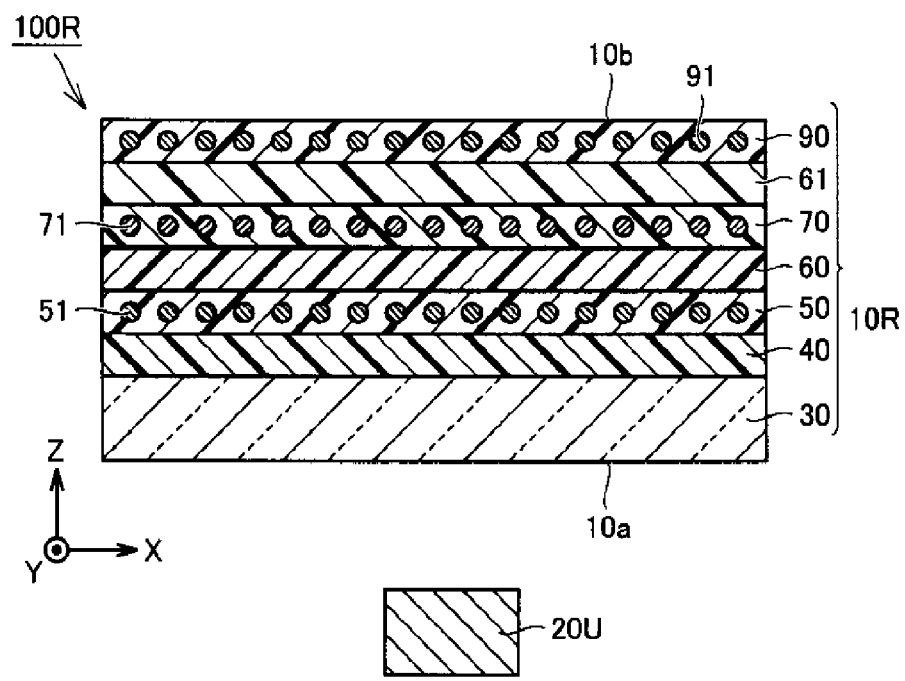
FIG. 42 is a schematic cross-sectional view of an illumination device according to Modification Example 18.

FIG. 42 is a schematic cross-sectional view of an illumination device according to Modification Example 18. An illumination device 100R of the present modification example will be described with reference to FIG. 42.

As shown in FIG. 42, the illumination device 100R of the present modification example differs from the illumination device 100Q of Modification Example 17 in having a third alignment film 61 formed on the second phosphor layer 70 in a wavelength conversion element 10R and in forming a third phosphor layer 90 on this third alignment film 61. The other configurations are approximately similar to the illumination device 100Q.

The third phosphor layer 90 includes third phosphors 91. The third phosphors 91 are uniaxially aligned along the X-axis direction in the third phosphor layer by the third alignment film, in a similar manner to the first phosphors 51 and second phosphors 71.

In this example, the light source 20U emits ultraviolet light. Furthermore, the first phosphors 51 can be the above-mentioned red phosphors. The second phosphors 71 can be the above-mentioned green phosphors. The third phosphors 91 can be the above-mentioned blue phosphors.

As above, in this type of configuration, the light source 20U emits ultraviolet light; thus, all of the light that contributes to the color tone of the illumination light emitted from the emission surface of the wavelength conversion element 10R is constituted by the secondary light emitted by the first phosphors 51, second phosphors 71, and third phosphors 91.

Specifically, the ultraviolet primary light emitted from the light source 20U mainly exits towards the first transmissive substrate 30, passes through the first transmissive substrate 30 and first alignment film 40, and then reaches the first phosphor layer 50.

The light that reaches the first phosphor layer 50 but is not incident on the first phosphors 51 is not converted and passes through the first phosphor layer 50 while remaining as ultraviolet primary light. Meanwhile, the primary light that reaches the first phosphor layer and is incident on the first phosphors 51, which are aligned by the first alignment film 40, is absorbed by the first phosphors 51 and converted into red light, which is secondary light, and is not absorbed by the second phosphors and third phosphors, which have high excitation energy, thereby mainly reaching the outside of the illumination device 100R after being transmitted through the second phosphor layer 70 and third phosphor layer 90.

Furthermore, the primary light that passes through the first phosphor layer 50 and second alignment film 60 to reach the second phosphor layer 70 but is not incident on the second phosphors 71 is not converted and instead passes through the second phosphor layer 70 and third alignment film 61 to reach the third phosphor layer 90 as ultraviolet light. The primary light that reaches the second phosphor layer 70 and is incident on the second phosphors 71, which are aligned by the second alignment film 60, is absorbed by the second phosphors 71 and converted into green light, which is secondary light, but not absorbed by the third phosphors 91, which have high excitation energy, and thus pass through the third phosphor layer 90 mainly to the outside of the illumination device 100R.

In addition, the primary light that passes through the first phosphor layer 50, second alignment film 60, second phosphor layer 70, and third alignment film 61 to reach the third phosphor layer 90 but is not incident on the third phosphors 91 is not converted and thus passes through the third phosphor layer 90 to outside while remaining as ultraviolet primary light. Meanwhile, the primary light that reaches the third phosphor layer 90 and is incident on the third phosphors 91, which are aligned by the third alignment film 61, is absorbed by the third phosphors 91 and converted to blue light, which is secondary light, and mainly emitted to outside the illumination device 100R.

This mixes the red secondary light emitted from the first phosphors 51 with the green secondary light emitted from the second phosphors 71 and the blue secondary light emitted from the third phosphors 91, which allows white light to be emitted to outside as illumination light.

As above, with the type of configuration described above, the first phosphors 51 are uniaxially aligned by the first alignment film 40, the second phosphors 71 are uniaxially aligned by the second alignment film 60, and the third phosphors 91 are uniaxially aligned by the third alignment film 61; therefore, the polarized light emitted from the phosphors can be efficiently scattered towards the emission surface, and the secondary light emitted from the first phosphors 51, second phosphors 71, and third phosphors 91 will have strong intensity and directionality along the emission direction (the Z-axis direction in the drawing). Accordingly, as above, the illumination device 100R of the present modification example can achieve effects that are approximately similar to the illumination device 100Q of Modification Example 17.

Furthermore, in Modification Example 14 to Modification Example 18, it is preferable to provide an ultraviolet light absorption member that absorbs ultraviolet light on the emission surface of the wavelength conversion elements 10, 10Q, and 10R and that transmits visible light, or a dielectric film that reflects ultraviolet light and transmits visible light. The ultraviolet light absorption member can be a ZnO thin film, for example, and the dielectric film can be an $SiO_2$ thin film, a TiO thin film, or the like, for example, all of which can be formed by sputtering. Instead of providing the ultraviolet light absorption member or the dielectric film, the density of the phosphors included in the phosphor layers such as the first phosphors, second phosphors, and third phosphors may be adjusted to reduce the primary ultraviolet light emitted from the emission surface.

Modification Example 19

Figure 43:
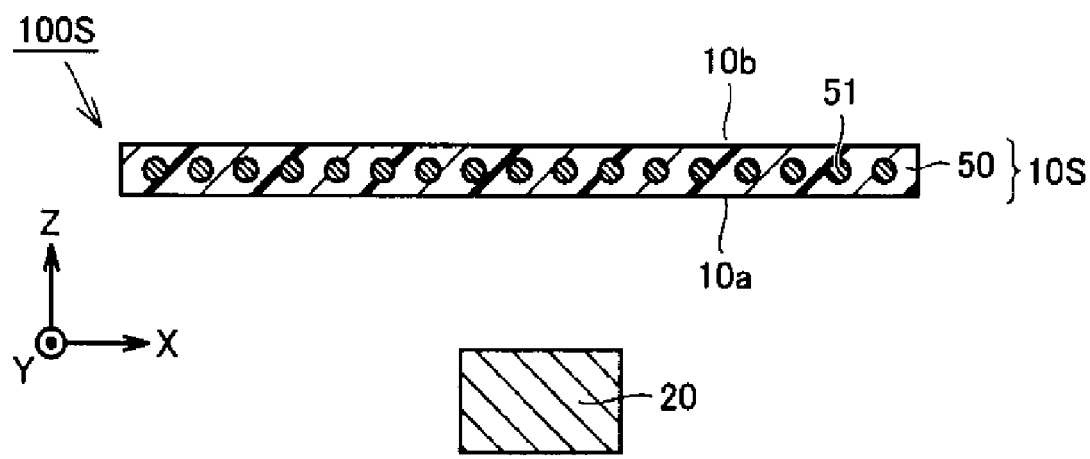
FIG. 43 is a schematic cross-sectional view of an illumination device according to Modification Example 19.
Figure 44:
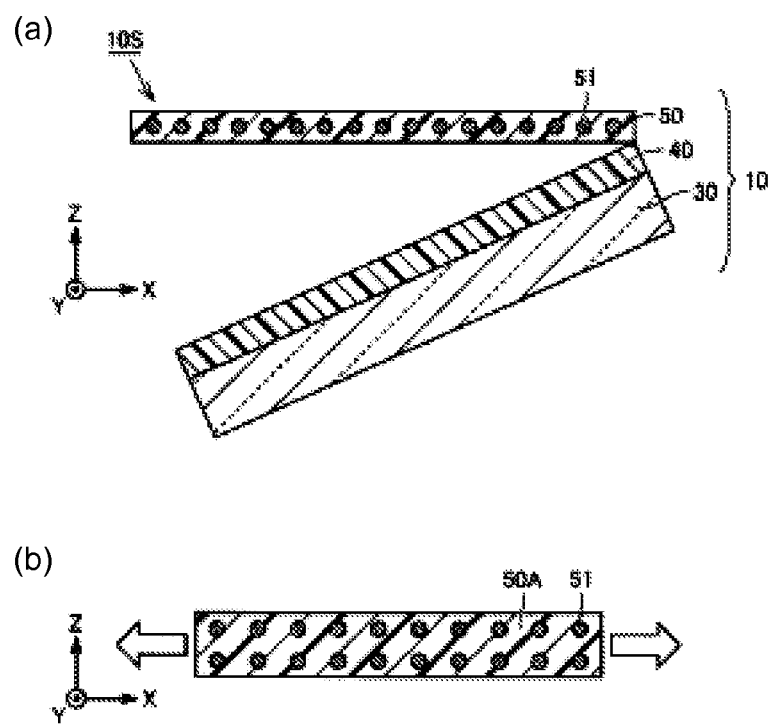
FIG. 44 is a view of a first manufacturing method and a second manufacturing method to manufacture the wavelength conversion element shown in FIG. 43.

FIG. 43 is a schematic cross-sectional view of an illumination device according to Modification Example 19. FIG. 44 is a view of a first manufacturing method and a second manufacturing method to manufacture the wavelength conversion element shown in FIG. 43. An illumination device 100S of the present modification example will be described with reference to FIG. 43 and FIG. 44.

As shown in FIG. 43, the illumination device 100S of the present modification example differs from the illumination device 100 of the above embodiment in the configuration of a wavelength conversion element 10S. Specifically, the wavelength conversion element 10S is constituted by a single first phosphor layer 50. The wavelength conversion element 10S also includes an incident surface 10a where primary light emitted from the light source 20 enters and an emission surface 10b where illumination light that includes secondary light (described later) is emitted. The incident surface 10a is opposite to the emission surface 10b.

The first phosphor layer 50 includes first phosphors 51. The first phosphors 51 are uniaxially aligned along the X-axis direction in the first phosphor layer 50. This type of single first phosphor layer 50 can be manufactured by the method of manufactured described below.

FIG. 44(*a*) is the first method of manufacturing the wavelength conversion element 10S. As shown in FIG. 44(*a*), in the first method of manufacturing the wavelength conversion element 10S, only the first phosphor layer 50 is removed from the wavelength conversion element 10 of the embodiment. When aligning the first phosphors through a rubbing method, it is preferable that the thickness of the first alignment film be 0.1 µm to 50 µm.

Preparing a solvent in which the first phosphor layer 50 will not dissolve but that can dissolve the first alignment film 40 and then submerging the wavelength conversion element 10 in this solvent can extract just the first phosphor layer 50. For example, because polyvinyl alcohol is water-soluble, when the first alignment film 40 is polyvinyl alcohol, submerging the wavelength conversion element 10 for a prescribed period of time in water can dissolve the first alignment film 40. This results in the first phosphor layer 50 separating from the first alignment film 40.

FIG. 44(*b*) is the second method of manufacturing the wavelength conversion element 10S. As shown in FIG. 44(*b*), in the second method of manufacturing the wavelength conversion element 10S, a liquid crystal polymer film 50A is submerged into a phosphor solution including prescribed first phosphors 51, and thereafter the liquid crystal polymer film is stretched in a prescribed solution after submersion. This makes it possible to manufacture a single first phosphor layer 50 in which the first phosphors are uniaxially aligned in a prescribed direction. It should be noted that, even if polyvinyl alcohol is used, the first phosphors 51 can be uniaxially aligned. When aligning the first phosphors through a stretching method, it is preferable that the thickness of the first phosphor layer be 0.1 µm to 2000 µm.

During the process, it is preferable that the liquid crystal polymer film be submerged in the phosphor solution for approximately one minute and that the post-submerged liquid crystal polymer film be stretched in pure water at 40°. The draw ratio of the film is preferable approximately 3×.

Figure 45:
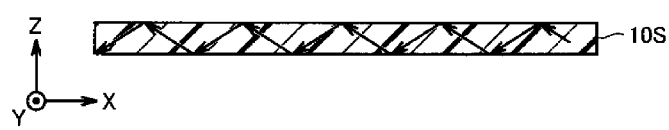
FIG. 45 is a view of secondary light being propagated inside the wavelength conversion element shown in FIG. 43.

FIG. 45 is a view of secondary light being propagated inside the wavelength conversion element shown in FIG. 43. FIG. 45 will be used to explain the propagation of secondary light inside the wavelength conversion element 10S (first phosphor layer 50) of the present modification example.

As shown in FIG. 45, the secondary light that is incident on the emission surface at an angle that is greater than the critical angle is reflected at the emission surface back towards the bottom surface that is opposite to the emission surface. The secondary light reflected towards the bottom surface is reflected at the bottom surface back towards the emission surface. In this manner, the secondary light emitted from the first phosphors 51 is repeatedly reflected at the emission surface and the bottom surface and thereby propagated inside the wavelength conversion element 10S.

Meanwhile, if there is a first transmissive substrate in a layer below the first phosphor layer, the secondary light that is reflected at the emission surface back towards the bottom surface enters the first transmissive substrate. The secondary light that has entered the first transmissive substrate is reflected at the bottom surface of the first transmissive substrate back towards the first phosphor layer. The secondary light reflected back towards the first phosphor layer enters the first phosphor layer again and progresses towards the emission surface. In this manner, the secondary light emitted from the first phosphors is repeatedly reflected at the emission surface of the first phosphor layer and the bottom surface of the first transmissive substrate and thereby propagated inside the wavelength conversion element.

Thus, when secondary light is propagated only inside the a single first phosphor layer 50, as in the present modification example, the range of movement of the secondary light inside the phosphor layer becomes greater, which makes it easier to scatter the secondary light with polymer molecules inside the phosphor layer. As a result, this improves extraction efficiency of the secondary light even with a small light-emitting area.

Furthermore, as above, in the present modification example, the first phosphors 51 are uniaxially aligned, and thus the polarized light emitted from the phosphors can be efficiently scattered towards the emission surface, which results in the secondary light emitted from the first phosphors 51 having strong emission intensity and directionality along the emission direction (the Z-axis direction in the drawing). Accordingly, as above, the illumination device 100S of the present modification example can achieve approximately similar effects to the illumination device 100 of the above embodiment.

Hereinafter, in Modification Example 20, an example will be described in which the wavelength conversion element is used as a light guide plate that scatters the primary light received from the light source and extracts the illumination light in a direction that is different from the incident primary light.

Modification Example 20

Figure 46:
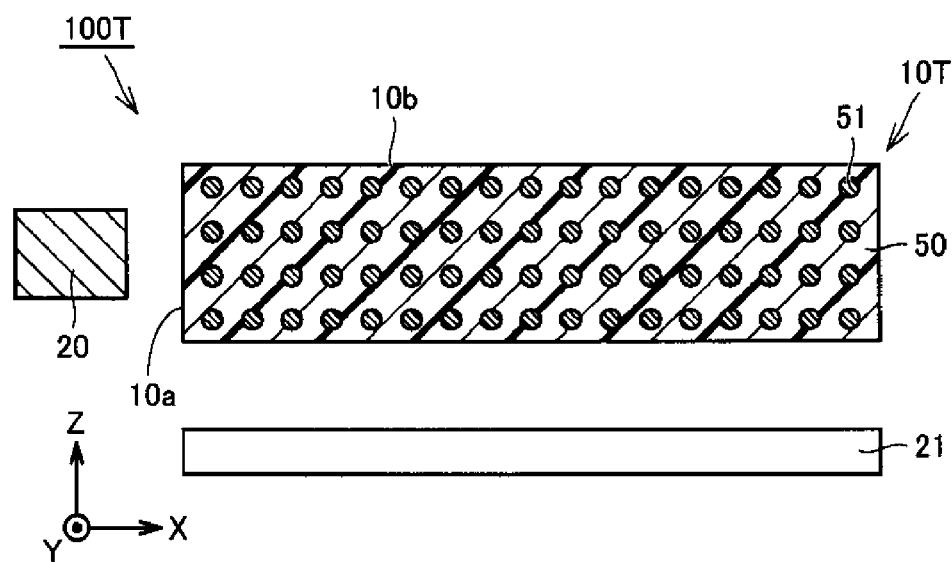
FIG. 46 is a schematic cross-sectional view of an illumination device according to Modification Example 20.

FIG. 46 is a schematic cross-sectional view of an illumination device according to Modification Example 20. An illumination device 100T of the present modification example will be described with reference to FIG. 46.

The illumination device 100T of the present modification example differs from the illumination device 100 of the above embodiment in that a wavelength conversion element 10T is used as a light guide plate. Specifically, the illumination device 100T of the present modification example includes the wavelength conversion element 10T as a light guide plate, a light source 20 arranged facing on an end face side of the wavelength conversion element 10T, and a reflective sheet 21 arranged facing the wavelength conversion element 10T. The wavelength conversion element 10T also includes an incident surface 10a where primary light emitted from the light source 20 enters and an emission surface 10b where illumination light that includes secondary light (described later) is emitted. The incident surface 10a is opposite to the emission surface 10b.

The wavelength conversion element 10T is constituted by a first phosphor layer 50 that includes first phosphors 51 uniaxially aligned in a prescribed direction. Furthermore, the wavelength conversion element 10T is formed into a prescribed shape so as to be able to scatter primary light received from the light source and extract illumination light in a direction that differs from the incident primary light.

With this type of configuration, it is possible to extract, from the wavelength conversion element 10S acting as the light guide plate, light that has a polarization component parallel to the alignment direction of the first phosphors 51. Therefore, using the illumination device 100T in a display device such as a liquid crystal display device makes it possible to emit polarized light and improve the light usage efficiency of a display device that has polarized light characteristics, such as a liquid crystal display panel. Furthermore, optical sheets such as a diffusion sheet can be omitted and the display device can be made thinner.

Modification Example 21

Figure 47:
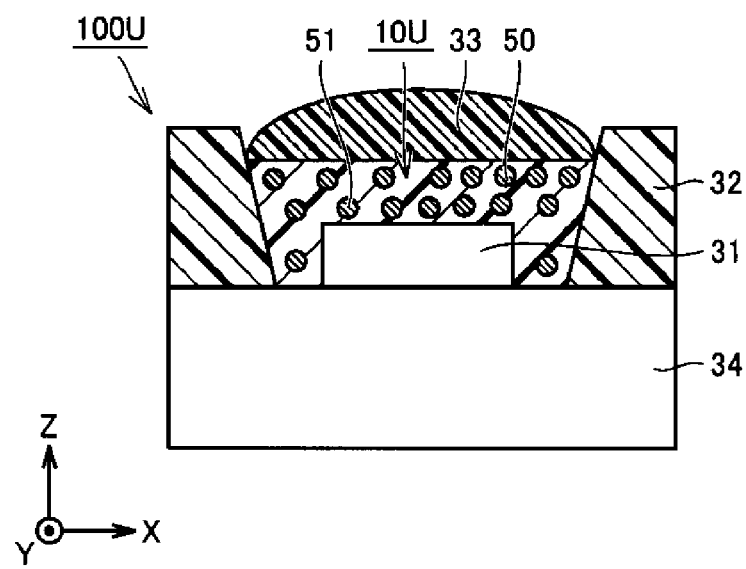
FIG. 47 is a schematic cross-sectional view of an illumination device according to Modification Example 21.

FIG. 47 is a schematic cross-sectional view of an illumination device according to Modification Example 21. An illumination device 100U of the present modification example will be described with reference to FIG. 47.

The illumination device 100U of the present modification example differs from the illumination device 100 of the above embodiment in that a light source is constituted by a light-emitting element and a wavelength conversion element 10U is used as a portion of a light-emitting device.

The illumination device 100U of the present modification example includes a light-emitting element 31 connected to a prescribed electrode, a substantially cylindrical frame 32 disposed on a substrate 34 so as to surround the light-emitting element 31, a wavelength conversion element 10U disposed so as to fill the inside of the frame 32, and a sealing resin 33 that seals the wavelength conversion element 10U inside the frame 32.

The wavelength conversion element 10U is constituted by a first phosphor layer 50 that includes first phosphors 51 uniaxially aligned in a prescribed direction. The wavelength conversion element 10U is formed into a prescribed shape by being filled in the frame 32.

With this type of configuration, it is possible to extract, from the wavelength conversion element 10U acting as the light guide plate, light that has a polarization component parallel to the alignment direction of the first phosphors 51. Therefore, using the illumination device 100U in a display device such as a liquid crystal display device makes it possible to emit polarized light and improve the light usage efficiency of a display device that has polarized light characteristics, such as a liquid crystal display panel.

Hereinafter, in Modification Example 22 to Modification Example 33, an example will be described in which a wavelength conversion element includes a transmissive substrate having formed thereon a color adjustment layer that performs color adjustment of at least primary light.

Modification Example 22

Figure 48:
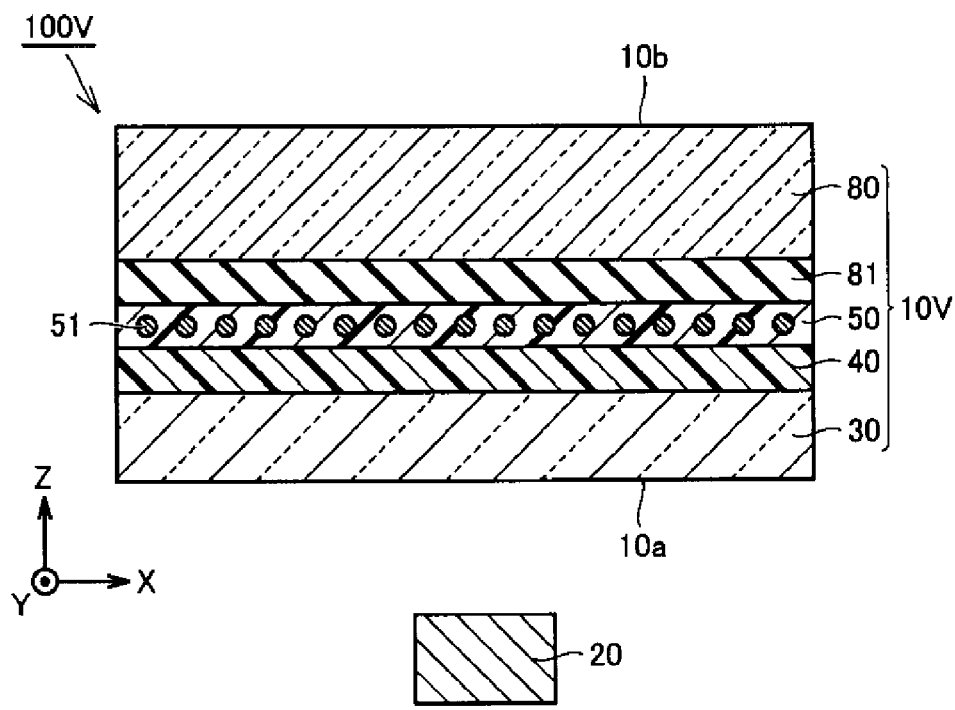
FIG. 48 is a schematic cross-sectional view of an illumination device according to Modification Example 22.

FIG. 48 is a schematic cross-sectional view of an illumination device according to Modification Example 22. An illumination device 100V of the present modification example will be described with reference to FIG. 48.

As shown in FIG. 48, the illumination device 100V of the present modification example differs from the illumination device 100 of the above embodiment in the configuration of a wavelength conversion element 10V. The wavelength conversion element 10V further includes a first color adjustment layer 81 formed on a second transmissive substrate 80, and this first color adjustment layer adjusts the color of primary light and secondary light. The first color adjustment layer 81 is arranged to be after the first phosphor layer 50 from the light source 20 side in the emission direction.

Specifically, in the illumination device 100V of the present modification example, the second transmissive substrate 80 is arranged on the side opposite to the light source 20 with respect to the first transmissive substrate 30 in the emission direction (the Z-axis direction in the drawing), and the first color adjustment layer 81 formed on the first primary surface of the second transmissive substrate 80 is disposed to overlap the first transmissive substrate 30 so as to be positioned on the first phosphor layer 50.

The first phosphors 51 can be the above-mentioned green phosphors. The first color adjustment layer 81 can be a cyan color filter, for example. Furthermore, the cyan color filter is formed on the first primary surface of the second transmissive through 80 via an already-known method.

In this type of configuration, the blue primary light emitted from the light source 20 mainly exits towards the first transmissive substrate 30, passes through the first transmissive substrate 30 and first alignment film 40, and then reaches the first phosphor layer 50. Inside the first phosphor layer 50, the primary light that is incident on the first phosphors 51, which are aligned by the first alignment film 40, is absorbed by these first phosphors 51 and converted to green light as secondary light and then mainly emitted to the first color adjustment layer 81. The light that does is not incident on the first phosphors 51 is not converted and passes through the first phosphor layer 50 still as blue primary light.

The primary light (blue light) that has passed through the first phosphor layer 50 mixes with the secondary light (green light) emitted from the first phosphors 51 towards the first color adjustment layer 81 to form a color that is approximately cyan. This approximately cyan light passes through the first color adjustment layer 81 and the second transmissive substrate 80 in this order and is emitted to outside. When the approximately cyan light passes through the first color adjustment layer 81, the first color adjustment layer 81 only transmits specific wavelengths, thereby performing fine color adjustment.

With a configuration such as that described above, in the illumination device 100V of the present modification example, the first phosphors 51 are uniaxially aligned in a direction parallel to the first primary surface of the first transmissive substrate 30 by the first alignment film 40, and thus the polarized light emitted from the phosphors can be efficiently scattered towards the emission surface. Therefore, the secondary light emitted from the first phosphors 51 has directionality in which emission intensity is high along the emission direction (Z-axis direction in the drawing). As a result, in the illumination device 100V of the present modification example, in a similar manner to the illumination device 100 of the above embodiment, the extraction efficiency of secondary light emitted from the first phosphors 51 can be improved, and the amount of illumination light as a mixture of the primary and secondary light can be improved, which allows luminance to be improved. In addition, in the illumination device 100V of the present modification example, the first color adjustment layer 81 is provided, which makes it possible to obtain a desired color tone with ease.

Modification Example 23

Figure 49:
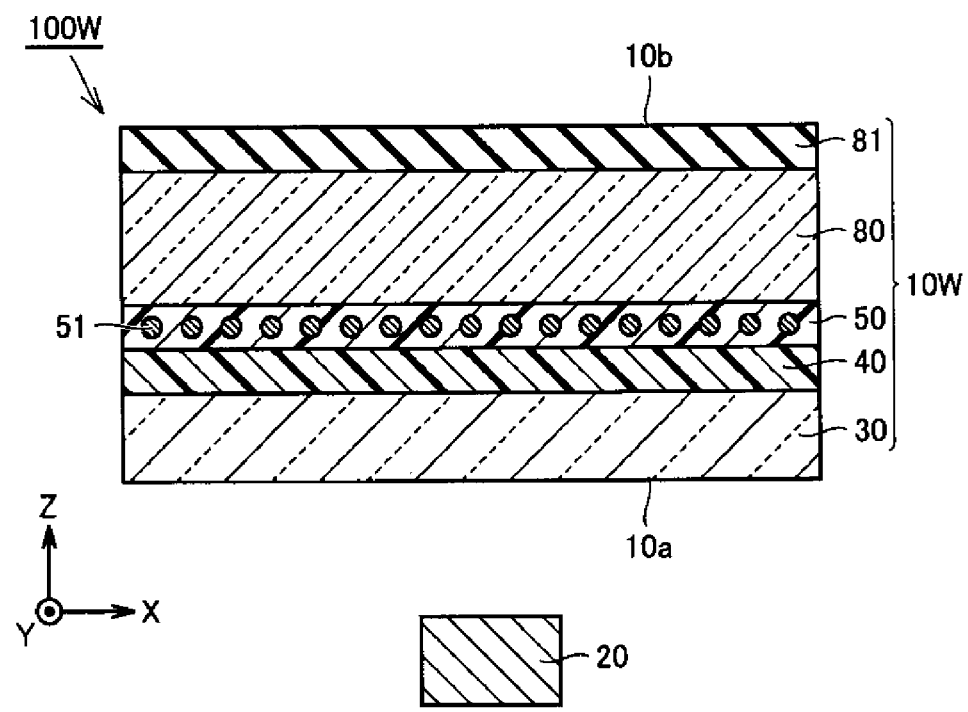
FIG. 49 is a schematic cross-sectional view of an illumination device according to Modification Example 23.

FIG. 49 is a schematic cross-sectional view of an illumination device according to Modification Example 23. An illumination device 100W of the present modification example will be described with reference to FIG. 49.

As shown in FIG. 49, the illumination device 100W of the present modification example differs from the illumination device 100V of Modification Example 22 in the configuration of a wavelength conversion element 10W. Specifically, in the wavelength conversion element 10W, the second transmissive substrate 80 is disposed to overlap the first transmissive substrate 30 such that the second transmissive substrate 80 is positioned on the first phosphor layer 50.

As above, in this type of configuration, the first alignment film 40 uniaxially aligns the first phosphors 51 in the direction parallel to the first primary surface of the first transmissive substrate 30; therefore, the polarized light emitted from the phosphors can be efficiently scattered towards the emission surface, and the secondary light emitted from the first phosphors 51 will have strong intensity and directionality along the emission direction (the Z-axis direction in the drawing). Furthermore, the light that is a mixture of the primary light and secondary light will pass through the first color adjustment layer 81. Accordingly, as above, the illumination device 100W of the present modification example can achieve effects that are approximately similar to the illumination device 100V of Modification Example 22.

Modification Example 24

Figure 50:
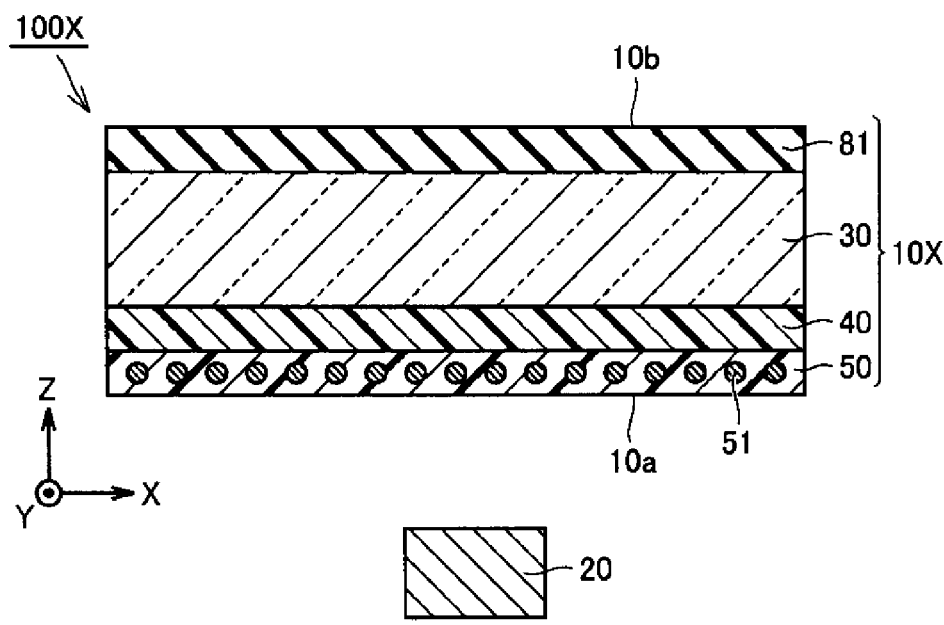
FIG. 50 is a schematic cross-sectional view of an illumination device according to Modification Example 24.

FIG. 50 is a schematic cross-sectional view of an illumination device according to Modification Example 24. An illumination device 100X of the present modification example will be described with reference to FIG. 50.

As shown in FIG. 50, the illumination device 100X of the present modification example differs from the illumination device 100V of Modification Example 22 in the configuration of a wavelength conversion element 10X. The wavelength conversion element 10X does not have the second transmissive substrate 80, and the first color adjustment layer 81 is formed on a second primary surface of the first transmissive substrate 30 that is positioned opposite to the first primary surface. It should be noted that the first color adjustment layer 81 is formed on the second primary surface of the first transmissive substrate 30 via an already-known method.

More specifically, the illumination device 100X of the present modification example includes the light source 20 and the wavelength conversion element 10X. The wavelength conversion element 10X includes the first transmissive substrate 30 arranged to face the light source 20, the first alignment film 40 formed on the first primary surface of the first transmissive substrate 30, the first phosphor layer 50 that includes first phosphors 51 and is formed on the first alignment film 40, and the first color adjustment layer 81 formed on the second primary surface of the first transmissive substrate 30. The first transmissive substrate 30 is disposed such that the first phosphor layer faces the light source 20.

It should be noted that the first color adjustment layer may be formed on the second primary surface side of the first transmissive substrate 30 after the first alignment film 40 and first transmissive layer 50 have been formed on the first primary surface side of the first transmissive substrate 30, or may be formed on the second primary surface of the first transmissive substrate 30 before the first alignment film 40 and first phosphor layer 50 are formed on the first primary surface of the first transmissive substrate 30.

As above, in this type of configuration, the first alignment film 40 uniaxially aligns the first phosphors 51 in the direction parallel to the first primary surface of the first transmissive substrate 30; therefore, the polarized light emitted from the phosphors can be efficiently scattered towards the emission surface. Therefore, the secondary light emitted from the first phosphors 51 has directionality in which emission intensity is high along the emission direction (Z-axis direction in the drawing). Furthermore, the light that is a mixture of the primary light and secondary light will pass through the first color adjustment layer 81. Accordingly, as above, the illumination device 100X of the present modification example can achieve effects that are approximately similar to the illumination device 100V of Modification Example 22.

Modification Example 25

Figure 51:
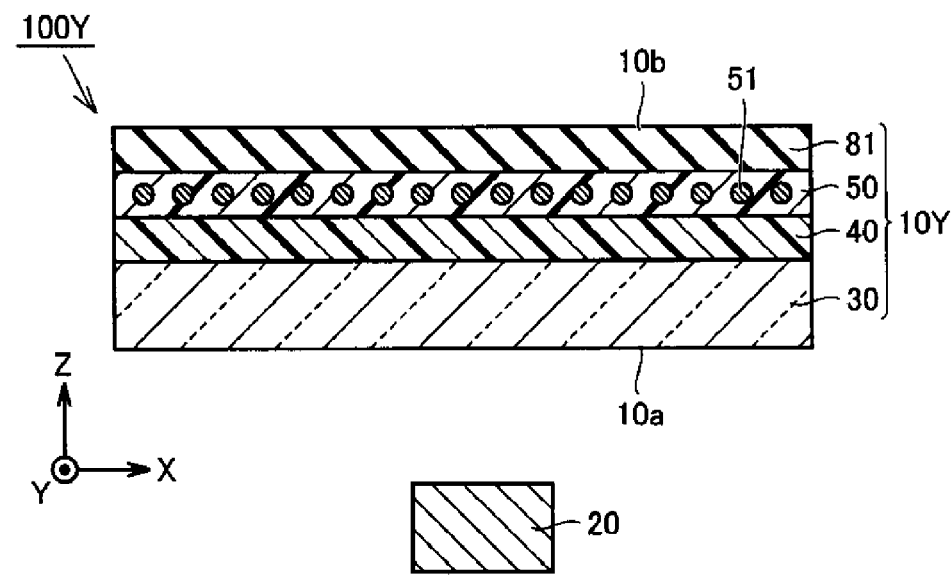
FIG. 51 is a schematic cross-sectional view of an illumination device according to Modification Example 25.

FIG. 51 is a schematic cross-sectional view of an illumination device according to Modification Example 25. An illumination device 100Y of Modification Example 25 will be described with reference to FIG. 51.

As shown in FIG. 51, the illumination device 100Y of Modification Example 25 differs from the illumination device 100V of Modification Example 22 in the configuration of a wavelength conversion element 10Y. The wavelength conversion element 10Y does not have the second transmissive substrate 80, and the first color adjustment layer 81 is formed on the first phosphor layer 50. It should be noted that the first color adjustment layer 81 is formed on the first phosphor layer 50 via an already-known method.

As above, in this type of configuration, the first alignment film 40 uniaxially aligns the first phosphors 51 in the direction parallel to the first primary surface of the first transmissive substrate 30; therefore, the secondary light emitted from the first phosphors 51 will have strong intensity and directionality along the emission direction (the Z-axis direction in the drawing), and the light that is a mixture of the primary light and secondary light will pass through the first color adjustment layer 81. Accordingly, as above, the illumination device 100Y of the present modification example can achieve effects that are approximately similar to the illumination device 100V of Modification Example 22.

Modification Example 26

Figure 52:
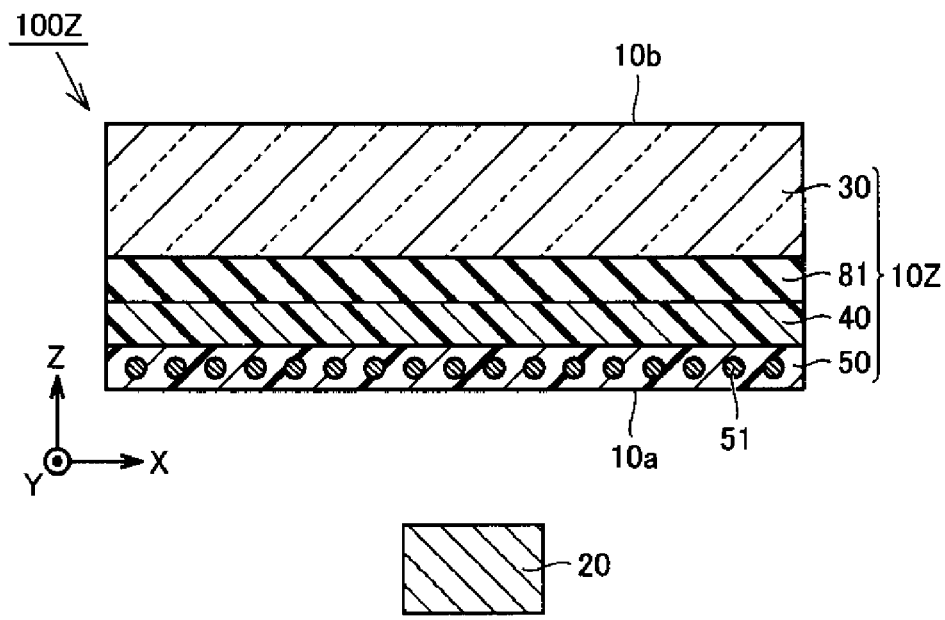
FIG. 52 is a schematic cross-sectional view of an illumination device according to Modification Example 26.

FIG. 52 is a schematic cross-sectional view of an illumination device according to Modification Example 26. An illumination device 100Z of the present modification example will be described with reference to FIG. 52.

As shown in FIG. 52, the illumination device 100Z of Modification Example 26 differs from the illumination device 100V of Modification Example 22 in the configuration of a wavelength conversion element 10Z. The wavelength conversion element 10Z does not have the second transmissive substrate 80; the first color adjustment layer 81 is formed between the first transmissive substrate 30 and the first alignment film 40; and the first transmissive substrate is disposed such that the first phosphor layer 50 faces the light source 20.

Specifically, the illumination device 100Z of the present modification example includes the light source 20 and the wavelength conversion element 10Z. The wavelength conversion element 10Z includes the first transmissive substrate 30, the first color adjustment layer 81 formed on the first primary surface of the first transmissive substrate 30, the first alignment film 40 formed on the first color adjustment layer 81, and the first phosphor layer that includes first phosphors 51 and is formed on the first alignment film 40. The first transmissive substrate 30 is disposed such that the first phosphor layer 50 faces the light source 20. It should be noted that the first color adjustment layer 81 is formed on the first primary surface of the first transmissive substrate 30 via an already-known method, and the first alignment film 40 is formed on the first color adjustment layer 81 via the method described above.

As above, in this type of configuration, the first alignment film 40 uniaxially aligns the first phosphors 51 in the direction parallel to the first primary surface of the first transmissive substrate 30; therefore, the polarized light emitted from the phosphors can be efficiently scattered towards the emission surface. Therefore, the secondary light emitted from the first phosphors 51 has directionality in which emission intensity is high along the emission direction (Z-axis direction in the drawing). Furthermore, the light that is a mixture of the primary light and secondary light will pass through the first color adjustment layer 81. Accordingly, as above, the illumination device 100Z of the present modification example can achieve effects that are approximately similar to the illumination device 100V of Modification Example 22.

In Modification Example 22 to Modification Example 26, an example was described in which, with respect to the illumination device 100, the first color adjustment layer 81 was additionally provided further in the emission direction than the first phosphor layer 50, but the present invention is not limited to this, and the configuration described above can also be adapted to the illumination device of the above embodiment and the illumination device of Modification Example 1 to Modification Example 22.

Modification Example 27

Figure 53:
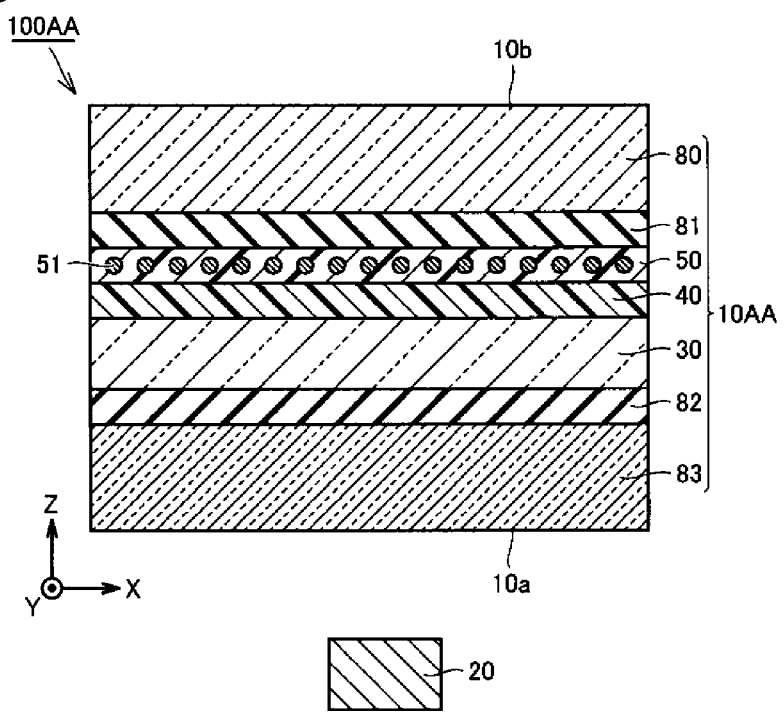
FIG. 53 is a schematic cross-sectional view of an illumination device according to Modification Example 27.

FIG. 53 is a schematic cross-sectional view of an illumination device according to Modification Example 27. An illumination device 100AA of the present modification example will be described with reference to FIG. 53.

As shown in FIG. 53, the illumination device 100AA of the present modification example differs from the illumination device 100 of the above embodiment in the configuration of a wavelength conversion element 10AA. The wavelength conversion element 10AA further includes the second transmissive substrate 80 on which the first color adjustment layer 81 that performs color adjustment of primary light and secondary light is formed, and a third transmissive substrate 83 on which a second color adjustment layer 82 that performs color adjustment of primary light is formed.

Specifically, the illumination device 100AA of the present modification example includes the light source 20 and a wavelength conversion element 10AA. The wavelength conversion element 10AA includes the first transmissive substrate 30 arranged to face the light source 20, the first alignment film 40 formed on the first primary surface of the first transmissive substrate 30, the first phosphor layer 50 including the first phosphors 51 and formed on the first alignment film 40, the second transmissive substrate 80 disposed to overlap the first transmissive substrate 30, the first color adjustment layer 81 formed on the first primary surface of the second transmissive substrate 80, the third transmissive substrate 83 disposed to overlap the first transmissive substrate 30, and the second color adjustment layer 82 formed on the primary surface of the third transmissive substrate 83.

The second transmissive substrate 80 is disposed opposite to the light source with respect to the first transmissive substrate 30 in the emission direction (the Z-axis direction in the drawing) and overlaps the first transmissive substrate 30 such that the first color adjustment layer 81 is positioned on the first phosphor layer 50.

The third transmissive substrate 83 is disposed on the light source 20 side with respect to the first transmissive substrate 30 in the emission direction (the Z-axis direction in the drawing) and is disposed to overlap the first transmissive substrate 30 such that the second color adjustment layer 82 is positioned between the first transmissive substrate 30 and the third transmissive substrate 83.

The first color adjustment layer 81 can be a cyan color filter, for example. Furthermore, the first color adjustment layer 81 is formed on the second transmissive substrate 80 via an already-known method. The second color adjustment layer 82 can be a blue color filter, for example. It should be noted that the second color adjustment layer 82 is formed on the third transmissive substrate 83 via an already-known method. The first phosphors 51 can be the green phosphors described above.

In this type of configuration, the blue primary light emitted from the light source 20 mainly exits towards the third transmissive substrate 83, passes through the third transmissive substrate 83, and then reaches the second color adjustment layer 82. The second color adjustment layer 82 transmits only primary light having specific wavelengths. The blue primary light having only the specific wavelengths passes through the first transmissive substrate 30 and the first alignment film 40 in this order and reaches the first phosphor layer 50. The blue primary light having only the specific wavelengths that has reached the first phosphor layer 50 and has been transmitted therethrough without being absorbed by the first phosphors 51 aligned by the first alignment film 40 mixes with the secondary light (green light) absorbed by the first phosphors 51 and emitted towards the first color adjustment layer 81, thereby forming a color that is approximately cyan. This approximately cyan light passes through the first color adjustment layer 81 and the second transmissive substrate 80 in this order and is emitted to outside. When the approximately cyan light passes through the first color adjustment layer 81, the first color adjustment layer 81 only transmits specific wavelengths, thereby performing fine color adjustment.

Due to the second color adjustment layer 82 being able to transmit specific wavelengths, selecting in advance the second color adjustment layer 82 to match wavelengths that have a high absorption efficiency with respect to the first phosphors 51 makes it possible to enhance the absorption efficiency of the first phosphors 51.

As above, in this type of configuration, the first alignment film 40 uniaxially aligns the first phosphors 51 in the direction parallel to the first primary surface of the first transmissive substrate 30; therefore, the polarized light emitted from the phosphors can be efficiently scattered towards the emission surface. Therefore, the secondary light emitted from the first phosphors 51 has directionality in which emission intensity is high along the emission direction (Z-axis direction in the drawing). Moreover, the light that is a mixture of the primary light and secondary light will pass through the first color adjustment layer 81, which only transmits specific wavelengths. Accordingly, as above, the illumination device 100AA of the present modification example can achieve approximately similar effects to the illumination device 100 of the above embodiment, and can also adjust color tone with ease. In addition, providing the second color adjustment layer 82 further towards the light source 20 than the first phosphor layer 50 makes it so only primary light having specific wavelengths with high absorption efficiency reaches the first phosphor layer 50, which can enhance the absorption efficiency of the first phosphors 51.

Modification Example 28

Figure 54:
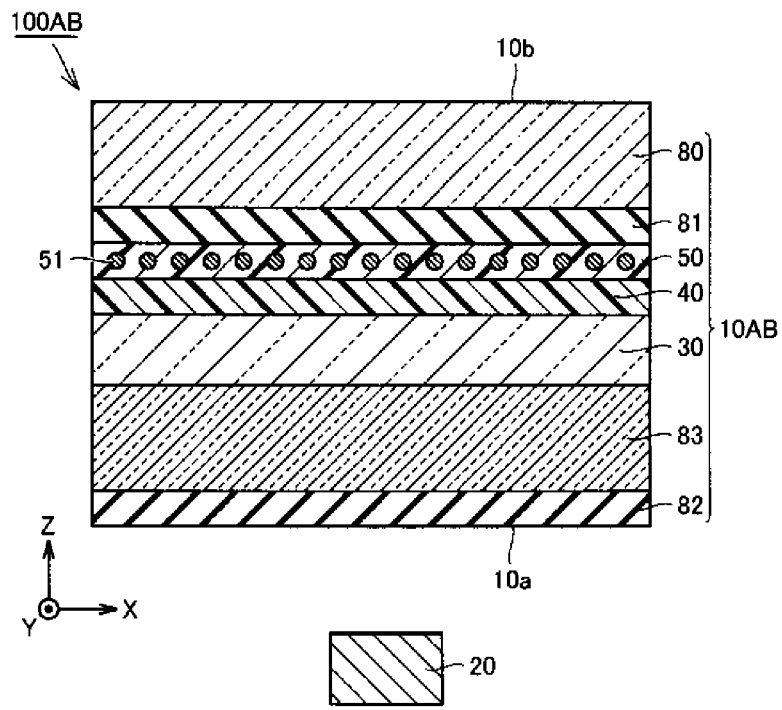
FIG. 54 is a schematic cross-sectional view of an illumination device according to Modification Example 28.

FIG. 54 is a schematic cross-sectional view of an illumination device according to Modification Example 28. An illumination device 100AB of the present modification example will be described with reference to FIG. 54.

As shown in FIG. 54, the illumination device 100AB of the present modification example differs from the illumination device 100AA of Modification Example 27 in the configuration of a wavelength conversion element 10AB. In the wavelength conversion element 10AB, the third transmissive substrate 83 is disposed to overlap the first transmissive substrate 30 such that the second color adjustment layer 82 faces the light source.

As above, in this type of configuration, the first alignment film 40 uniaxially aligns the first phosphors 51 in the direction parallel to the first primary surface of the first transmissive substrate 30; therefore, the polarized light emitted from the phosphors can be efficiently scattered towards the emission surface. Therefore, the secondary light emitted from the first phosphors 51 has directionality in which emission intensity is high along the emission direction (Z-axis direction in the drawing). Moreover, the light that is a mixture of the primary light and secondary light will pass through the first color adjustment layer 81, which only transmits specific wavelengths. In addition, the primary light emitted from the light source 20 has only specific wavelengths with a high absorbency with respect to the first phosphors 51, due to the second color adjustment layer 82. Accordingly, as above, the illumination device 100AB of the present modification example can achieve effects that are approximately similar to the illumination device 100AA of Modification Example 27.

Modification Example 29

Figure 55:
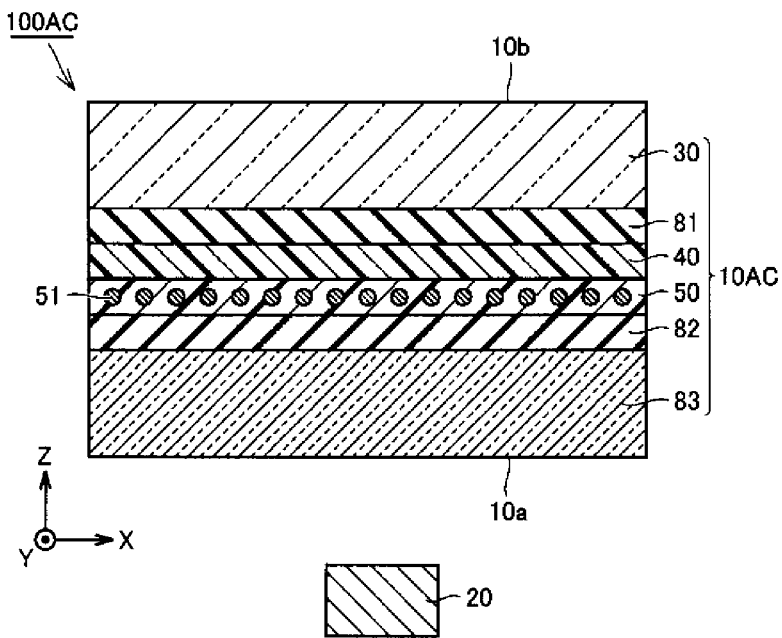
FIG. 55 is a schematic cross-sectional view of an illumination device according to Modification Example 29.

FIG. 55 is a schematic cross-sectional view of an illumination device according to Modification Example 29. An illumination device 100AC of Modification Example 29 will be described with reference to FIG. 55.

As shown in FIG. 55, the illumination device 100AC of the present modification example differs from the illumination device 100AA of Modification Example 27 in the configuration of a wavelength conversion element 10AC. In the wavelength conversion element 10AC, the first color adjustment layer 81 is not formed on the second transmissive substrate 80, but rather between the first transmissive substrate 30 and the first alignment film 40, and the first transmissive substrate 30 is disposed to overlap the third transmissive substrate 83 such that the first phosphor layer 50 is positioned on the second color adjustment layer 82.

Specifically, the illumination device 100AC of the present modification example includes the light source 20 and the wavelength conversion element 10AC. The wavelength conversion element 10AC includes the first transmissive substrate 30 arranged to face the light source 20, the first color adjustment layer 81 formed on the first primary surface of the first transmissive substrate 30, the first alignment film 40 formed on the first color adjustment layer 81, the first phosphor layer 50 having the first phosphors 51 and formed on the first alignment film 40, the third transmissive substrate 83 disposed to overlap the first transmissive substrate 30, and the second color adjustment layer 82 formed on the first primary surface of the third transmissive substrate 83.

The first transmissive substrate 30 is arranged to face the light source 20 (such that the first phosphor layer 50 faces the light source 20) so as to follow the first phosphor layer 50 and the first color adjustment layer 81 in this order from the light source 20 side. The third transmissive substrate 83 is disposed on the light source 20 side with respect to the first transmissive substrate 30 in the emission direction (the Z-axis direction in the drawing) and overlaps the first transmissive substrate 30 such that the second color adjustment layer 82 is positioned between the first phosphor layer 50 and the third transmissive substrate 83.

As above, in this type of configuration, the first alignment film 40 uniaxially aligns the first phosphors 51 in the direction parallel to the first primary surface of the first transmissive substrate 30; therefore, the polarized light emitted from the phosphors can be efficiently scattered towards the emission surface. Therefore, the secondary light emitted from the first phosphors 51 has directionality in which emission intensity is high along the emission direction (Z-axis direction in the drawing). Furthermore, the light that is a mixture of the primary light and secondary light will pass through the first color adjustment layer 81, which transmits only specific wavelengths. Moreover, the primary light emitted from the light source 20 has only specific wavelengths with high absorption efficiency with respect to the first phosphors 51, due to the second color adjustment layer 82. Accordingly, as above, the illumination device 100AC of the present modification example can achieve effects that are approximately similar to the illumination device 100AA of Modification Example 27.

Modification Example 30

Figure 56:
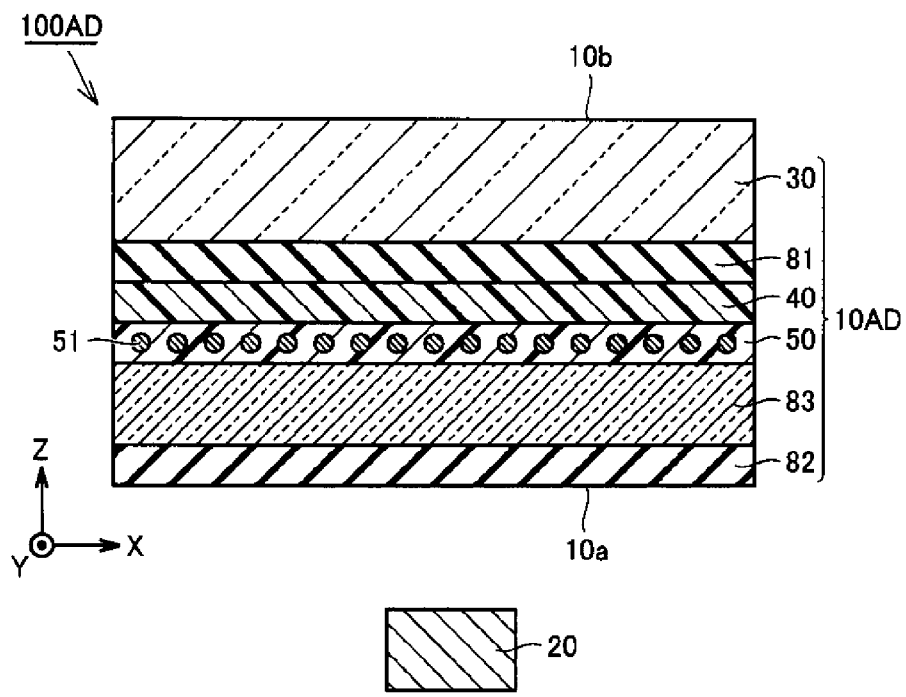
FIG. 56 is a schematic cross-sectional view of an illumination device according to Modification Example 30.

FIG. 56 is a schematic cross-sectional view of an illumination device according to Modification Example 30. An illumination device 100AD of the present modification example will be described with reference to FIG. 56.

As shown in FIG. 56, the illumination device 100AD of the present modification example differs from the illumination device 100AA of Modification Example 27 in the configuration of a wavelength conversion element LOAD. In the wavelength conversion element LOAD, the first color adjustment layer 81 is not formed on the second transmissive substrate 80, but rather between the first transmissive substrate 30 and the first alignment film 40, and the first transmissive substrate 30 is disposed to overlap the third transmissive substrate 83 such that the first phosphor layer 50 is positioned on the third transmissive substrate 83.

Specifically, the illumination device 100AD of the present modification example includes the light source 20, the first transmissive substrate 30 arranged facing the light source 20, the first color adjustment layer 81 formed on the first primary surface of the first transmissive substrate 30, the first alignment film 40 formed on the first color adjustment layer 81, the first phosphor layer 50 including the first phosphors 51 and formed on the first alignment film 40, the third transmissive substrate 83 disposed to overlap the first transmissive substrate 30, and the second color adjustment layer 82 formed on the first primary surface of the third transmissive substrate 83.

The first transmissive substrate 30 is arranged to face the light source 20 (such that the first phosphor layer 50 faces the light source 20) so as to follow the first phosphor layer 50 and the first color adjustment layer 81 in this order from the light source 20 side. The third transmissive substrate 83 is disposed on the light source 20 side with respect to the first transmissive substrate 30 in the emission direction (the Z-axis direction in the drawing) and overlaps the first transmissive substrate 30 such that the second color adjustment layer 82 faces the light source 20.

As above, in this type of configuration, the first alignment film 40 uniaxially aligns the first phosphors 51 in the direction parallel to the first primary surface of the first transmissive substrate 30; therefore, the polarized light emitted from the phosphors can be efficiently scattered towards the emission surface. Therefore, the secondary light emitted from the first phosphors 51 has directionality in which emission intensity is high along the emission direction (Z-axis direction in the drawing). Furthermore, the light that is a mixture of the primary light and secondary light will pass through the first color adjustment layer 81, which transmits only specific wavelengths. Moreover, the primary light emitted from the light source 20 has only specific wavelengths with high absorption efficiency with respect to the first phosphors 51, due to the second color adjustment layer 82. Accordingly, as above, the illumination device 100AD of the present modification example can achieve effects that are approximately similar to the illumination device 100AA of Modification Example 27.

Modification Example 31

Figure 57:
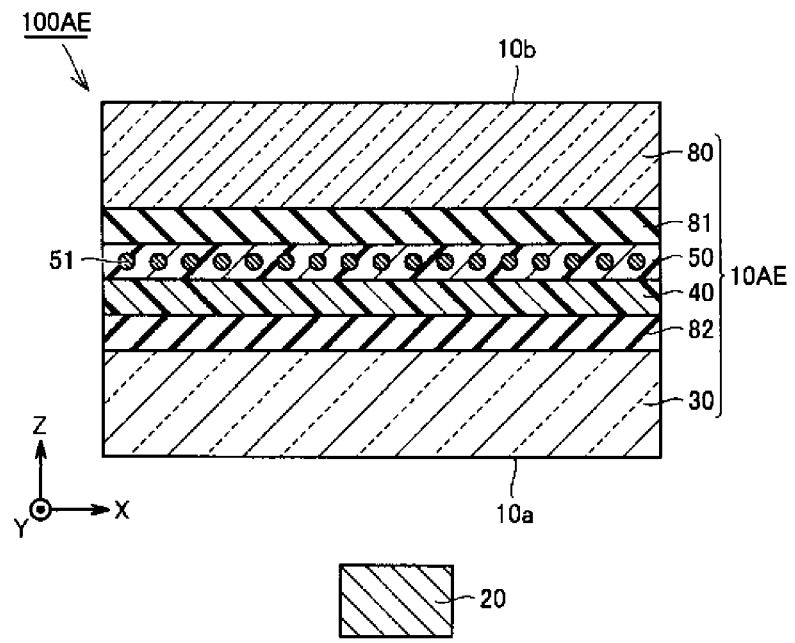
FIG. 57 is a schematic cross-sectional view of an illumination device according to Modification Example 31.

FIG. 57 is a schematic cross-sectional view of an illumination device according to Modification Example 31. An illumination device 100AE of the present modification example will be described with reference to FIG. 57.

As shown in FIG. 57, the illumination device 100AE of the present modification example differs from the illumination device 100AA of Modification Example 27 in the configuration of a wavelength conversion element 10AE. In the wavelength conversion element 10AE, the second color adjustment layer 82 is not formed on the third transmissive substrate 83, but rather between the first transmissive substrate 30 and the first alignment film 40.

Specifically, the illumination device 100AE of the present modification example includes the light source 20 and the wavelength conversion element 10AE. The wavelength conversion element 10AE includes the first transmissive substrate 30 arranged to face the light source 20, the second color adjustment layer 82 formed on the first primary surface of the first transmissive substrate 30, the first alignment film 40 formed on the second color adjustment layer 82, the first phosphor layer 50 having the first phosphors 51 and formed on the first alignment film 40, the second transmissive substrate 80 disposed to overlap the first transmissive substrate 30, and the first color adjustment layer 81 formed on the first primary surface of the second transmissive substrate 80.

The second transmissive substrate 80 is disposed opposite to the light source 20 with respect to the transmissive substrate 30 in the emission direction (the Z-axis direction in the drawing) and overlaps the first transmissive substrate 30 such that the first color adjustment layer 81 is positioned on the first phosphor layer 50. It should be noted that the second color adjustment layer 82 is formed on the first primary surface of the first transmissive substrate 30 via an already-known method and the first alignment film 40 is formed on the second color adjustment layer 82 via the method described above.

As above, in this type of configuration, the first alignment film 40 uniaxially aligns the first phosphors 51 in the direction parallel to the first primary surface of the first transmissive substrate 30; therefore, the polarized light emitted from the phosphors can be efficiently scattered towards the emission surface. Therefore, the secondary light emitted from the first phosphors 51 has directionality in which emission intensity is high along the emission direction (Z-axis direction in the drawing). Furthermore, the light that is a mixture of the primary light and secondary light will pass through the first color adjustment layer 81, which transmits only specific wavelengths. Moreover, the primary light emitted from the light source 20 has only specific wavelengths with high absorption efficiency with respect to the first phosphors 51, due to the second color adjustment layer 82. Accordingly, as above, the illumination device 100AE of the present modification example can achieve effects that are approximately similar to the illumination device 100AA of Modification Example 27.

Modification Example 32

Figure 58:
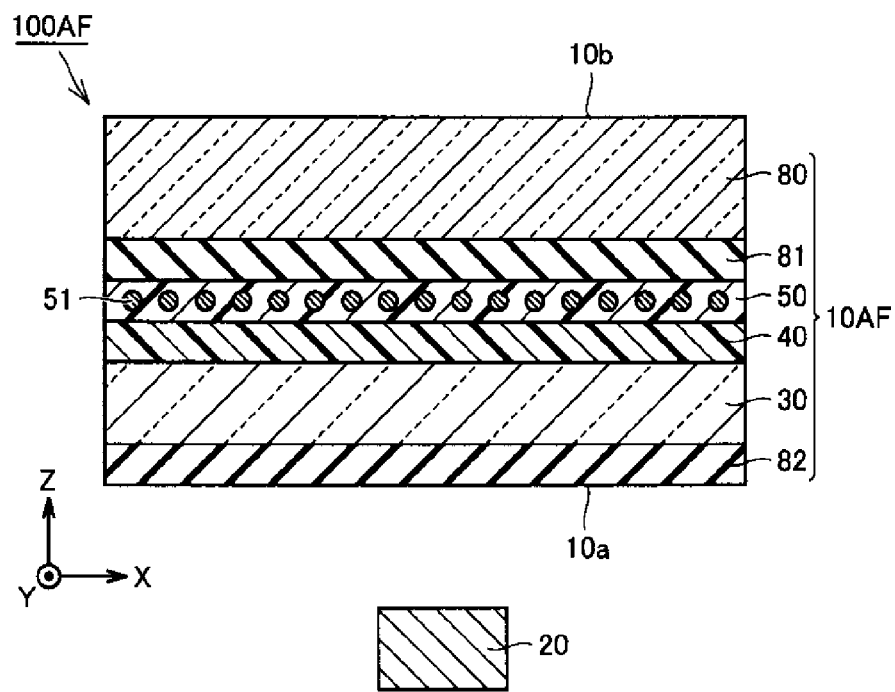
FIG. 58 is a schematic cross-sectional view of an illumination device according to Modification Example 32.

FIG. 58 is a schematic cross-sectional view of an illumination device according to Modification Example 32. An illumination device 100AF of the present modification example will be described with reference to FIG. 58.

As shown in FIG. 58, the illumination device 100AF of the present modification example differs from the illumination device 100AA of Modification Example 27 in the configuration of a wavelength conversion element LOAF. In the wavelength conversion element AF, the second color adjustment layer 82 is not formed on the third transmissive substrate 83, but rather on the second primary surface of the first transmissive substrate 30.

Specifically, the illumination device 100AF of the present modification example includes the light source 20 and the wavelength conversion element 10AF. The wavelength conversion element LOAF includes the first transmissive substrate 30 arranged to face the light source 20, the first alignment film 40 formed on the first primary surface of the first transmissive substrate 30, the first phosphor layer 50 including the first phosphors 51 and formed on the first alignment film 40, the second color adjustment layer 82 formed on the second primary surface of the first transmissive substrate 30 which is opposite to the first primary surface, the second transmissive substrate 80 disposed to overlap the first transmissive substrate 30, and the first color adjustment layer 81 formed on the first primary surface of the second transmissive substrate 80.

The first transmissive substrate 30 is arranged such that the second color adjustment layer 82 faces the light source 20. The second transmissive substrate 80 is disposed opposite to the light source 20 with respect to the first transmissive substrate 30 in the emission direction (the Z-axis direction in the drawing) and overlaps the first transmissive substrate 30 such that the first color adjustment layer 81 is positioned on the first phosphor layer 501t should be noted that the second color adjustment layer 82 is formed on the second primary surface of the first transmissive substrate 30 via an already-known method.

As above, in this type of configuration, the first alignment film 40 uniaxially aligns the first phosphors 51 in the direction parallel to the first primary surface of the first transmissive substrate 30; therefore, the polarized light emitted from the phosphors can be efficiently scattered towards the emission surface. Therefore, the secondary light emitted from the first phosphors 51 has directionality in which emission intensity is high along the emission direction (Z-axis direction in the drawing). Furthermore, the light that is a mixture of the primary light and secondary light will pass through the first color adjustment layer 81, which transmits only specific wavelengths. Moreover, the primary light emitted from the light source 20 has only specific wavelengths with high absorption efficiency with respect to the first phosphors 51, due to the second color adjustment layer 82. Accordingly, as above, the illumination device 100AF of the present modification example can achieve effects that are approximately similar to the illumination device 100AA of Modification Example 27.

Modification Example 33

Figure 59:
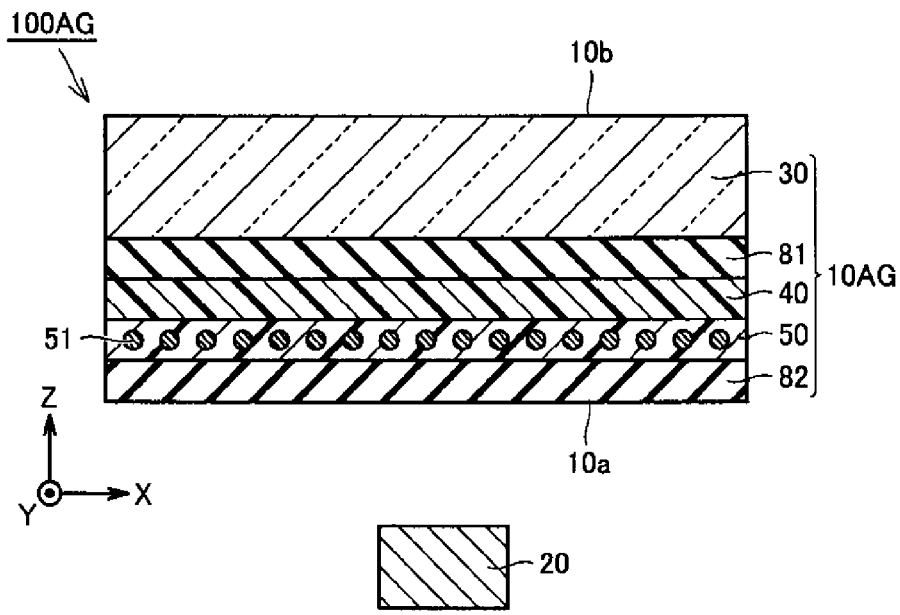
FIG. 59 is a schematic cross-sectional view of an illumination device according to Modification Example 33.

FIG. 59 is a schematic cross-sectional view of an illumination device according to Modification Example 33. An illumination device 100AG of the present modification example will be described with reference to FIG. 59.

As shown in FIG. 59, the illumination device 100AG of the present modification example differs from the illumination device 100AA of Modification Example 27 in the configuration of a wavelength conversion element 10AG. In the wavelength conversion element 10AG, the first color adjustment layer 81 is not formed on the second transmissive substrate 80, but rather between the first transmissive substrate 30 and the first alignment film 40, and the second color adjustment layer 82 is not formed on the third transmissive substrate 83, but rather on the first phosphor layer 50, and the first transmissive substrate 30 is arranged such that the second color adjustment layer 82 faces the light source 20.

Specifically, the illumination device 100AG of the present modification example includes the light source 20 and the wavelength conversion element 10AG. The wavelength conversion element 10AG includes the first transmissive substrate 30 arranged to face the light source 20, the first color adjustment layer 81 formed on the first primary surface of the first transmissive substrate 30, the first alignment film 40 formed on the first color adjustment layer 81, the first phosphor layer 50 having the first phosphors 51 and formed on the first alignment film 40, and the second color adjustment layer 82 formed on the first phosphor layer 50.

The first transmissive substrate 30 is arranged such that the second color adjustment layer 82 is aligned in the emission direct (the Z-axis direction in the drawing) in the order of light source 20, second color adjustment layer 82, and first phosphor layer 50 (i.e., such that the second color adjustment layer 82 faces the light source 20). It should be noted that the second color adjustment layer 82 is formed on the first phosphor layer 50 via an already-known method.

As above, in this type of configuration, the first alignment film 40 uniaxially aligns the first phosphors 51 in the direction parallel to the first primary surface of the first transmissive substrate 30; therefore, the polarized light emitted from the phosphors can be efficiently scattered towards the emission surface. Therefore, the secondary light emitted from the first phosphors 51 has directionality in which emission intensity is high along the emission direction (Z-axis direction in the drawing). Furthermore, the light that is a mixture of the primary light and secondary light will pass through the first color adjustment layer 81, which transmits only specific wavelengths. Moreover, the primary light emitted from the light source 20 has only specific wavelengths with high absorption efficiency with respect to the first phosphors 51, due to the second color adjustment layer 82. Accordingly, as above, the illumination device 100AG of the present modification example can achieve effects that are approximately similar to the illumination device 100AA of Modification Example 27.

It should be noted that, in Modification Example 27 to Modification Example 33, an example was described in which the first color adjustment layer 81 is provided opposite to the light source side with respect to the first phosphor layer 50, and the second color adjustment layer 82 is arranged to be in the order of light source 20, second color adjustment layer 82, and first phosphor layer 50 in the emission direction, but the second color adjustment layer 82 may be arranged in the order of light source 20, second color adjustment layer 82, and first phosphor layer 50 in the emission direction without the first color adjustment layer 81 being provided.

Furthermore, in Modification Example 27 to Modification Example 33, a separate transmissive substrate may be provided, which can be appropriately arranged on the border with the outside (atmospheric layer) where illumination light from the light source exits, such as between the first transmissive substrate 30 and light source 20, or between the first transmissive substrate 30 and second transmissive substrate 80.

It should be noted that, in Modification Example 22 to Modification Example 26, an example was described in which the first phosphors 51 are green phosphors and the first color adjustment layer 81 is a cyan color filter, and in Modification Example 27 to Modification Example 33 an example was described in which the first color adjustment layer 81 is a cyan color filter and the second color adjustment layer 82 is a blue color filter, but the present invention is not limited to this, and the first phosphors 51, first color adjustment layer 81, and second color adjustment layer 82 can be selected as appropriate in accordance with the primary light emitted from the light source 20 in order to achieve the desired color tone. The first color adjustment layer 81 and second color adjustment layer 82 can be a color filter constituted by a colored portion having a pigment, or a color filter constituted by a band-pass filter or photonic crystals.

Figure 60:
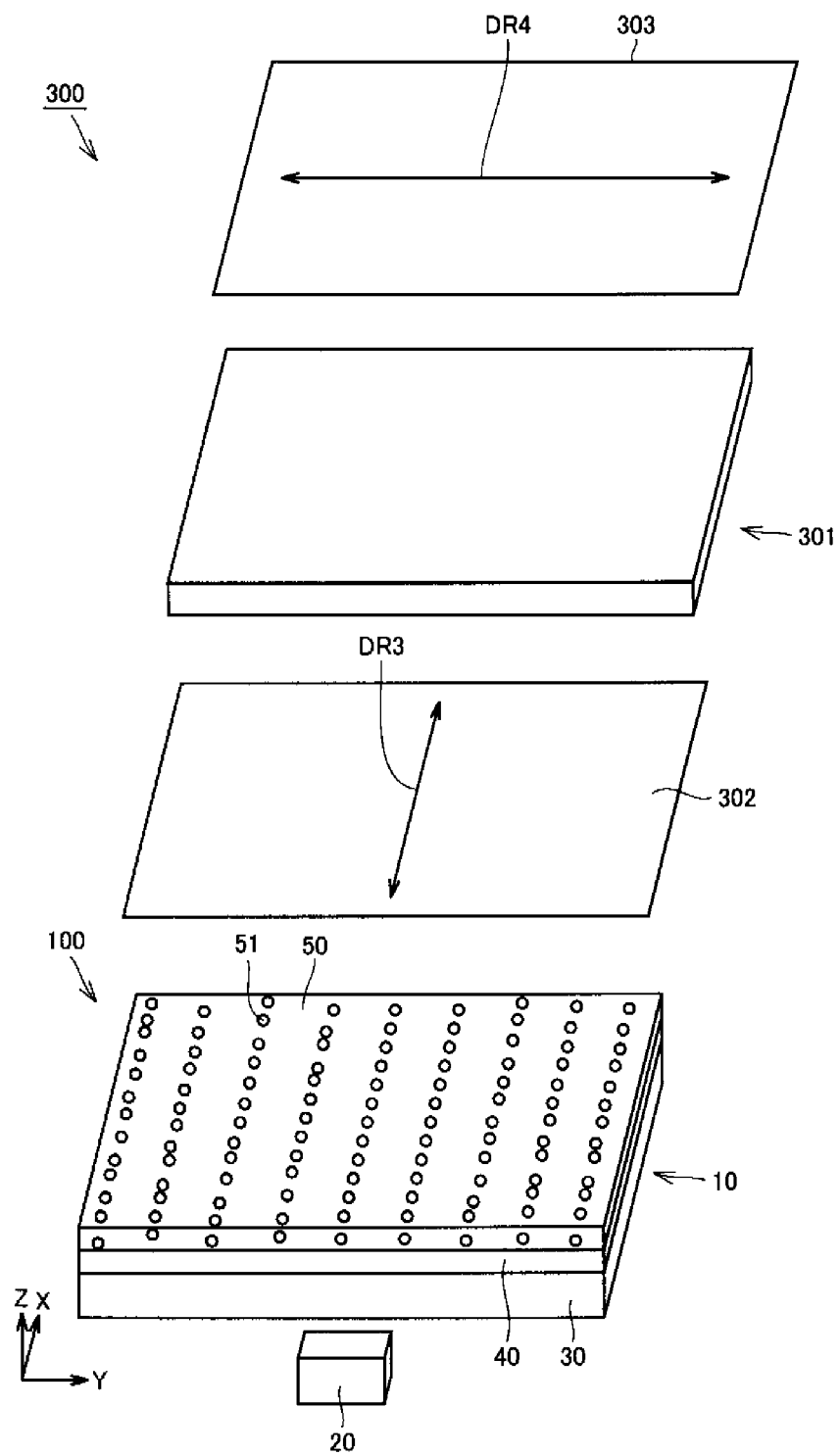
FIG. 60 is an exploded perspective view of a liquid crystal display device having the illumination device shown in FIG. 1.

FIG. 60 is an exploded perspective view of a liquid crystal display device having the illumination device shown in FIG. 1. A liquid crystal display device 300 having the illumination device shown in FIG. 1 will be described with reference to FIG. 60.

The liquid crystal display device 300 includes an illumination device 100, polarizing plates 302, 303, and a liquid crystal display panel 301. The illumination device 100 is used as a backlight, and the first phosphors 51 are uniaxially aligned in the X-axis direction in the illumination device 100. The polarizing plate 302 has a transmission axis in the DR3 direction and is arranged between the liquid crystal display panel 301 and illumination device 100 such that the transmission axis of the polarizing plate 302 overlaps the alignment direction (X-axis direction) of the first phosphors. The polarizing plate 303 has a transmission axis in the DR4 direction and is arranged above the liquid crystal display panel 301 such that the transmission axis of the polarizing plate 303 intersects the transmission axis of the polarizing plate 302. The liquid crystal display panel 301 is constituted by a TFT substrate and a CF substrate, which are bonded together to sandwich the liquid crystal.

With this type of configuration, secondary light having an increased polarization component parallel to the X-axis direction will efficiently pass through the polarizing plate 302, thereby making it possible to increase the usage efficiency of light from the backlight.

Experiments

The extraction efficiency and polarization characteristics of the secondary light emitted from the first phosphors that are uniaxially aligned in the first phosphor layer will be explained below based on the results from simulations and experiments.

In Working Example S1, a wavelength conversion element having first phosphors uniaxially aligned in a prescribed direction was prepared by forming the first alignment film on the first transmissive substrate and spin coating liquid crystal polymers having the first phosphors on the first alignment film. The wavelength conversion element of Working Example 1 corresponds to the wavelength conversion element 10 used in the illumination device of the above embodiment.

Meanwhile, in Comparison Example S2, a wavelength conversion element having first phosphors unaligned with random alignments was prepared by spin coating liquid crystal polymers having the first phosphors on the first transmissive substrate. The wavelength conversion element of Comparison Example S2 corresponds to the wavelength conversion element 210 in the above comparison example.

During manufacturing of the wavelength conversion element of Working Example S1 and Comparison Example S2, the liquid crystal polymers were reactive mesogen RMM 34C manufactured by Merck & Co., Inc., and the first phosphors were the green phosphors described above.

Figure 61:
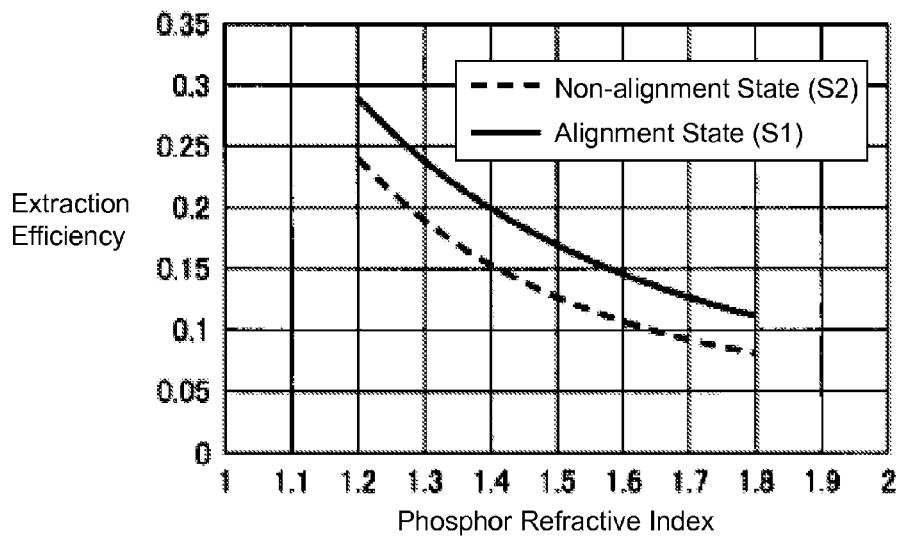
FIG. 61 shows the relationship between extraction efficiency of secondary light emitted from the phosphors and the refractive index of the phosphors.

FIG. 61 is a view of the relationship between extraction efficiency of secondary light emitted from the phosphors and the refractive indices of the phosphors. The relationship between extraction efficiency of secondary light emitted from the phosphors and the refractive indices of the phosphors will be described with reference to FIG. 61.

As shown in FIG. 61, changing the refractive indices of the phosphors in order to perform theoretical calculations on the extraction efficiency of the secondary light from the aligned phosphors and unaligned phosphors resulted in the extraction efficiency of the secondary light emitted from the aligned phosphors exceeding the extraction efficiency of the unaligned phosphors at any given refractive index value of the phosphors. It should be noted that the angle θ2 of the direction of the transition dipole moment of the aligned phosphors to the emission surface was set at 0°.

Figure 62:
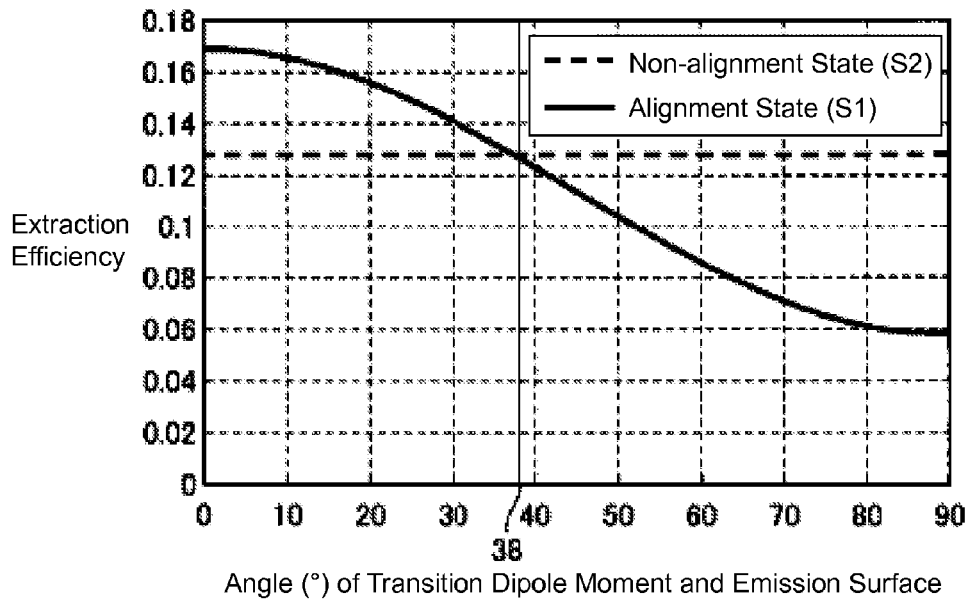
FIG. 62 is a view of the relationship between extraction efficiency of secondary light emitted from the phosphors and the angle of the emission surface to the transition dipole moment direction of the phosphors.

FIG. 62 is a relationship between extraction efficiency of secondary light emitted from the phosphors and the angle of the transition dipole moment direction of the phosphors to the emission surface. The relationship between extraction efficiency of secondary light emitted from the phosphors and the angle θ2 of the transition dipole moment direction of the phosphors to the emission surface will be described with reference to FIG. 62.

As shown in FIG. 62, when calculating the extraction efficiency of secondary light from the aligned phosphors after the angle θ2 of the transition dipole moment direction of the aligned phosphors to the emission surface was changed, the result was the extraction efficiency of the secondary light from the aligned phosphors exceeding the extraction efficiency from the unaligned phosphors when θ2 was in the range of 0° to 38°.

Note that the transition dipole moment direction of the unaligned phosphors is random, and thus the secondary light in the unaligned state is emitted isotropically. Therefore, the extraction efficiency of secondary light in the unaligned state results in uniform values. Furthermore, a ray-trace simulation was used when performing theoretical calculation of the extraction efficiency of the secondary light.

FIG. 63 is a view of the appearance when measuring the total flux of the secondary light emitted from the phosphors. FIG. 64 is a view of the relationship between the alignment direction of the phosphors and the direction of the transmission axis of the polarizing plates during measurement of the total flux of the secondary light. FIG. 65 is a table of the relationship between the flux of incident light received from the light source and the total flux of secondary light emitted from the phosphors. Improvements in the extraction efficiency of the aligned phosphors will be described with reference to FIGS. 63 to 65.

As shown in FIG. 63, the amount of emitted total flux of secondary light from the first phosphors was measured with a photometer by placing the polarizing plate 302 between the wavelength conversion element of Working Example S1, Comparison Example S2 and the light source 20 and then polarized light being incident on the first phosphors in a specific direction. In addition, the amount of incident total flux of the light source 20 was also measured with a photometer to perform a comparison on the amount of emitted total flux to the amount of incident total flux between Working Example S1 (aligned state) and Comparison Example S2 (unaligned state). The amount of emitted total flux of secondary light means the total flux of light-emitting components from the phosphors and does not include the loss components of incident light. The light source 20 was a blue light source with a peak wavelength of 450 nm.

As shown in FIG. 64, when measuring the amount of emitted total flux of secondary light, the transmission axis (DR3) of the polarizing plate 302 was set parallel to the alignment direction (DR1) of the first phosphors in Working Example S1.

As shown in FIG. 65, in Working Example S1, which is the aligned state, the amount of emitted total flux to the amount of incident total flux is approximately 1.45 times greater than Comparison Example S2, which is the unaligned state.

Due to this, it was possible to empirically confirm that uniaxially aligning the first phosphors improves the extraction efficiency of secondary light emitted from the primary light as compared to the unaligned state.

Figure 66:
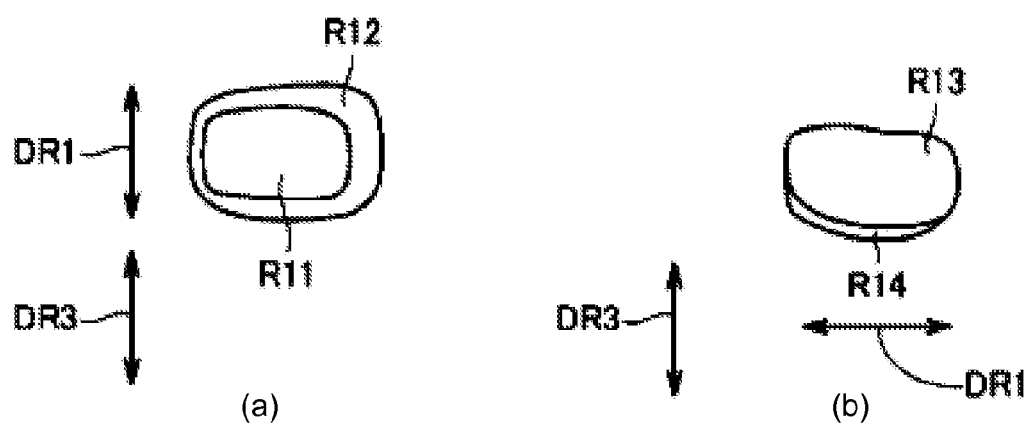
FIG. 66 is a view of, in the state shown in FIG. 63, the secondary light emitted from the phosphors when the alignment direction of the phosphors is parallel to the transmission axes of the polarizing plates and the secondary light emitted from the phosphors when the alignment direction of the phosphors is perpendicular to the transmission axes of the polarizing plates.
Figure 67:
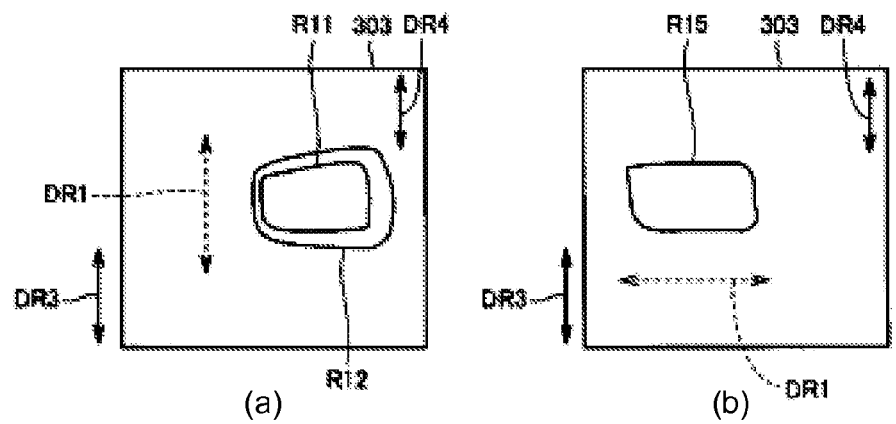
FIG. 67 is a view of, in the state shown in FIG. 66, secondary light when a polarizing plate having a transmission axis that is parallel to the transmission axis of the polarizing plate in a lower layer of the wavelength conversion element is further provided in an upper layer of the wavelength conversion element layer.
Figure 68:
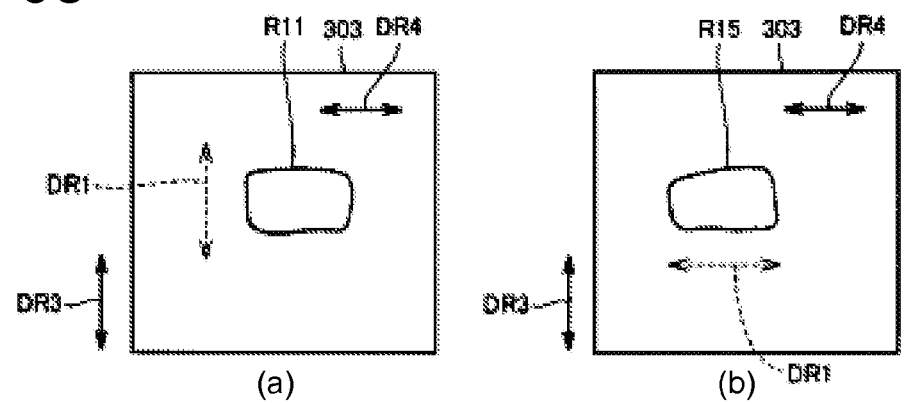
FIG. 68 is a view of, in the state shown in FIG. 66, secondary light when a polarizing plate having a transmission axis that is perpendicular to the transmission axis of the polarizing plate in the lower layer of the wavelength conversion element is further provided in the upper layer of the wavelength conversion element layer.

FIGS. 66 to 68 are views of secondary light when the alignment state of the first phosphors and the transmission axis of the polarizing plate have been changed. The results of qualitatively evaluating the polarizing characteristics of the secondary light emitted from the aligned first phosphors will be described with reference to FIGS. 66 to 68.

FIG. 66(a) is a view of secondary light emitted from the phosphors when the alignment direction of the phosphors is parallel to the transmission axis of the polarizing plate, and FIG. 66(b) is a view of secondary light emitted from the phosphors when the alignment direction of the phosphors is perpendicular to the transmission axis of the polarizing plate.

As shown in FIG. 66(a), when the alignment direction (DR1) of the phosphors is parallel to the transmission axis (DR3) of the polarizing plate, the aligned phosphors absorb almost all of the primary light (blue light) from the light source, and a portion of the unabsorbed primary light mixes with the secondary light (green light) emitted from the phosphors to realize approximately green illumination light. In particular, in region R11 located in the center of the illumination light, the green color has a high degree of luminance, whereas in the region R12 located around the region R11, the green color is slightly lower in luminance than R11.

As shown in FIG. 66(b), when the alignment direction (DR1) of the phosphors is perpendicular to the transmission axis (DR3) of the polarizing plate, the absorbency of primary light (blue light) from the phosphors by the aligned phosphors drops and the proportion of unabsorbed primary light increases. This results in the increased proportion of primary light mixing with the secondary light (green light) emitted from the phosphors, thereby realizing a green illumination light that has a bluish tinge. In particular, in region R13 located in the center of the illumination light, there is a low-luminance green color with a bluish tinge, and in region R14 located around the region R13, there is blue light.

FIG. 67(a) shows secondary light when a polarizing plate having a transmission axis that is parallel to the transmission axis of the polarizing plate located in a layer below the wavelength conversion element has been provided in a layer above the wavelength conversion element in the state shown in FIG. 66(a). FIG. 67(b) shows secondary light when a polarizing plate having a transmission axis that is parallel to the transmission axis of the polarizing plate located in a layer below the wavelength conversion element has been provided in a layer above the wavelength conversion element in the state shown in FIG. 66(b).

As shown in FIG. 67(a), when the polarizing plate 303 having the transmission axis (DR4) that is parallel to the transmission axis (DR3) of the polarizing plate 302 located in the layer below the wavelength conversion element has been provided in the layer above the wavelength conversion element in the state shown in FIG. 66(a), the secondary light has a polarization that is approximately parallel to the alignment direction (DR1), and thus the polarization direction of the secondary light is approximately parallel to the transmission axis (DR4) of the polarizing plate 303. Therefore, almost all of the secondary light passes through the polarizing plate 303. Furthermore, the primary light that is not absorbed by the phosphors is polarized in the same direction as the transmission axis (DR4) of the polarizing plate 303 by the polarizing plate located in the lower layer, and thus passes through the polarizing plate 303.

As a result, compared to the state shown in FIG. 66(a), bright green illumination light that is a mixture of the primary light and secondary light can be achieved without a large drop in luminance. In particular, green light having a high luminance is achieved in the region R11 located in the center of the illumination light, and green light having a slightly lower luminance than in region R11 is achieved in the region R12 located around the region R11.

As shown in FIG. 67(b), when the polarizing plate 303 having the transmission axis (DR4) that is parallel to the transmission axis (DR3) of the polarizing plate 302 located in the layer below the wavelength conversion element has been provided in the layer above the wavelength conversion element in the state shown in FIG. 66(b), the secondary light has a polarization that is approximately parallel to the alignment direction (DR1), and thus the polarization direction of the secondary light is approximately perpendicular to the transmission axis (DR4) of the polarizing plate 303. Thus, a large portion of the secondary light cannot pass through the polarizing plate 303. Meanwhile, the primary light that is not absorbed by the phosphors is polarized in the direction parallel to the transmission axis (DR4) of the polarizing plate 303 by the polarizing plate 302 located in the lower layer, and thus passes through the polarizing plate 303.

This results in a large portion of the secondary light not mixing with the primary light as compared to the state in FIG. 66(b), thereby realizing blue illumination light with a lowered luminance. In other words, in the region R15 representing all areas of illumination light, blue light is realized.

FIG. 68(a) shows secondary light when a polarizing plate having a transmission axis that is perpendicular to the transmission axis of the polarizing plate located in a layer below the wavelength conversion element has been provided in a layer above the wavelength conversion element in the state shown in FIG. 66(a). FIG. 68(b) shows secondary light when a polarizing plate having a transmission axis that is perpendicular to the transmission axis of the polarizing plate located in a layer below the wavelength conversion element has been provided in a layer above the wavelength conversion element in the state shown in FIG. 66(b).

As shown in FIG. 68(a), when the polarizing plate 303 having the transmission axis (DR4) that is perpendicular to the transmission axis (DR3) of the polarizing plate 302 located in the layer below the wavelength conversion element has been provided in the layer above the wavelength conversion element in the state shown in FIG. 66(a), the secondary light has a polarization that is approximately parallel to the alignment direction (DR1), and thus the polarization direction of the secondary light is approximately perpendicular to the transmission axis (DR4) of the polarizing plate 303. Therefore, a portion of the secondary light passes through the polarizing plate 303. Meanwhile, the primary light that is not absorbed by the phosphors is polarized in a direction that is perpendicular to the transmission axis (DR4) of the polarizing plate 303 by the polarizing plate 302 in the lower layer, and thus cannot pass through the polarizing plate 303.

As a result, compared to the state shown in FIG. 66(a), the proportion of primary light mixed with the secondary light decreases, thereby realizing illumination light having a green color with lowered luminance. In other words, in the region R11 representing all areas of illumination light, green light is realized.

As shown in FIG. 68(b), when the polarizing plate 303 having the transmission axis (DR4) that is perpendicular to the transmission axis (DR3) of the polarizing plate 302 located in the layer below the wavelength conversion element has been provided in the layer above the wavelength conversion element in the state shown in FIG. 66(b), the secondary light has a polarization that is approximately parallel to the alignment direction (DR1), and thus the polarization direction of the secondary light is approximately parallel to the transmission axis (DR4) of the polarizing plate 303. Therefore, a large portion of the secondary light passes through the polarizing plate 303. Meanwhile, the primary light that is not absorbed by the phosphors is polarized in a direction that is perpendicular to the transmission axis of the polarizing plate 303 by the polarizing plate 302 in the lower layer, and thus cannot pass through the polarizing plate 303.

As a result, compared to the state shown in FIG. 66(b), the proportion of primary light mixed with the secondary light decreases, thereby realizing illumination light having a green color with lowered luminance. In other words, in the region R15 representing all areas of illumination light, green light is realized. Furthermore, compared to the state in FIG. 68(a), the proportion of secondary light that passes through the polarizing plate 303 is increased, and thus the green illumination light is brighter than in the state in FIG. 68(a).

The above empirically confirms that the aligned first phosphors have the absorbency thereof changed due to the polarization component of the incident primary light, and that the secondary light emitted from the aligned first phosphors has the polarization direction thereof changed depending on the alignment direction of the first phosphors. More specifically, it was empirically confirmed that absorbency increases when the polarization direction of the incident primary light matches the alignment direction of the first phosphors, and that much of the secondary light emitted from the aligned first phosphors includes a polarization component that is parallel to the alignment direction.

The results of qualitatively evaluating the polarization characteristics of the secondary light emitted from the aligned first phosphors will be described below.

Figure 69:
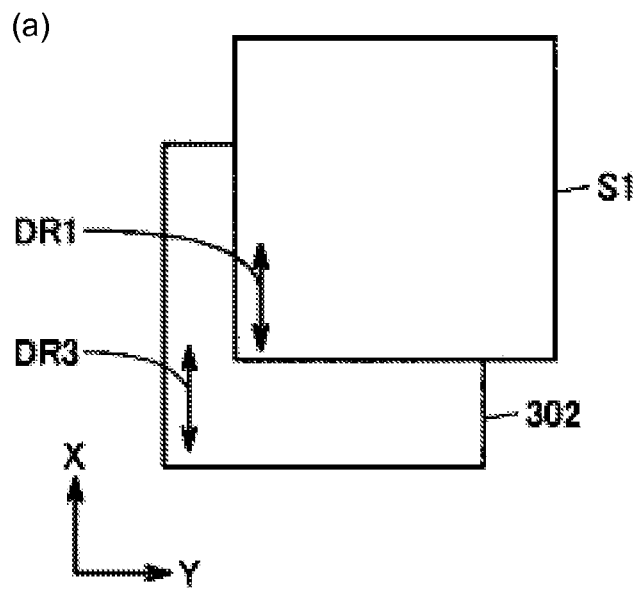
FIG. 69 is a view of first and second conditions that show a relationship between the direction of the transmission axis of the polarizing plate and the alignment direction of the phosphors when measuring frontal transmittance.
Figure 69:
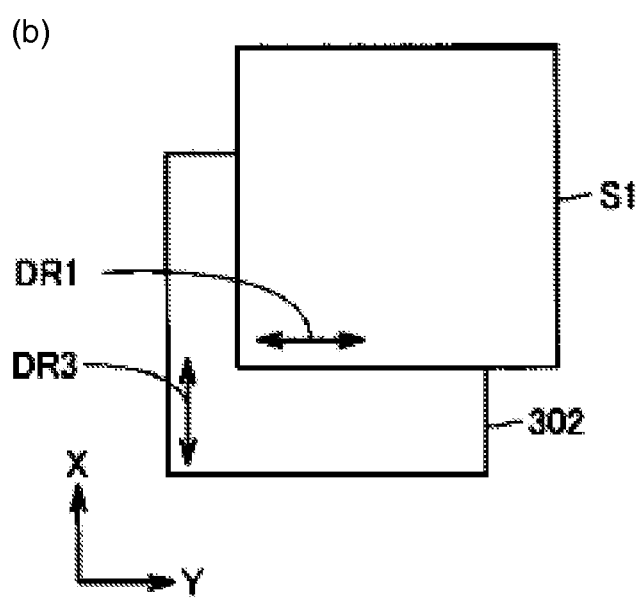
Figures 70, 71:
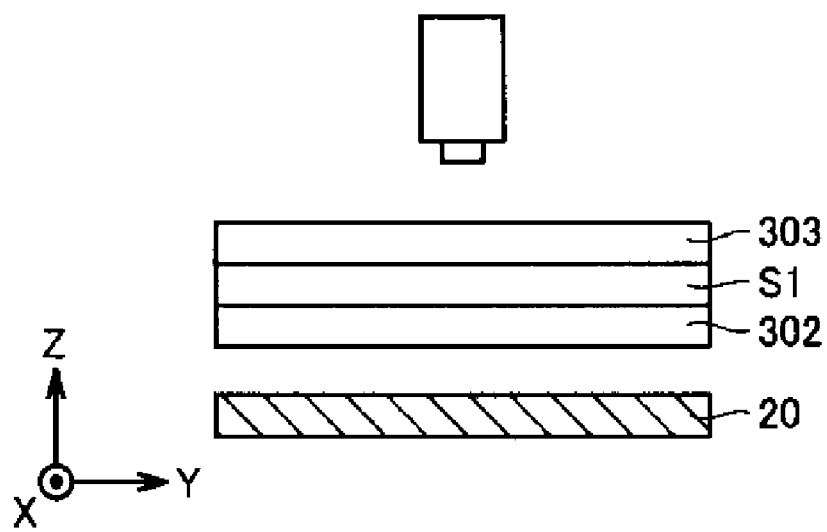
FIG. 70 is a view of the measurement results for frontal transmittance.
FIG. 71 is a view of the emission intensity of secondary light emitted from the phosphors.

FIG. 69 is a view of a first condition and a second condition representing the relationship between the transmission axis direction of the polarizing plate and the alignment direction of the phosphors during measuring of frontal transmittance. FIG. 70 is a view of the measurement results of frontal transmittance. The polarization dependency of light absorbency characteristics for the aligned phosphors will be described with reference to FIGS. 69 and 70.

In order to confirm polarization dependency of the light absorbency characteristics for the aligned phosphors, the wavelength conversion elements of Working Example S1 and Comparison Example S2 were prepared and frontal transmittance was measured with a photometer by causing natural light and polarized light to be incident on the respective wavelength conversion elements, as shown in FIG. 63.

In the wavelength conversion element of Working Example S1, frontal transmittance was measured under the first condition and second condition as shown in FIG. 69.

FIG. 69(a) is a view of the first condition, which represents the relationship between the transmission axis direction of the polarizing plate and the alignment direction of the phosphors in the Working Example during measurement of frontal transmittance. As shown in FIG. 69(a), in the first condition, the polarizing plate 302 and the wavelength conversion element of Working Example S1 were arranged such that the transmission axis of the polarizing plate 302 is parallel to the alignment direction of the aligned phosphors. This state is denoted as "Parallel" in FIG. 70.

FIG. 69(b) is a view of the second condition, which represents the relationship between the transmission axis direction of the polarizing plate and the alignment direction of the phosphors in the Working Example during measurement of frontal transmittance. As shown in FIG. 69(b), in the second condition, the polarizing plate 302 and the wavelength conversion element of Working Example S1 were arranged such that the transmission axis of the polarizing plate 302 is perpendicular to the alignment direction of the aligned phosphors. This state is denoted as "Cross" in FIG. 70.

As shown in FIG. 70, in the Comparison Example S2 of the unaligned state, it is not possible to confirm polarization dependency in the light absorbency characteristics, whereas in Working Example S1 of the aligned state, there was confirmation of the polarization dependency in the light absorbency characteristics. More specifically, in Working Example S1 of the aligned state, the absorbency of the polarization component oscillating parallel to the alignment direction of the phosphors was highest, whereas the absorbency of the polarization component oscillating perpendicular to the alignment direction in the planar direction was lowest.

The above empirically confirms that the aligned first phosphors have the absorbency thereof changed due to the polarization component of the incident primary light, and that absorbency increases when the polarization direction of incident primary light matches the alignment direction of the first phosphors.

Figure 72:
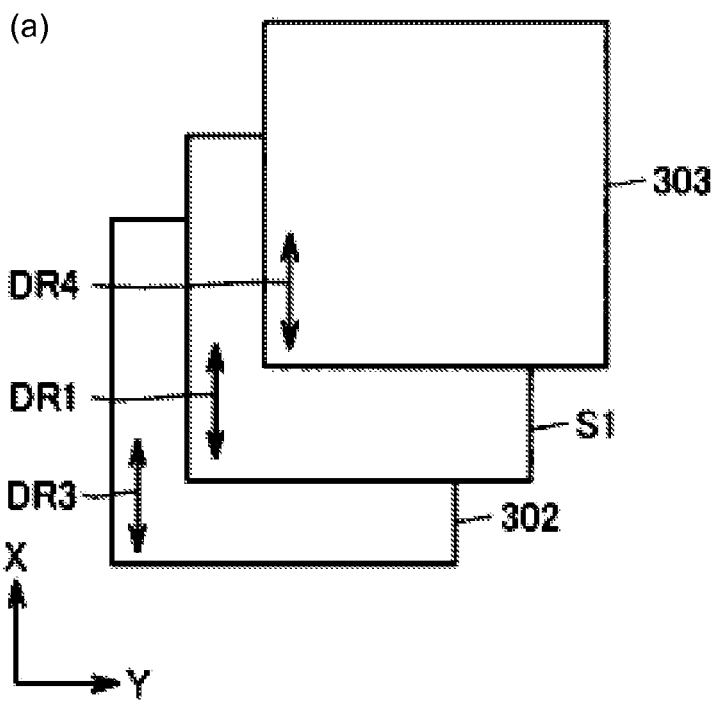
FIG. 72 is a view of third and fourth conditions that show a relationship between the direction of the transmission axis of the polarizing plate and the alignment direction of the phosphors when measuring emission intensity.
Figure 72:
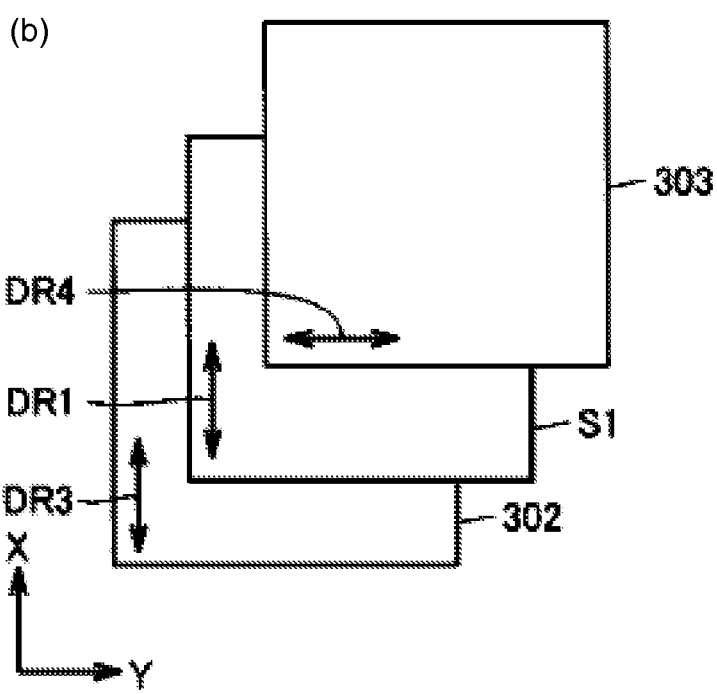

FIG. 71 is a view of measuring the emission intensity of secondary light emitted from the phosphors. FIG. 72 is a view off a third condition and a fourth condition representing the relationship between the transmission axis direction of the polarizing plate and the alignment direction of the phosphors during the measuring of emission intensity. FIG. 73 is a view of the measurement results for emission intensity. The polarization characteristics of secondary light emitted from the aligned phosphors will be explained with reference to FIGS. 71 to 73.

As shown in FIG. 71, emission intensity was measured in a state in which the polarizing plate 302 was arranged in a lower layer of the wavelength conversion element of Working Example S1 and the polarizing plate 303 arranged in an upper layer of the wavelength conversion element of Working Example S1. The light source 20 was a blue light source with a peak wavelength of 450 nm. Emission intensity was measured at a peak wavelength of 520 nm, which is where the emission intensity for green light is greatest.

FIG. 72(a) is a view of the third condition, which represents the relationship between the transmission axis direction of the polarizing plate and the alignment direction of the phosphors in the Working Example during measurement of emission intensity. As shown in FIG. 72(a), in the third condition, the polarizing plate 302, and the wavelength conversion element and polarizing plate 303 of Working Example S1 were arranged such that the transmission axis of the polarizing plate 302, the alignment direction of the aligned phosphors, and the transmission axis of the polarizing plate 303 were parallel to one another. This state is denoted as "Parallel" in FIG. 73.

FIG. 72(b) is a view of the fourth condition, which represents the relationship between the transmission axis direction of the polarizing plate and the alignment direction of the phosphors during measurement of emission intensity. As shown in FIG. 72(b), in the fourth condition, the polarizing plate 302 and the wavelength conversion element and polarizing plate 303 of Working Example S1 were arranged such that the transmission axis of the polarizing plate 302 is parallel to the alignment direction of the aligned phosphors and such that the transmission axis of the polarizing plate 303 is perpendicular to the transmission axis of the polarizing plate 302 and the alignment direction of the aligned phosphors. This state is denoted as "Cross" in FIG. 73.

As shown in FIG. 73, the secondary light emitted from the aligned phosphors is mainly constituted by a polarization component that oscillates in a direction parallel to the alignment direction, and the polarization component that oscillates perpendicular to the alignment direction in the planar direction is relatively weaker.

Furthermore, the emission intensity during the Parallel state is approximately 5.67 times greater than the emission intensity during the Cross state.

The above empirically confirmed that uniaxially aligning the first phosphors causes the secondary light emitted from the aligned first phosphors to have a polarization that is parallel to the alignment direction.

It should be noted that in the above embodiment and Modification Example 1 to Modification Example 33, examples were described in which a rubbing method uniaxially aligns the phosphors included in the phosphor layer, but the present invention is not limited to this, and spin coating, photoalignment, application of electric field, or application of magnetic field can be used to cause the first phosphors to uniaxially align. In such a case, suitably adjusting the alignment parameters makes it possible to suitably adjust the alignment direction.

Furthermore, the above-mentioned alignment film is not absolutely necessary, and a single phosphor layer formed by stretching can be suitably placed or combined to be used in the above embodiment or Modification Examples 1 to 33. For example, in Modification Examples 10 to 12 and 17 to 18, examples were described in which phosphors layers in which phosphors are aligned in a prescribed direction by an alignment film are stacked on one another, but the present invention is not limited to this, and a stretching method may be used to suitably attach the phosphor layers in which the prescribed phosphors are aligned to each other.

Furthermore, in the above embodiment and Modification Examples 1 to 33, examples were described in which the phosphors included in the phosphor layers were uniaxially aligned, but a phosphorescent material that emits phosphorescence be uniaxially aligned instead of the phosphors. As above, in this case, using the above-mentioned method makes it possible to uniaxially align the phosphorescent material in a prescribed direction.

An embodiment and modification examples based on the present invention were described above, but the embodiment and the modification examples described above are illustrative in every respect and shall not be construed as limiting. The scope of the present invention is defined by the claims, and all modifications with the same meaning as the claims and within the scope defined thereby are included.

DESCRIPTION OF REFERENCE CHARACTERS 10 wavelength conversion element
20 light source
21 reflective sheet
22 light guide plate
30 first transmissive substrate
31 light-emitting element
32 frame
33 sealing resin
34 substrate
40 first alignment film
50 first phosphor layer
51 first phosphor
52 phosphor
53 polymer molecule
54 polymer
60 second alignment film
61 third alignment film
70 second phosphor layer
71 second phosphor
80 second transmissive substrate
81 first color adjustment layer
82 second color adjustment layer
83 third transmissive substrate
90 third phosphor layer
91 third phosphor
100 illumination device
101 object
102 user
200 illumination device
210 wavelength conversion element
220 light source
230 first transmissive substrate
250 first phosphor layer
251 first phosphor
254 polymer
300 liquid crystal display device
301 liquid crystal panel
302, 303 polarizing plate

What is claimed is:

1. An illumination device for emitting light including secondary light obtained through wavelength conversion of primary light, comprising:
   a light source that emits primary light; and
   a wavelength conversion element that performs wavelength conversion on at least a portion of the primary light emitted from the light source, said wavelength conversion element including an incident surface where the primary light is incident, an emission surface that is opposite to the incident surface and that emits light including secondary light, and a phosphor layer including phosphors and polymers, said phosphors absorbing at least a portion of the primary light emitted from the light source to emit the secondary light, which is polarized, and said polymers having a birefringence,
   wherein said phosphors have an anisotropic structure and are aligned generally along a first direction,
   wherein said polymers have polymer molecules that are aligned generally along said first direction,
   wherein an angle formed by a direction of a transition dipole moment of each of the phosphors to a delayed phase axis of each of the polymer molecules with respect to the secondary light emitted from the phosphors towards the polymer molecules is 0° to 45°, and
wherein said wavelength conversion element includes said phosphor layer in a plurality such that the plurality of phosphor layers is arranged from a side of the incident surface to a side of the emission surface, and peak wavelengths of the phosphors included in the respective plurality of phosphor layers differ from one another such that the peak wavelengths of the phosphors become progressively lower from the side of the incident surface to the side of the emission surface.

2. The illumination device according to claim 1, wherein an angle formed by the direction of the transition dipole moment of each of the phosphors to the emission surface is 0° to 38°.

3. The illumination device according to claim 2, wherein said polymers are liquid crystal polymers.

4. The illumination device according to claim 3, wherein, in the secondary light emitted from the phosphors, an intensity of a polarization component that oscillates in a direction parallel to the first direction is greater than an intensity of a polarization component that oscillates in a direction perpendicular to the first direction.

5. The illumination device according to claim 4, wherein, with respect to the phosphors, an absorbency of a polarization component of primary light oscillating in a direction parallel to the first direction is higher than an absorbency of a polarization component of primary light oscillating in a direction perpendicular to the first direction.

6. The illumination device according to claim 3, wherein, with respect to the phosphors, an absorbency of a polarization component of primary light oscillating in a direction parallel to the first direction is higher than an absorbency of a polarization component of primary light oscillating in a direction perpendicular to the first direction.

7. The illumination device according to claim 2, wherein, in the secondary light emitted from the phosphors, an intensity of a polarization component that oscillates in a direction parallel to the first direction is greater than an intensity of a polarization component that oscillates in a direction perpendicular to the first direction.

8. The illumination device according to claim 7, wherein, with respect to the phosphors, an absorbency of a polarization component of primary light oscillating in a direction parallel to the first direction is higher than an absorbency of a polarization component of primary light oscillating in a direction perpendicular to the first direction.

9. The illumination device according to claim 2, wherein, with respect to the phosphors, an absorbency of a polarization component of primary light oscillating in a direction parallel to the first direction is higher than an absorbency of a polarization component of primary light oscillating in a direction perpendicular to the first direction.

10. The illumination device according to claim 1, wherein said polymers are liquid crystal polymers.

11. The illumination device according to claim 10, wherein, in the secondary light emitted from the phosphors, an intensity of a polarization component that oscillates in a direction parallel to the first direction is greater than an intensity of a polarization component that oscillates in a direction perpendicular to the first direction.

12. The illumination device according to claim 11, wherein, with respect to the phosphors, an absorbency of a polarization component of primary light oscillating in a direction parallel to the first direction is higher than an absorbency of a polarization component of primary light oscillating in a direction perpendicular to the first direction.

13. The illumination device according to claim 10, wherein, with respect to the phosphors, an absorbency of a polarization component of primary light oscillating in a direction parallel to the first direction is higher than an absorbency of a polarization component of primary light oscillating in a direction perpendicular to the first direction.

14. The illumination device according to claim 1, wherein, in the secondary light emitted from the phosphors, an intensity of a polarization component that oscillates in a direction parallel to the first direction is greater than an intensity of a polarization component that oscillates in a direction perpendicular to the first direction.

15. The illumination device according to claim 14, wherein, with respect to the phosphors, an absorbency of a polarization component of primary light oscillating in a direction parallel to the first direction is higher than an absorbency of a polarization component of primary light oscillating in a direction perpendicular to the first direction.

16. The illumination device according to claim 1, wherein, with respect to the phosphors, an absorbency of a polarization component of primary light oscillating in a direction parallel to the first direction is higher than an absorbency of a polarization component of primary light oscillating in a direction perpendicular to the first direction.

* * * * *